United States Patent [19]
Jenkins et al.

[11] Patent Number: 5,416,616
[45] Date of Patent: May 16, 1995

[54] INCOHERENT/COHERENT READOUT OF DOUBLE ANGULARLY MULTIPLEXED VOLUME HOLOGRAPHIC OPTICAL ELEMENTS

[75] Inventors: B. Keith Jenkins, Long Beach; Armand R. Tanguay, Jr., Fullerton, both of Calif.

[73] Assignee: University of Southern California, Los Angeles, Calif.

[21] Appl. No.: 894,825

[22] Filed: Jun. 8, 1992

Related U.S. Application Data

[63] Continuation-in-part of Ser. No. 505,790, Apr. 6, 1990, Pat. No. 5,121,231.

[51] Int. Cl.⁶ .................. G03H 1/12; G03H 1/10; G03H 1/02
[52] U.S. Cl. .................... 359/11; 359/10; 359/27; 359/28; 369/103
[58] Field of Search ........... 369/102, 103; 365/216; 250/201.9; 359/1, 3, 4, 7, 9, 10, 11, 12, 17, 20, 22, 27, 28, 20, 22, 24, 560, 561

[56] References Cited

U.S. PATENT DOCUMENTS

| | | | |
|---|---|---|---|
| 3,985,975 | 10/1976 | Steensma | 179/18 GF |
| 4,988,153 | 1/1991 | Paek | 359/27 |
| 5,129,041 | 7/1992 | Pernick et al. | 359/25 |

OTHER PUBLICATIONS

J. W. Goodman, in *Optical ACTA*, vol. 32, pp. 1489–1496 (1985).
P. Asthana, *PH.D. Dissertation*, pp. 235–268, University of Southern California (1991).
J. L. Jewell, in *Optics News*, pp. 10–11 (Dec. 1989).
S. Piazzolla et al. in *Optics Letters*, vol. 17, No. 9, pp. 676–678 (1, May 1992).
R. A. Fisher, in *Optical Phase Conjugation*, Academic Press, N.Y. (1983).
D. Z. Anderson, in *Optical Letters*, vol. 11, No. 1, pp. 56–68 (Jan. 1986).
R. V. Johnson et al., in *Optics Letters*, vol. 13, No. 2, pp. 189–191 (Mar. 1988).
D. Psaltis et al., in *Proc. SPIE*, vol. 963, pp. 70–76 (1988).
A. Marrakchi, in *Optics Letters*, vol. 14, No. 6, pp. 326–328 (15 Mar. 1989).
E. G. Paek et al., in *Optics Letters*, vol. 16, No. 12, pp. 937–939 (Jun. 15, 1991).
E. G. Paek et al., in *Optics Letters*, vol. 14, No. 4, pp. 205–207 (Feb. 15, 1989).
E. G. Paek et al., in *Optics Letters*, vol. 15, No. 6, pp. 341–343 (1990).

*Primary Examiner*—Loha Ben
*Assistant Examiner*—Darryl Collins
*Attorney, Agent, or Firm*—Benman Collins & Sawyer

[57] ABSTRACT

Novel apparatuses for readout of multiplexed volume holographic optical elements, based on parallel incoherent/coherent double angularly multiplexed holographic recording and readout principles, provide for hologram readout with high optical throughput efficiency and minimal crosstalk. Such holographic element readout apparatuses have applications in photonic interconnections for neural networks, telecommunications switching and digital computing; optical information processors and optical memories; and optical display systems. Embodiments are included that allow incoherent superposition of reconstructed images and simplified parallel readout of the volume holographic optical elements. The apparatuses can read out holographic elements that are either optically or computer generated and that are based on continuous-volume or stratified-volume holographic media.

21 Claims, 29 Drawing Sheets

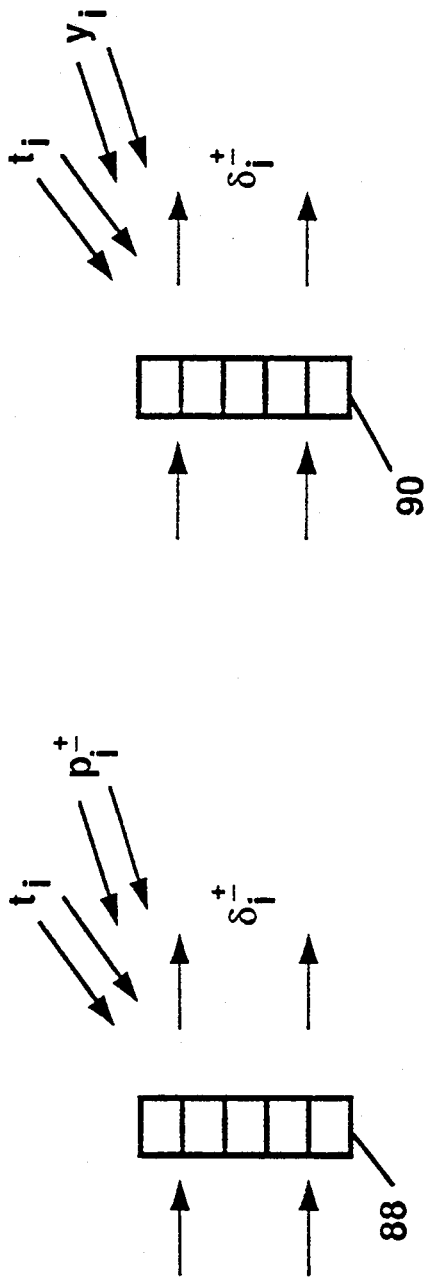
FIG. 16A
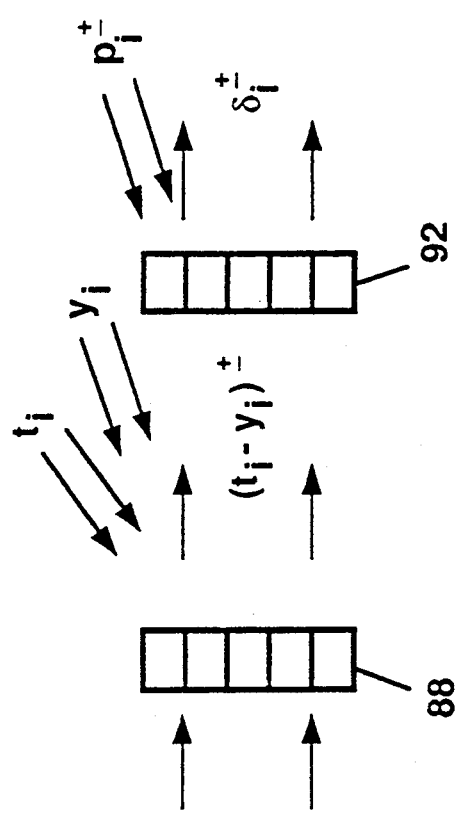
FIG. 16B
FIG. 16C

INCOHERENT/COHERENT READOUT OF DOUBLE ANGULARLY MULTIPLEXED VOLUME HOLOGRAPHIC OPTICAL ELEMENTS

ORIGIN OF INVENTION

The U.S. Government has certain rights in this invention pursuant to Contract No. F49620-87-C0007, awarded by the Department of the Air Force, and to Grant No. AFOSR-89-0466, awarded by the Defense Advanced Research Projects Agency through the Department of the Air Force.

CROSS-REFERENCE TO RELATED APPLICATION

The present application is a continuation-in-part application of Ser. No. 07/505,790, filed Apr. 6, 1990, now U.S. Pat. No. 5,121,231.

TECHNICAL FIELD

The present invention relates to multiplexed volume holographic recording, readout, and interconnections; and, more particularly, to photonic interconnections, photonic implementations of neural networks, optical signal processing, optical information processing and computing, optical memory, copying of multiplexed volume holograms, and multiplexed volume holographic optical elements.

BACKGROUND ART

A wide variety of information systems applications exist that require a high density of interconnections among device or system nodes, or a high density of rapidly accessible memory, or both. These applications include, for example, neural networks, telecommunications switching systems, digital computing, and information (including signal) processing. In many such applications, key requirements on the chosen interconnection technology include low insertion losses, high interchannel isolation (freedom from interchannel crosstalk), a high degree of potential fan-in and fan-out at each node, weighted interconnection channels, and high capacity. Comparable requirements exist for the chosen memory technology, including low latency (rapid information access), parallel information retrieval, low effective bit error rates (high signal-to-noise ratio), high density information storage, and input/output compatibility with the remainder of the system.

In order to satisfy these many and varied requirements, multiplexed volume holographic optical elements provide an attractive alternative to electronic implementations of high capacity interconnection and memory elements. In fact, the very nature of a volume holographic optical element tends to blur the distinction between a pure interconnection network on the one hand, and a pure memory subsystem on the other, as it is in many ways simultaneously well-suited to both roles. Even so, previous methods for recording information or interconnection patterns in highly multiplexed volume holographic optical elements, and for reading them out, have not proven satisfactory in terms of throughput, crosstalk, and capacity. Furthermore, they have not proven to be manufacturable, due to the fact that information from a master volume holographic optical element could not previously be efficiently transferred to or duplicated in another such element.

In forming multiplexed volume holograms, one of three approaches is typically taken: (1) sequential, which involves several temporally-sequenced (and hence incoherent) exposures of the individual components of the hologram, done by rotating or translating the hologram (or the source beam, reference beam, or object beam); (2) simultaneous and fully coherent, which involves the use of two or more mutually coherent beams, each encoded with information and serving as a reference beam for the other(s); and (3) some combination of sequential and simultaneous fully coherent.

The first approach has the major disadvantage that temporal sequencing is time-consumptive, which can be of considerable importance in applications envisioned herein, for which the number of independent interconnections that must be recorded is extremely large. Also, in many holographic recording materials, sequential exposures tend to erase previously recorded information, leading to the necessity of incorporating unwieldy programmed recording sequences in order to result in the storage of a predetermined set of interconnections.

The second approach is designed to circumvent the above sequencing difficulties, but suffers instead from the coherent recording of unwanted interference patterns (holograms) that give rise to deleterious crosstalk among the various (supposedly independent) reconstructions, as described in more detail below.

The third approach is subject both to sequential recording time delays and the necessity for programmed recording schedules, as well as to the generation of undesirable crosstalk. As such, none of the previously employed multiplexed recording techniques allows for the generation of three-dimensional, truly independent interconnections between two or more two-dimensional planar arrays within the context of a temporally efficient recording scheme.

In all of the prior art approaches to the holographic recording of a multiplexed interconnection, two primary forms of interchannel crosstalk are encountered to a greater or lesser extent. Coherent recording crosstalk arises from the simultaneous use of multiple object and reference beams, all mutually coherent with each other. The mutual coherence causes additional interconnections to be formed other than those desired. Reconstruction with independently valued inputs results in the generation of output beams that cross-couple through the undesired interconnection pathways, which compromises the independence of the desired interconnection channels.

A second, unrelated form of crosstalk arises due to beam degeneracy, which occurs whenever a single object beam is used with a set of reference beams to record a fan-in interconnection to a single output node (e.g., neuron unit in the case of the photonic implementation of neural networks). (Fan-in is the connection of multiple interconnection lines to a common output node.) This latter form of crosstalk is present even when the set of object beams is recorded sequentially.

Of at least equally serious consequence is the optical throughput loss that results from interconnection fan-in so constructed as to exhibit beam degeneracy. In many well-documented cases, this loss is severe, resulting in at least an (N-1)/N loss (or, equivalently, a 1/N throughput efficiency) for the case of an N-input, N-output interconnection system, as reported by J. W. Goodman, *Optica Acta*, Vol. 32, pages 1489–1496 (1985). This is a truly daunting loss factor for interconnection systems such as those envisioned for neural networks, which may both require and be capable of $10^5$ to $10^6$ inputs and outputs.

In certain types of photorefractive materials, an additional throughput loss can arise from the incoherent superposition of several gratings within the same volume of the holographic optical element, due to the reduction in the effective modulation depth of the recorded holographic fringes. This effect occurs primarily in photorefractive crystals that generate an index of refraction or absorption change in response to local gradients in the intensity distribution, but would not be expected to occur in linear photorefractive materials that generate an index of refraction or absorption change in direct proportion to the magnitude of the local intensity distribution. In a number of cases, this effect can also result in at least an (N-1)/N loss for the case of an N-input, N-output interconnection system, as reported by P. Asthana, "Volume Holographic Techniques for Highly Multiplexed Interconnection Applications", Ph.D. Dissertation, University of Southern California (1991), available from University Microfilms, Ann Arbor, Mich.

In the prior art, few attempts have been made to address the extremely important technological problem of duplicating the contents of a fully recorded, heavily multiplexed volume holographic optical element or interconnection device, particularly in the case of neural network interconnections. For example, to the inventors' knowledge, there is no known prior technique for rapid copying of a volume hologram that is angularly multiplexed in two dimensions, other than that described in the parent application of the present application.

In the case of neural network interconnections, the training and/or learning sequences may be quite involved; in some cases, the training and/or learning sequences may result in a unique interconnection, and the exact learning sequence may not be reproducible in and of itself at all. In such cases, it is desirable to replicate the contents of the interconnection medium in such a manner that a fully functional copy is produced, as characterized by a complete operational set of interconnections indistinguishable from those implemented by the master. The method of replication must not demand an extremely lengthy recording sequence, must not be inefficient in its utilization of the programmed recording schedule and/or the total optical energy available for reproduction purposes, and must not induce additional optical throughput loss or interchannel crosstalk beyond that already incorporated in the master.

In the parent application of the present application, apparatus for the incoherent/coherent multiplexed holographic recording of photonic interconnections and holographic optical elements is described. Specifically, apparatus for providing multiplexed volume holographic recording and readout comprises:

(a) means for providing an array of coherent light sources that are mutually incoherent;
(b) means for simultaneously forming an object beam and a reference beam from each coherent light source, thereby forming a set of multiplexed object beams and a separate set of multiplexed reference beams;
(c) means for either independently modulating each object beam, or spatially modulating a set of object beams so that all object beams are identically modulated;
(d) means for either independently modulating each reference beam, or spatially modulating a set of reference beams so that all reference beams are identically modulated;
(e) a holographic medium capable of simultaneously recording therein a holographic interference pattern produced by at least a portion of the set of all modulated multiplexed object beams and of the set of all modulated multiplexed reference beams pairwise, with all such pairs being mutually incoherent with respect to one another; and
(f) means for directing at least a portion of the set of modulated object beams and of the set of modulated reference beams onto the holographic medium and for interfering the portion of the modulated object beams and of the set of modulated reference beams, pairwise, inside the holographic medium.

Although the primary mode of multiplexing is angular, spatial and/or wavelength multiplexing may also be incorporated.

The architecture and apparatus described in the parent application significantly reduce coherent recording cross-talk and beam degeneracy crosstalk, and permit simultaneous network initiation, simultaneous weight updates, and incoherent summing at each output node without significant fan-in loss.

Further in accordance with the parent application of the present application, the above apparatus is provided with means for controllably blocking the set of object beams such that at least a portion of the set of reference beams (either modulated or unmodulated) reconstruct a stored holographic interference pattern. In one embodiment, the reconstructed pattern is angularly multiplexed and detected in such a manner as to produce an incoherent summation on a pixel-by-pixel basis of the reconstructed set of object beams. In this manner, multiplexed volume holographic recording and readout are provided.

Specific implementations to neural networks, telecommunication interconnections (e.g., local area networks and long distance switching), interconnections for digital computing, and multiplexed holographic optical elements are provided in the parent application.

In addition, apparatus for copying a multiplexed volume hologram is provided in the parent application. The apparatus comprises:

(a) means for providing an array of coherent light sources that are mutually incoherent;
(b) means for forming two reference beams from each coherent light source, thereby forming two sets of multiplexed reference beams, each set at a different location;
(c) means for directing the first set of reference beams onto the original multiplexed volume hologram to thereby form a set of output beams;
(d) means for directing the second set of reference beams onto a secondary holographic recording medium;
(e) means for directing the set of output beams from the original multiplexed volume hologram onto the secondary holographic recording medium, with path lengths sufficiently identical to the reference beam path lengths to permit coherent interference, pairwise, between the output beams and the second set of reference beams, inside the secondary holographic recording medium; and (f) means for simultaneously recording in the secondary holographic medium a holographic interference pattern produced by the set of output beams and the second set of reference beams, thereby forming the substantially identical multiplexed volume hologram.

Portions of the above-described apparatus also possess unique properties and give rise to useful functions. It is to these unique portions, or elements, that the present application is directed.

In addition, specific implementations are given that utilize subhologram formation to avoid throughput losses due to incoherent superposition effects, that provide for various modes of information transfer from a master hologram to a copy, that address application areas in optical memory and optical signal processing, and that exploit the double angular multiplexing features of the apparatus described in the parent application.

DISCLOSURE OF INVENTION

In accordance with the invention, a multiplexed volume holographic element comprises a volume holographic medium capable of storing a holographic modulation pattern, the holographic modulation pattern comprising a multiplexed set of modulation pattern components, each of which, when illuminated by an associated reference beam, leads to a reconstructed beam such that:

(a) the reconstructed beams that emanate from the holographic medium are at least partially angularly multiplexed;

(b) a spatial array of pixels is encoded onto each reconstructed beam, as an image at some plane in space; and (c) the images of said spatial arrays of pixels from the reconstructed beams can be made to be substantially coincident in space.

Such multiplexed holographic elements in accordance with the teachings of the invention can be generated by optically recording a holographic interference pattern in a photosensitive medium, or by calculating the holographic modulation pattern on a computer and manufacturing the holographic element to include the computed modulation pattern. It is compatible with the apparatus described in the parent application of the present application. The spatial array images may comprise virtual or real holographic images. Extensions to holographic records of 3-D images are provided.

An apparatus for reading out the multiplexed holographic element of the invention is further provided, and utilizes an array of coherent light sources that are mutually incoherent, means for modulating the reference beam generated by each such source, and means for directing at least some of these reference beams onto the holographic medium, thereby generating a set of output beams. A recording and readout apparatus that uses a combination of spatial and angular multiplexing is also provided in accordance with the invention. Further, two specific means for providing the requisite 2-D source array are described: a 2-D array of surface emitting laser diodes; and a set of diffraction gratings, each of a different frequency, propagating in an acousto-optic cell.

In addition, apparatus for transferring information from a primary volume holographic optical element to a secondary holographic medium is provided, comprising:

(a) means for directing at least a portion of each beam of a set of mutually incoherent reference beams onto the primary volume holographic optical element, thereby producing a set of output beams;

(b) means for directing at least a portion of each beam of the set of mutually incoherent reference beams onto the secondary holographic medium;

(c) means for directing the set of output beams from the primary volume holographic optical element onto the secondary holographic medium, with beam path geometries appropriate to permit coherent interference between each output beam and each corresponding reference beam, inside the secondary holographic medium; and (d) means for recording in the secondary holographic medium a holographic interference pattern produced by the set of output beams and the portion of each beam of the set of mutually incoherent reference beams.

Also provided are means for transferring information from the secondary holographic medium to the primary holographic medium, thereby enabling iterative feedback between the two holographic media.

Further in accordance with the invention, apparatus for double angular multiplexing is provided, comprising means for directing a set of self-coherent but mutually incoherent beams to a spatial modulation means for spatially modulating the set of beams, the spatial modulation means comprising a plurality of pixels, at least one of which pixels is common to more than one beam, with each beam that shares the common pixel being angularly multiplexed at the common pixel.

Provision is further given for the spatial modulation means to comprise at least one of a spatial light modulator, a planar hologram, and a volume hologram.

Specific implementations are provided to: optical interconnections in neural networks, digital computing, and telecommunications; holographic optical elements; optical information processing; and optical memory.

BRIEF DESCRIPTION OF THE DRAWINGS

FIG. 1 is a generalized interconnection, with both fan-out and fan-in;

FIG. 6A is a schematic diagram of optical apparatus for recording of doubly angularly multiplexed holograms, each a hologram of a 2-D array of pixel values, while

FIGS. 16A–C are schematic diagrams of preferred embodiments of means for generating learning terms $\delta_i$, for the cases of (A) Widrow-Hoff, (B) Perceptron, and (C) back propagation learning;

FIG. 19A is a schematic diagram of means for providing the source array of FIG. 18 in the case of a 1-D wavelength division multiplexed (WDM) input line array and a 1-D wavelength division multiplexed output line array, showing the center optical frequency $v$ increasing along one direction and the incorporation of mutual incoherence within a frequency band $\Delta v$ about each central optical frequency $v$ along a different, substantially orthogonal direction, while

BEST MODES FOR CARRYING OUT THE INVENTION

A. GENERAL

1. Introduction.

The description that follows is primarily directed to neural networks. However, it will be appreciated by those skilled in the art that a major component of the architecture and apparatus is generic to a number of technologies, including telecommunications, digital computing, optical information processing and computing, optical memory, copying of multiplexed volume holograms, and holographic optical elements. Specific applications to these are discussed below.

In considering the teachings of the invention, it is essential to differentiate between two basic types of optical interactions (as determined by the nature of the optical signals involved): incoherent and coherent. Incoherent interactions occur whenever the input signals temporally dephase over the relevant time of observation (detector temporal integration window), in that they are either broadband (not monochromatic) or are narrow band (nearly monochromatic) but separated in optical frequency by more than the inverse of the observation time.

Interactions in which the input optical signals spatially dephase over the spatial aperture of the relevant detector wherever the output is utilized (detector spatial integration window) are also incoherent for all practical purposes, and will obey certain summation rules. Coherent interactions occur, on the other hand, whenever the input signals simultaneously maintain a constant phase relationship over the detector spatial and temporal integration windows.

From these remarks, it can be seen that it is quite important to understand the distinction between coherent (or incoherent) light and coherent (or incoherent) interactions as defined by the eventual detector configuration and operational parameters. For example, it is perfectly acceptable to consider a situation in which two mutually coherent (temporally) optical beams interact to produce an interference pattern with a spatial scale small compared with the relevant detector aperture. For two such mutually coherent optical beams propagating at an angle with respect to each other, the spatial scale of the resultant interference pattern decreases as the angle between the two beams increases. In such cases, the interaction will in fact follow incoherent summation rules, as the detector effectively integrates the spatially varying interference pattern to produce exactly the same result as the interaction of two mutually incoherent (temporally) optical beams.

Figure 1:
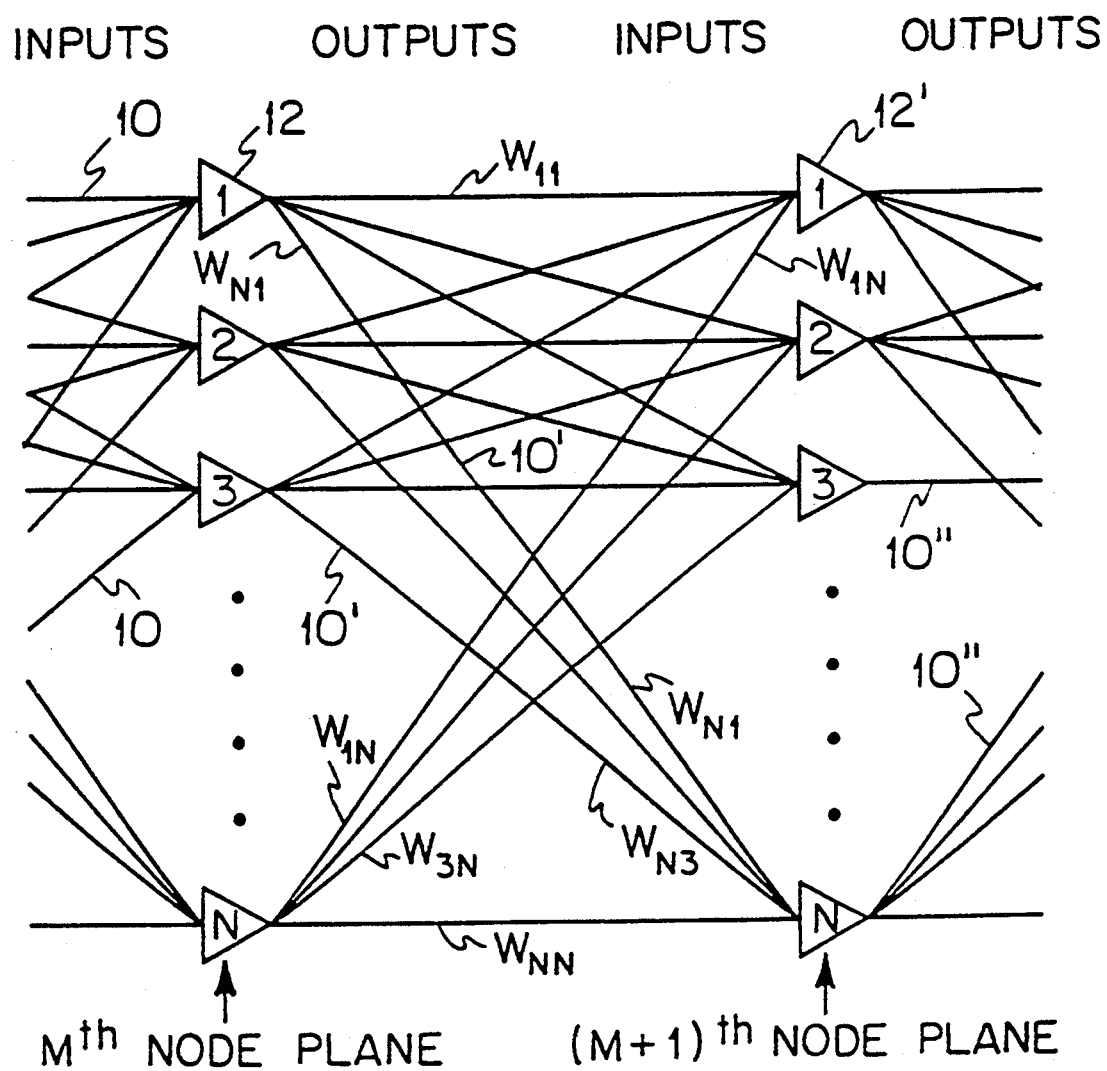

Referring now to the drawings, wherein like numerals of reference designate like elements throughout, FIG. 1 depicts a generalized interconnection scheme, showing both fan-in of input beams 10, 10' to nodes 12, 12', respectively, and fan-out of output beams 10', 10'' from the nodes.

The section of the interconnection shown depicts the fan-in to the $m^{th}$ node from the $(m-1)^{th}$ node plane (not shown), a fully connected layer in which the interconnections fan out from each node 12 labeled 1 through N to the nodes labeled correspondingly 1 through N in the $(m+1)^{th}$ node plane wherein full fan-in is effected, and fan-out from the $(m+1)^{th}$ node plane to the $(m+2)^{th}$ node plane (not shown). In some interconnection schemes, the $m^{th}$ node plane and the $(m+1)^{th}$ node plane are one and the same, consisting therefore of a set of nodal outputs fully interconnected to the corresponding set of nodal inputs in a feedback arrangement.

The weights $w_{ij}$ are shown to indicate that each (analog) interconnection path modifies the output from a given node by means of the multiplication weight $w_{ij}$ before fan-in is performed with an appropriate summing operation at each node input. The weight labeling scheme employed is as shown, such that the weight $w_{ij}$ interconnects the $j^{th}$ nodal output in a given plane to the $i^{th}$ nodal input in the succeeding plane.

Figure 2:
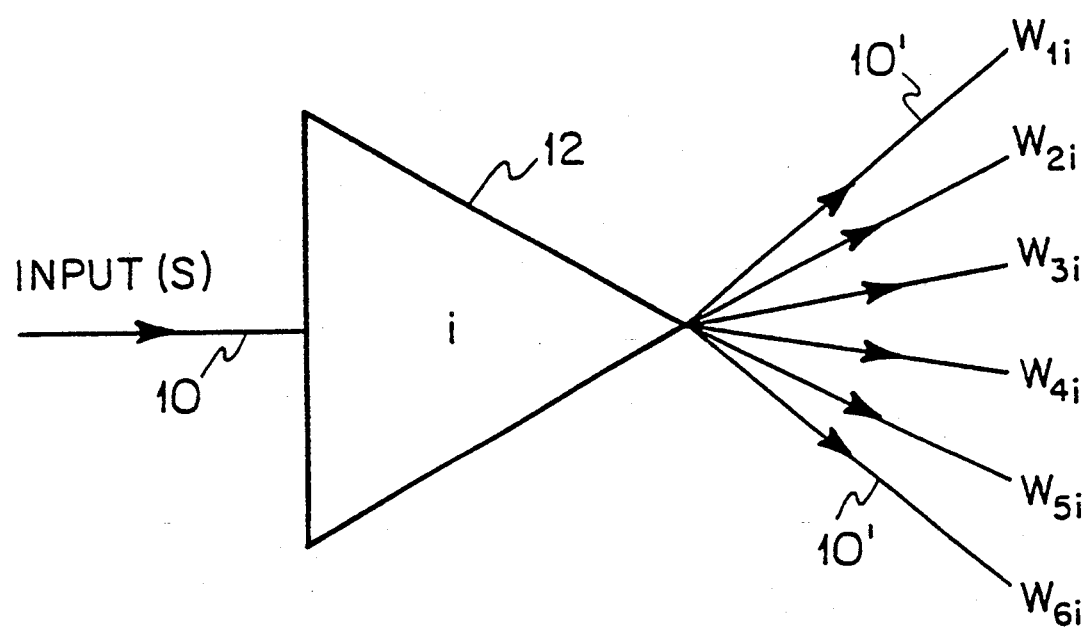
FIG. 2 is a schematic diagram of fan-out, showing interconnection pathways and the implementation of analog weights.

FIG. 2 depicts fan-out of a plurality of output beams 10' from a node 12 (i.e., the $i^{th}$ node) on which at least one input beam 10 is incident. Each beam 10' is propagated to the next node with a separate and independent analog weight $w_{ij}$ as noted above, which is assigned to each interconnection path.

As depicted in FIG. 2, for the purposes of this invention, the output value from each given node is common, such that the interconnections represent true fan-out rather than the individual interconnection of multiple output ports from a single node.

Figure 3:
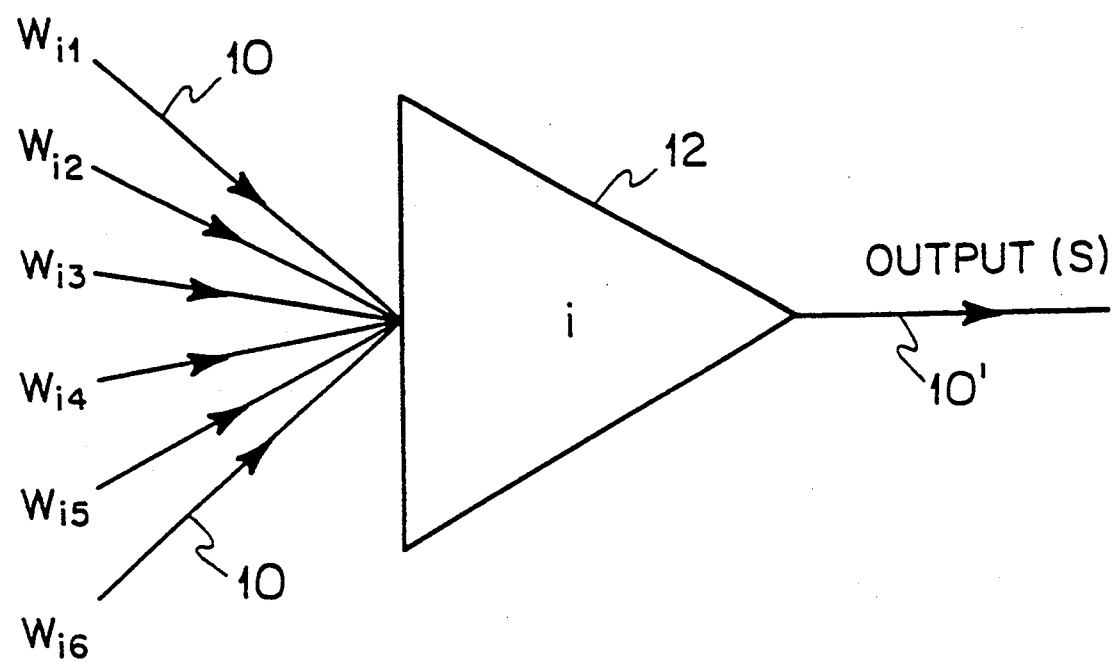
FIG. 3 is a schematic diagram of fan-in, showing interconnection pathways and the implementation of analog weights.

FIG. 3 depicts fan-in of a plurality of input beams 10 to node 12, generating at least one output beam 10'. Each beam 10 is modified by a separate and independent analog weight $w_{ij}$, assigned to each independent interconnection path. True fan-in is achieved by means of an appropriate summation rule at a single node input, as shown in the Figure. Pertinent to the invention described in this application, such fan-in can be provided by a set of optical beams that are incident on a common detector plane, each incident at a separate angle.

In FIGS. 1, 2, and 3, the triangular symbol utilized to depict each interconnection node represents not only the indicated direction of data flow through the node, but also the potential for incorporation of an input-to-output control transfer function (e.g., a hard or soft threshold in the case of a neural network) that operates on the fanned-in, summed inputs to produce a single (usually analog) output value that is fanned out in turn to the succeeding network stage.

Figure 4:
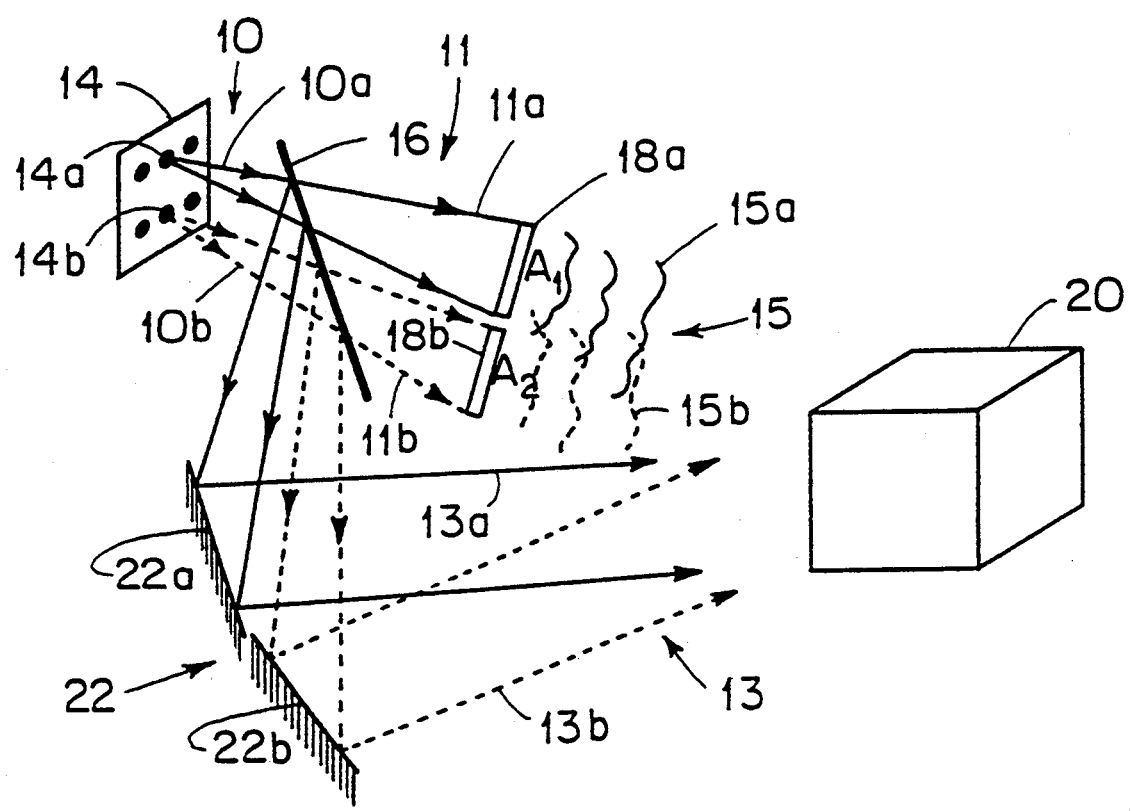
FIG. 4 is a schematic diagram of optical apparatus for simultaneous incoherent/coherent recording of multiplexed holograms, showing angular multiplexing of the reference beam set.
Figure 5:
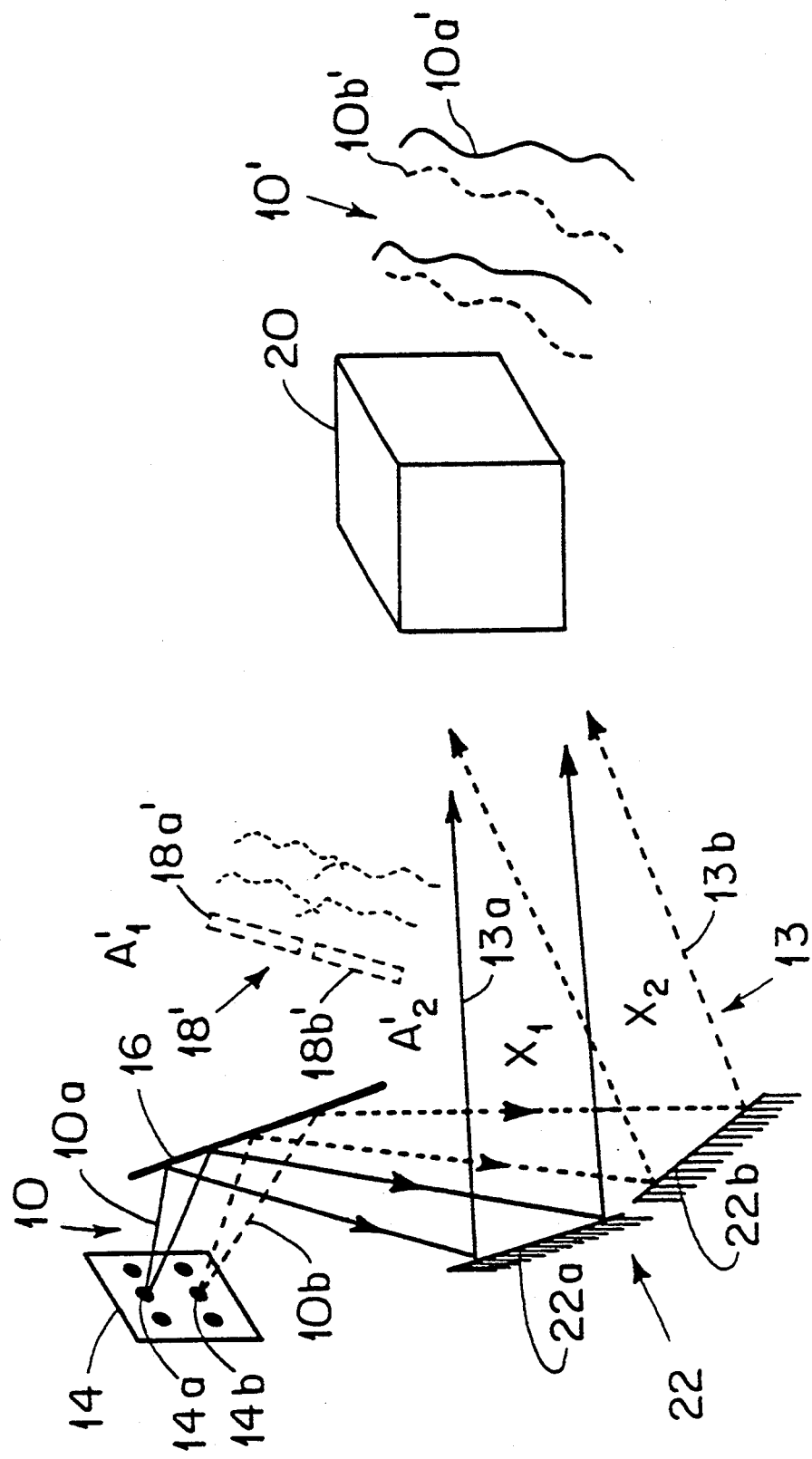
FIG. 5 is a schematic diagram of optical apparatus for either simultaneous or independent readout of multiplexed holograms showing mutual incoherence of readout (reconstructed) beams.

FIGS. 4 and 5 depict schematically how recording (FIG. 4) and reconstruction (FIG. 5) of a set of holograms is accomplished in accordance with the invention described in the parent application. In FIG. 4, an array of coherent but mutually incoherent sources 14 generates a set of beams 10 (two such beams 10a, 10b are shown). A beamsplitter 16 forms a set of object beams 11 and a set of reference beams 13. The object beams 11 pass through a set of objects ($A_1$, $A_2$) 18 to form a set of object-encoded beams 15, which impinge on element 20 incorporating a holographic recording medium. As used herein, "20" represents a volume holographic optical element, comprising a volume holographic medium and one or more holograms each consisting of a modulation pattern. It will be appreciated that in some cases, the element 20 will not yet have recorded therein the holographic modulation pattern and thus will consist only of the holographic medium. Since the intent is to record such patterns into the medium, the element 20 is hereinafter referred to as a holographic element, even though it may not have the holographic patterns recorded therein.

The reference beams 13 are reflected from a set of mirrors 22 and also impinge on the holographic element 20, where they interfere with the object-encoded beams 15 pairwise to form holographic interference patterns in the recording medium, as is well-known.

It will be noted that the foregoing apparatus permits simultaneous recording of the objects. Further, a first light source 14a in the source array 14 is used to generate a first set of two beams 11a and 13a which are mutually coherent; these beams derive from beam 10a. A second light source 14b in the source array is used to generate a second set of two beams 11b and 13b, which are also mutually coherent; these beams derive from beam 10b. However, since the two light sources 14a and 14b are mutually incoherent, then beams 10a and 10b are mutually incoherent, and the two sets of beams derived therefrom are also mutually incoherent and hence do not mutually interfere to form an interference pattern in the medium of holographic element 20. While only two light sources 14a, 14b are described, there is, of course, a plurality of such light sources in the source array 14, each generating a coherent pair of object and reference beams, each pair incoherent with all other pairs.

It will be noted that the superposition of a set of optical interference patterns can be referred to as a set of mutually incoherent optical interference patterns if all of the pairs of beams that generate each individual optical interference pattern within the set are individually coherent but mutually incoherent. Likewise, the set of holographic records of a set of optical interference patterns can be referred to as a set of mutually incoherent holographic records if all of the corresponding optical interference patterns within the set are mutually incoherent.

Finally, each of the set of object beams and each of the set of reference beams is independently multiplexed in at least one of angle, space, and wavelength.

In FIG. 5, readout, or reconstruction, is achieved by blocking the object beams 11. In the case of a holographic optical element, the holographic element 20 may be read out in a physically distinct optical system, in which the reference beam phase fronts illuminating the holographic medium approximate those of the recording system. Readout may be simultaneous and independent, or individual.

Simultaneous and independent readout is characteristic, for example, of neural networks, associative memories, and shared memories. Individual readout, by contrast, is characteristic of conventional optical memory systems.

In simultaneous and independent readout, output beams $10a'$ and $10b'$ are mutually incoherent, and complete control of what is read out is provided; that is, one-half of beam $13a$ and all of beam $13b$, or all of beams $13a$, $13b$, and $13c$ (not shown), or other combinations may be controllably used as readout beams, with the modified set of reconstructed output beams incoherently superimposed in space. For clarity, beam $13c$ is omitted from the drawing. If shown, it would be at yet a different angle from beams $13a$ and $13b$.

In individual readout, any individual readout beam $13j$ can be modulated and utilized to reconstruct an individual output beam $10a'$ or $10b'$ (or $10c'$, etc.) without significant crosstalk.

Virtual images $A_1'$ and $A_2'$ are generated from the reconstruction process in the position designated 18' where the objects 18 were located during the recording process, in such a manner that the reconstructions 10' appear to emanate from the virtual images. As shown in FIGS. 4 and 5, if the original objects 18 are located at separate positions in space, then the virtual images 18' are also located at distinct positions. It will thus be appreciated by one skilled in the art that in any subsequent image plane of virtual images 18', images of the objects $A_1$, $A_2$, and the like will again be located at separate positions. Another key point is that the set of reconstructed beams 10' are all mutually incoherent, and hence obey incoherent summation rules in any chosen output plane.

Figure 6A:
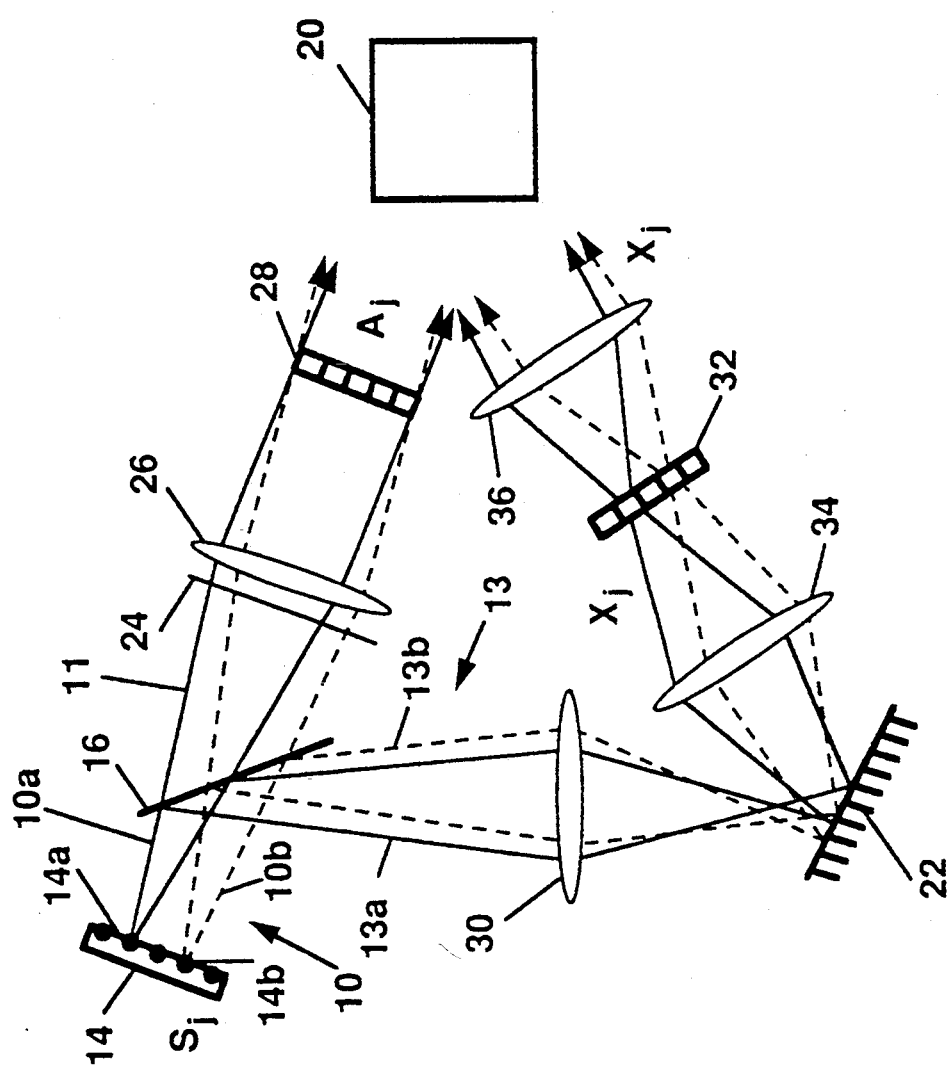

FIG. 6A depicts apparatus suitable for the simultaneous recording of doubly angularly multiplexed holograms, with each hologram comprising a 2-D array of pixel values. A shutter 24 in the path of the set of object beams 11 is used to control passage of the set of object beams to the holographic element 20. During recording, the shutter 24 is open. The set of object beams 11 passes through a lens 26, which approximately collimates the set of beams and directs them toward a first spatial light modulator (SLM) 28. Thus, each pixel of modulator 28 has many mutually incoherent optical beams (angularly multiplexed) passing through it. (This feature is called simultaneous spatial modulation of angularly multiplexed incoherent beams.) The resulting set of modulated beams $\{A_j\}$ is incident on the holographic element 20.

The set of reference beams 13 passes through lens 30 and lens 34, reflecting from mirror 22 in the process; their function, together, is to focus each beam onto the corresponding pixel of modulator 32. From spatial light modulator 32, the set of reference beams 13 is directed into the holographic element 20 by lens 36, where the reference beams interfere with the object beams to produce a multiplexed hologram with a set of stored interconnection weights. The interconnection weights can be dependent on corresponding products of the form $A_j x_j$, as described in more detail below.

Finally, it will be noted that the object beams 11 are all at different angles with respect to each other and that the reference beams 13 are also all at different angles with respect to each other. As a consequence of this angular difference, it will be appreciated that these beams are double (meaning both object and reference beams) angularly multiplexed in the volume holographic element 20.

It will be further appreciated by those skilled in the art that the placement of lens 36 determines whether the beams transmitted through the spatial light modulator 32 are collimated at the entrance plane of the hologram, focused at the entrance plane of the hologram to form an image of the spatial light modulator, or form instead expanding or contracting wavefronts at the entrance plane of the hologram. A second lens (not shown) placed following spatial light modulator 28 can be adjusted to focus the two-dimensional Fourier transform of each of the beams transmitted through spatial light modulator 32 onto spatially separated regions at the entrance plane of the hologram. This same function can also be accomplished by appropriate choice and positioning of lens 26 without the need for a second lens.

Although many combinations of such configurations can be easily seen to exist, we define herein three preferred embodiments. In the "full aperture" version of the architecture, both such lenses are adjusted to collimate the beams transmitted by the spatial light modulators, filling the entire aperture of the holographic optical element. In the "subhologram" version of the architecture, the lens (not shown) following spatial light modulator 28 is adjusted to focus the two-dimensional Fourier transform of each of the beams transmitted through spatial light modulator 28 onto spatially separated regions at the entrance plane of the hologram. In addition, lens 36 following spatial light modulator 32 is adjusted to image the output side of the spatial light modulator 32 onto the entrance place of the hologram in such a manner as to assure registry of the image so generated with the array of Fourier transforms just described. In this manner, each individual pixel $x_j$ is interconnected to the full set of pixels comprising spatial light modulator 28. A third version of the architecture represents a compromise between the full aperture and sub-hologram versions, and is obtained by placing the lenses in intermediate positions that result in overlapping sub-holograms at the entrance plane of the hologram. This version permits optimization of competing factors, including optical throughput efficiency, space-bandwidth product utilization, and numerical aperture requirements on the optical components.

Figure 6B:
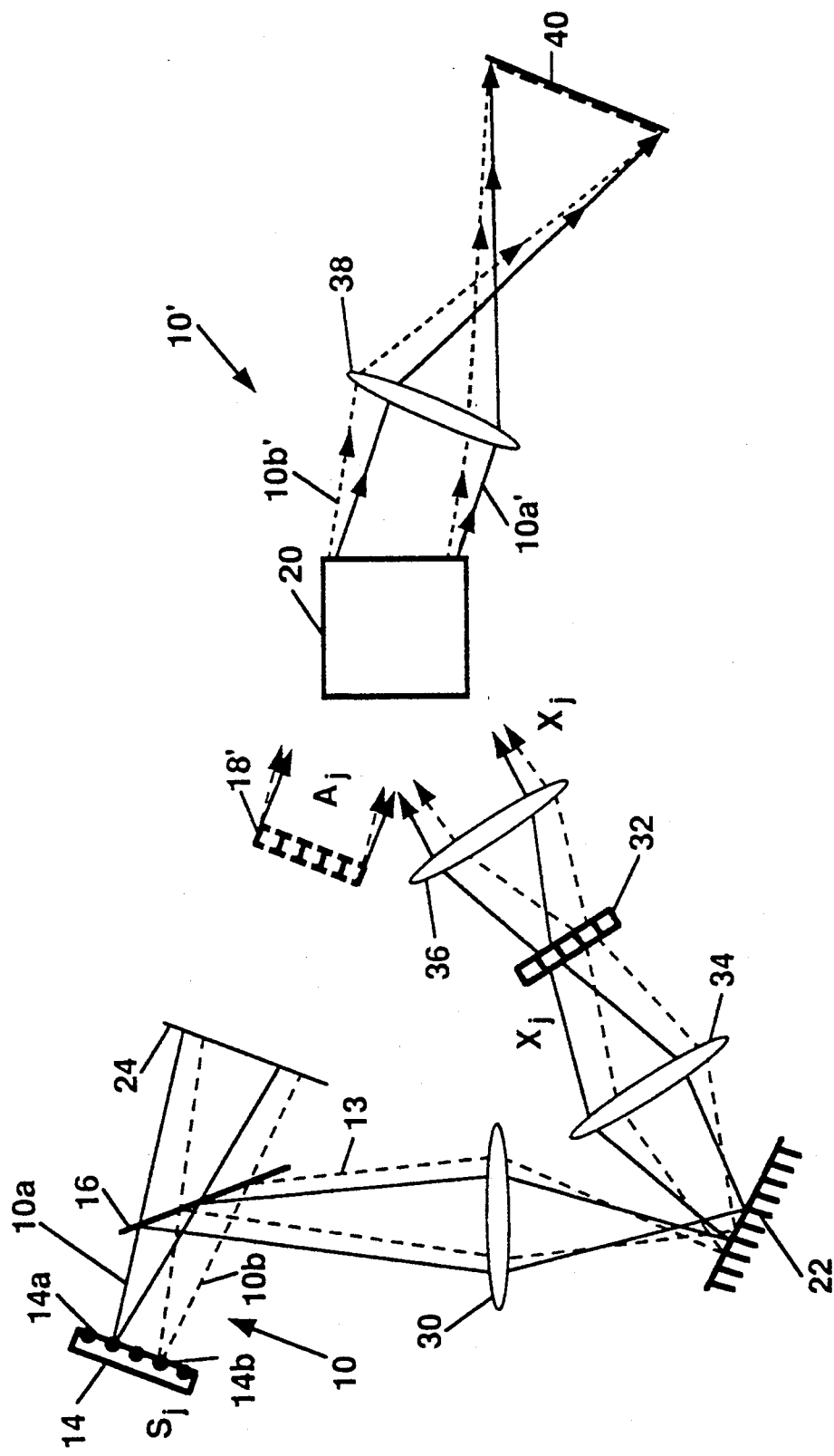
FIG. 6B is a schematic diagram of that portion of the apparatus of FIG. 6A used in the reconstruction of the recorded images, showing the incoherent summation on the output plane of the set of reconstructed images in pixel-by-pixel registry.

FIG. 6B depicts the apparatus of FIG. 6A, but with the shutter 24 closed, to permit reconstruction of the recorded holograms to generate a set of output beams 10', representing a set of virtual images 18', which is passed through a lens 38 and imaged onto an output plane 40. Each pixel of the superposition image in output plane 40 receives an intensity given by the incoherent summation of a number of terms, the number given by the fan-in to that pixel, which is equal to the number of elements in the source array for the case of fully connected networks. Each individual term in the incoherent summation is in turn the product of a stored interconnection weight $w_{ij}$ multiplied by the intensity of the corresponding reference beam $x_j$ during readout. Hence, the superimposed reconstructions of the separate stored holograms (generating the set of virtual images 18') are incoherently summed pointwise (on a pixel-by-pixel basis in registry).

It should also be noted that lens 38 can be relocated to an appropriate position between modulator 28 and holographic element 20. The apparatus will then record holograms that reconstruct real (instead of virtual) images. As a result, no lenses are needed in the paths of the output beams 10' and the reconstructed arrays (which now represent real images) are still in registry in the output plane.

It will be appreciated by those skilled in the art that variants of this apparatus can be easily provided that are optimized for readout of the volume holographic element only. As such, the source array 14 may be placed at the indicated position of mirror 22, and beamsplitter 16, shutter 24, lens 30, and mirror 22 can be eliminated. It will be further appreciated that the architecture as shown provides that the virtual images $A_j$ are superimposed in space, so that they can in fact be imaged in registry onto a single output plane 40 as shown.

Figure 6C:
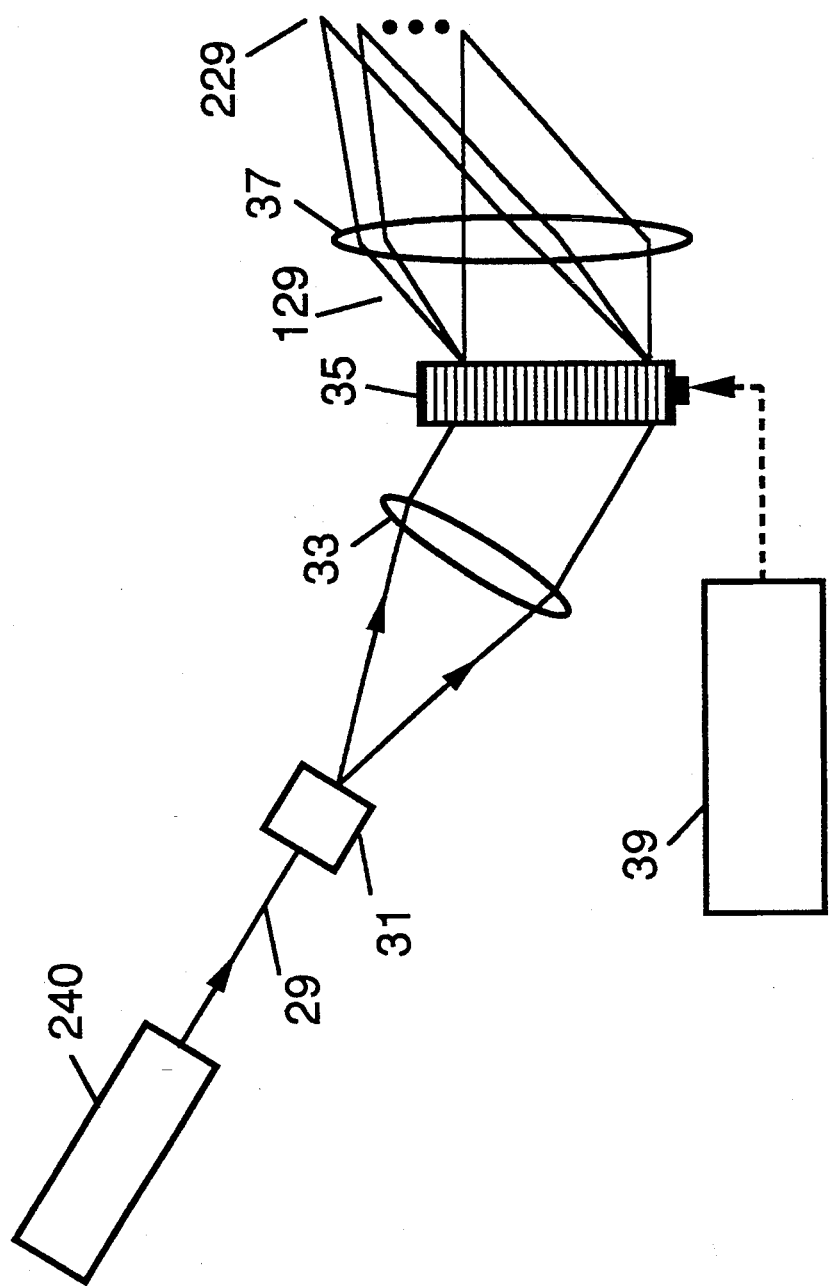
FIG. 6C is a schematic diagram of an acousto-optic deflector based system that generates an array of coherent but mutually incoherent source beams, as needed in the apparatus of FIGS. 6A and 6B.

FIG. 6C depicts one embodiment of apparatus that generates an array of self-coherent but mutually incoherent source beams, as provided by source array means 14 of FIGS. 6A and 6B. A coherent laser source 240 provides a single coherent beam 29 that is expanded via beam expander 31 and lens 33, before being incident on acousto-optic deflector 35. Electronic circuitry 39 generates an electronic signal consisting of a set of N superimposed frequencies, each being an integral multiple of a fundamental frequency. This signal can be generated by, for example, a frequency generator circuit that generates M frequencies, a series of analog multipliers, and one or more amplifiers. The multiplication process results in a set of $N=2^{M-1}$ superimposed frequencies, as desired. This signal is sent into acousto-optic deflector 35 to generate a set of $M_f$ superimposed diffraction gratings of different spatial frequencies. Lens 37 then provides an optical spatial Fourier transform of the set of gratings, yielding an array of source beams 229. Because of the different frequencies of the gratings, the source beams 229 comprise a spatial array of source beams that are individually coherent but mutually incoherent. This source array generator can be used with common single laser sources, and provides flexibility in source spacing and in optical wavelength for laboratory use.

The incoherent/coherent recording technique described above and enabled by the source array reduces the number of spurious gratings written, thereby reducing crosstalk compared with fully coherent simultaneous recording techniques.

2. Source Array.

As discussed above, a critical and novel component that leads directly to the unique capability for simultaneous recording of the holograms is a 2-D source array 14, the light emission/reflection from which must be coherent within each pixel but mutually incoherent among all pixels. The array size will be determined by the array sizes of the SLMs employed in the architecture, as these will in fact delimit the space-bandwidth product of all of the arrays. Given the geometrical and power dissipation constraints inherent in the preferred SLM design employed herein, array sizes of $\approx 10^4$ to $10^5$ elements per $cm^2$ are currently appropriate. Given further the unique interconnection recording configuration proposed herein, larger array sizes can be configured by mosaic techniques, as the interconnection architecture automatically compensates for irregularities in source location.

There are at least four possible structures that can satisfy the necessary source array requirements. The first is an array of optically isolated surface-emitting semiconductor lasers, with adequate pixelation to eliminate the potential for inadvertent phase locking.

Let $\Delta\nu$ be the processing-variation-induced or designed difference in center frequencies from one source to the next. The mutual coherence time between sources is determined by the optical bandwidth of the sources (in the case of such bandwidth being greater than $\Delta\nu$) or by $\Delta\nu$ (in the case of $\Delta\nu$ being greater than the individual source bandwidth).

For typical semiconductor lasers fabricated in the GaAs/AlGaAs system, for example, linewidths of 3 nm are common, which corresponds to a frequency bandwidth of approximately 1 THz. Over time scales characteristic of currently-available photorefractive volume holographic optical interconnections, about 1 msec for power levels characteristic of semiconductor laser sources, this large bandwidth will assure mutual incoherence of the array elements. Total power dissipation assuming 1 mA threshold laser diodes will be under 10 $W/cm^2$, and even then will require careful heat sinking and attention to thermal design. The essential advantages of this approach are the anticipated very high resultant optical intensities of $\approx 5$ $W/cm^2$ that will in turn accelerate the holographic interconnection recording (and copying) process, and the significant technical leverage enjoyed by this approach due to substantial interest in semiconductor laser arrays for a wide range of potential applications.

For example, vertically emitting semiconductor laser arrays with densities of over two million individual lasers per square centimeter have been fabricated and evaluated successfully, as reported by J. L. Jewell et al, *Optics News*, pages 10–11 (December 1989). These arrays, however, have not been specifically designed to assure mutual incoherence among all of the individual source array elements, which is a critical feature utilized in the practice of this invention.

The second source array structure employs a pixelated piezoelectric mirror with an intentionally incorporated space-variant non-uniformity. The array is driven such that each individual high-Q mirror element is brought into resonance at its natural (and distinct) center frequency. For such an array with $10^{4'}$ elements, each separated by $\approx 2$ kHz to satisfy the mutual incoherency requirements of the holographic interconnect, the required bandwidth is only 20 MHz. This approach has the advantage of potentially very high reliability, with capability for reflecting essentially arbitrarily intense CW or pulsed source beams over a broad wavelength range.

The third source array structure is directly derived from the III-V compound semiconductor-based or other equivalent spatial light modulators discussed below. In this case, a pure phase modulator generates the requisite frequency modulation to guarantee element-to-element mutual incoherence. Frequency separations are generated by replacing the detector/electronics combination associated with each pixel by an electronic ring oscillator or astable multivibrator with processvariable-induced spatial inhomogeneities in the center frequencies across the array. The most demanding requirement for this application is the necessity of achieving greater than $\pi$ phase variation with minimal associated amplitude modulation. This in turn will require $\Delta(nd)$ products greater than $\frac{1}{2}$ (optical path length differences given by either a change in the refractive index n multiplied by the active device thickness d, or a change in device thickness or displacement multiplied by the effective refractive index of the active region, or both). Such $\Delta(nd)$ products may prove to be difficult to achieve, for example, in traditional multiple quantum well (MQW) spatial light modulators based on the compound semiconductor system, and may require the utilization of unusually large piezoelectric effects in strained layer superlattices, or the incorporation of coupled double quantum wells (CDQWs) in modulation doped NIPI structures or planar asymmetric Fabry-Perot cavities.

Implementation utilizing a wide variety of candidate spatial light modulator technologies such as liquid crystal light valves or deformable membrane devices may prove particularly suitable for generation of the degree of mutual incoherence required of the source array.

The fourth source array structure employs an acousto-optic deflector in conjunction with a prescribed electronic drive signal to generate a set of individually coherent but mutually incoherent beams derived from a single laser source. In one such configuration, the electronic signal consists of the coherent superposition of N waveforms with indices q=1 through N, each shifted in frequency from the center frequency of the acousto-optic deflector by a given amount $q\Delta\nu$. This set of waveforms will produce a diffraction grating within the acousto-optic deflector that will (a) divide the incident beam into N+1 separate beams (including the undiffracted zero order beam), (b) shift the frequency of each individual beam by $q\Delta\nu$, and (c) deflect each beam through a separate angle $q\Delta\theta$. With appropriate imaging optics, this set of output beams can be used as a one-dimensional array of individually coherent but mutually incoherent sources. Utilization of a second, orthogonally oriented acousto-optic deflector cascaded with the first can produce a two-dimensional array of such sources as well.

It will be noted that the fourth source array structure that utilizes a single coherent input beam and one or more acousto-optic deflectors for array generation has the advantage that only a single laser source is required; that the degree of coherence among all of the source beams generated can be arbitrarily established (within limitations imposed by the bandwidth of the acousto-optic deflector) by setting the frequency shift induced between pairs of beams; that the incorporation of a tunable laser as the single coherent source allows for broad flexibility in establishing the central operating wavelength of the source array, as may prove to be important in test applications for which the critical wavelengths of other components within the architecture cannot be determined a priori; and that array nonuniformities can to a certain extent be compensated for (or desired array anisotropies generated) by adjustment of the analog driver signals used to generate each separate frequency component, which in turn determine the diffraction efficiencies applicable to each individual source beam within the array.

3. Copying of Multiplexed Volume Holograms.

Also in accordance with the invention described in the parent application, apparatus is provided for copying an original multiplexed volume hologram within a primary volume holographic optical element (master) to form an identical multiplexed volume hologram within a secondary volume holographic optical element (copy). The apparatus and method for copying a multiplexed volume hologram of planar objects that are reconstructed as virtual images are described herein first, followed by a description of their generalization to multiplexed volume holograms of planar amplitude objects, phase objects, 3-D objects, and multiplexed volume holograms that reconstruct real images.

In the present application, the use of this type of apparatus and method for transferring information from an original multiplexed volume holographic optical element into a secondary volume holographic (recording) medium, in which the information may generally be configured very differently than in the original hologram, is described. In addition, the application to two-way information transfer between two holographic media is provided. This application can be used to lengthen retention time and to decrease or eliminate partial erasure during readout.

Figure 7A:
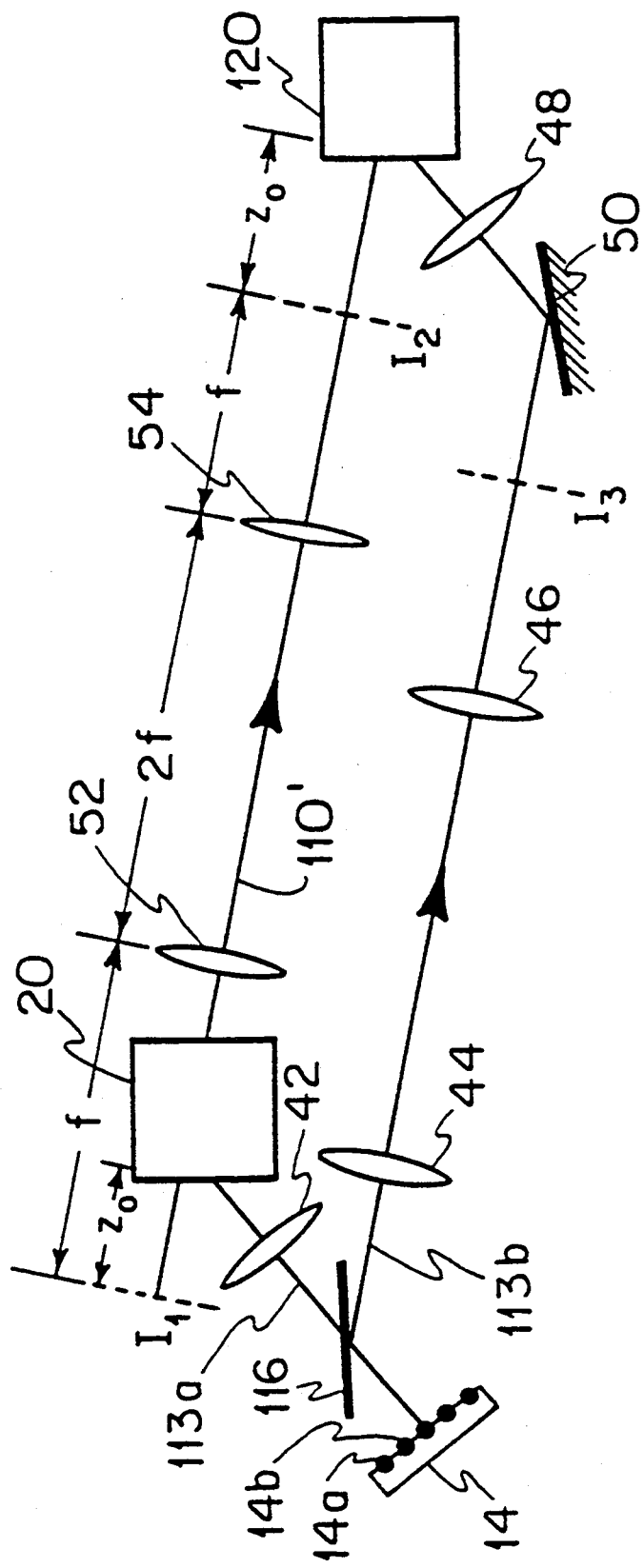
FIGS. 7A–F show schematic diagrams of optical apparatus for one-step copying or information transfer from a primary multiplexed volume holographic optical element to a volume holographic medium to yield a secondary multiplexed volume holographic optical element, with FIG. 7A depicting apparatus for the case of two transmission holographic elements, FIG. 7B depicting apparatus for the case of two reflection holographic elements, FIG. 7C depicting apparatus for the case of a reflection primary holographic element and a transmission secondary holographic element, FIG. 7D depicting apparatus for the case of a transmission primary hologram and a reflection secondary hologram, FIG. 7E depicting apparatus for the case in which both holographic elements comprise hybrids of transmission and reflection holograms, and FIG. 7F depicting apparatus for two-way information transfer between the two volume holographic media, yielding a resonator arrangement.

An embodiment of the copying apparatus is schematically depicted in FIG. 7A and employs the original multiplexed volume holographic optical element 20 (master) to generate a substantially identical secondary multiplexed volume hologram within a secondary volume holographic element 120 (copy). An array 14 of coherent light sources that are mutually incoherent is employed, as described above. A beamsplitter 116 is used to form two reference beams 113a, 113b, from each coherent light source 14a, 14b, etc., thereby forming two sets of angularly multiplexed reference beams, each set at a different location, but otherwise substantially identical. The first set of reference beams 113a is directed onto the original multiplexed volume holographic optical element 20, such as by lens 42, to thereby form a set of output beams 110'. The second set of reference beams 113b is directed onto a secondary holographic recording medium 120. In certain applications pertinent to the invention, the two sets of reference beams may be either wavelength multiplexed or spatially multiplexed or any combination of angularly, spatially, and wavelength multiplexed.

Reference beams 113b are made to have phase fronts at recording medium 120 that are substantially identical to the phase fronts of reference beams 113a at holographic element 20. This can be provided, for example, by relay optics 44, 46, and 48. If lenses 44 and 46 each have focal length $f_r$, then the optical distance from source array 14 to lens 44 is $f_r$, from 44 to 46 is $2f_r$, and from 46 to $I_3$ is $f_r$, where $I_3$ is an image of the source array. The optical distance from source array 14 to holographic element 20 is equal to the optical distance from $I_3$ to recording medium 120. The position of lens 42 with respect to holographic element 20 is the same as the position of lens 48 with respect to recording medium 120. Beamsplitter 116 and reflecting surface 50 direct the reference beams 113 in the desired directions. Thus, the optical path from beamsplitter 116 to holographic element 20 is essentially identical to that from mirror 50 to recording medium 120.

The set of reconstructed output beams 110' is directed from the original multiplexed volume holographic optical element 20 onto the secondary holographic recording medium 120, such as by lenses 52, 54, with path lengths sufficiently identical to the reference beam path lengths to permit coherent interference, pairwise, between the output beams and the second set of reference beams, inside the secondary holographic recording medium.

In FIG. 7A, plane $I_1$ corresponds to the virtual image plane of the objects, obtained from the reconstructed beams of the holograms recorded in holographic element 20. (Extensions to non-planar objects are given below.) The images in $I_1$ can be completely overlapping (as in the case of FIGS. 6A and 6B), partially overlapping, or non-overlapping in space (as in the case of FIGS. 4 and 5).

Lenses 52 and 54, of focal length f, are chosen to create an image of plane $I_1$ at plane $I_2$. In this embodiment, plane $I_1$ is chosen to be coincident with the virtual image plane of the hologram. Plane $I_1$ exists at a distance $z_0$ from the entrance face of the holographic element 20, and the image plane $I_2$ of $I_1$ exists at the same distance $Z_0$ from the entrance face of the holographic recording medium 120.

Due to the geometry of relay optics 52 and 54, the beams from $I_2$ are incident on recording medium 120 with phase fronts that are substantially identical to the original (primary) object beams that were incident on holographic element 20, with the exception of an exact spatial inversion about the optical axis. (Such spatial inversion can be removed, if desired, by inserting another f-2f-f optical relay system in path 110', from $I_2$ to another real image plane $I_2'$. The path of the reference beams 113b is similarly changed if needed to maintain the requisite pair-wise coherence.) In the remainder of this section on copying, the light distribution at $I_2$ that is subsequently incident on the holographic recording medium will be referred to as if it were not spatially inverted, with the understanding that if a non-inverted copy is desired, the optics can be changed as described above, or changed to a three-lens amplitude-and-phase imaging system that has been demonstrated experimentally in a multiplexed volume holographic element copying system (Sabino Piazzolla, B. Keith Jenkins, and Armand R. Tanguay, Jr., "Single step copying process for multiplexed volume holograms," *Optics Letters*, Vol. 17, No. 9, pp. 676–678, 1 May 1992).

A set of holographic modulation patterns is then simultaneously recorded in the secondary holographic medium 120 by the interference of the set of output beams 110' with the second set of reference beams 113b, thereby forming the substantially identical multiplexed volume hologram.

Applications and extensions of this copying apparatus and method to other types of multiplexed holograms will now be discussed. First, all of the copying methods and apparatus described herein apply to multiplexed holograms originally recorded simultaneously with an array of individually coherent but mutually incoherent sources, which results in a holographic record of an incoherent superposition of optical interference patterns in the master holographic medium; in this case, the copying apparatus reference beams 113a must approximate the reference beams 13a used during the original recording of holographic element 20. In addition, these methods and apparatus also apply to sequentially recorded multiplexed volume holograms, since the net resulting holographic record within the master medium is an incoherent superposition of records of the same optical interference patterns. Here again, the copying can be made in one step, the requirement being that the set of reference beam phase fronts at holographic element 20 during copying approximate the set of reference beam phase fronts that were used over time during recording of the original hologram.

Finally, these methods and apparatus can also be used to optically copy computer-generated volume holograms. In this case, the resulting interference pattern that is recorded in the secondary medium may by quite different than the pattern encoded into the master holographic element; but the function of the copy hologram will be substantially identical to that of the master. Examples of reasons for optically copying a computer-generated volume hologram include the reduction or elimination of unwanted spurious diffracted orders; an increase in optical diffraction efficiency during readout; or the initialization of interconnection weights that were pre-computed and stored in a computer generated hologram, then copied into a real-time optical medium that is used in an adaptive photonic neural network for subsequent information processing.

The same holographic recording apparatus and method described above can be used to copy multiplexed volume holograms of a set of planar phase objects that were recorded, for example, using a phase modulator at location 28 of FIG. 6A. This is possible because the imaging optics 52 and 54 in effect copy not only intensity information but also phase information from $I_1$ to $I_2$. This further permits generalizations to multiplexed volume holograms of 3-D objects (again, of a set of original stored holograms that was simultaneously or sequentially recorded), wherein the phase fronts from $I_1$ have been relayed to $I_2$ (or $I_2'$ in the non-inverted case). In this case, the plane $I_1$ represents the intensity and phase information of each beam propagating from each of the original 3-D objects.

This apparatus and method can be extended to allow for copying of holograms that reconstruct real images. Conceptually, in this case, the plane $I_1$ is located a distance $Z_0$ after holographic element 20, and the subsequent relay optics 52, 54 are positioned the same, relative to $I_1$, as in FIG. 7A. Similarly, $I_2$ (or $I_2'$) is positioned the same, with respect to recording medium 120, as $I_1$ is positioned with respect to holographic element 20.

It should be noted that $Z_0$ does not have to be chosen exactly as described above; in fact, depending on aberrations and apodization effects, $Z_0$ can, in many cases, be set equal to 0 (so that in the case of planar objects, for example, $I_1$ is not coincident with the virtual image plane of the recorded objects).

The copying apparatus can also be applied to reflection holograms. By using variants of the embodiment shown in FIG. 7A, for example, one can copy from a multiplexed reflection holographic element to make another multiplexed reflection holographic element, as well as from a reflection element to a transmission element and from a transmission element to a reflection element. Finally, multiplexed holographic elements that are a hybrid, in that they include some transmission holograms and some reflection holograms, can also be copied with a similar apparatus. These cases are described in more detail below.

FIGS. 7B–E show examples of embodiments of the copying apparatus for these different cases of reflection and transmission holograms. In these figures, beam shaping optics such as lenses have been omitted for clarity. As described elsewhere in this section, any of a variety of optical imaging systems can be used in the reference and object beam paths for nearly identical copies, and other optical systems can be used for more general information transfer systems (described below).

Figure 7B:
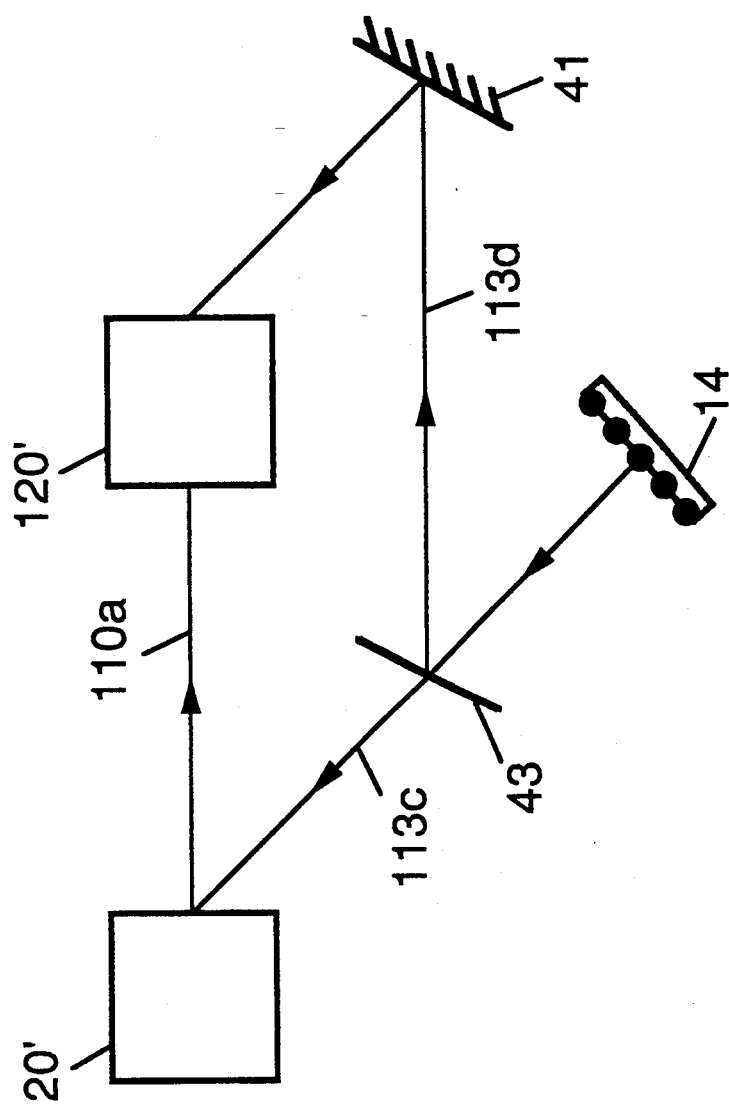

FIG. 7B shows an embodiment for the case of transferring information from a primary multiplexed volume holographic element 20' that reconstructs in reflection, to a secondary holographic medium 120' that will, after recording, yield a secondary multiplexed volume holographic element that also reconstructs in reflection. Beamsplitter means 43 and mirror 41 direct the two sets of reference beams to the two holographic media, and the reconstructed beams 110a interfere with the reference beam 113d in the secondary medium 120' in a geometry suitable for recording reflection multiplexed holograms. Of course, as in all copying or information transfer geometries, the path lengths are kept sufficiently equal to ensure pairwise coherence in the secondary medium 120'. The coherence length of the source will determine how close the path lengths need to be. All of FIGS. 7B-F are drawn to depict that the path lengths can be made to be substantially identical; optical sources with sufficiently long coherence lengths, however, permit relaxing of this constraint in the optical system. It will be clear to one skilled in the art that such longer coherence lengths can permit simplification of the optical systems, by rearranging the optical components and beam paths.

Figure 7C:
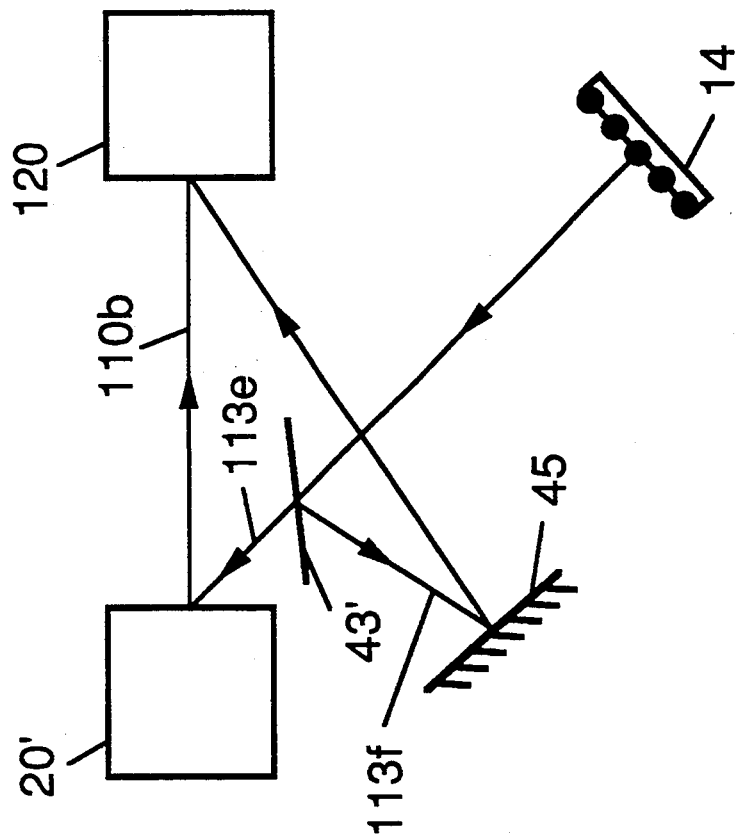

FIG. 7C shows an embodiment for the case of transferring information from a reflection primary holographic element 20' to a secondary holographic medium 120 to form a transmission (secondary) holographic element. Mirror 45 and beamsplitter means 43' direct the sets of reference beams (113e and 133f) to the two holographic media, and 110b is the set of object beams that are output from the primary hologram during reconstruction.

Figure 7D:
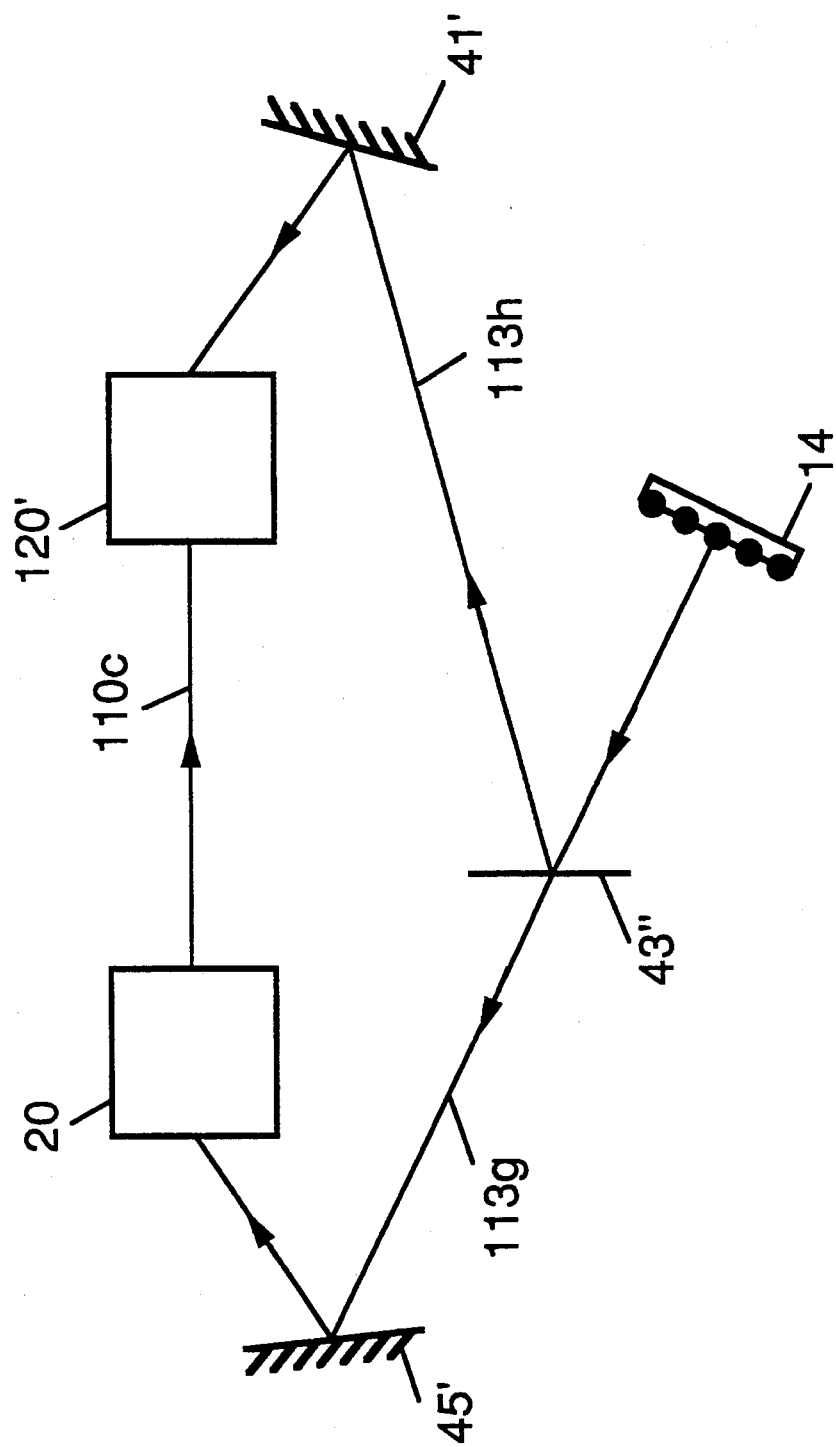

Similarly, FIG. 7D shows an embodiment for transferring information from a transmission primary holographic element 20 to a secondary holographic medium 120' to form a form a reflection holographic element. Beamsplitter means 43" and mirrors 45' and 41' direct the two sets of reference beams to the holographic media, and 110c represents the output beams being reconstructed from holographic element 20.

Figure 7E:
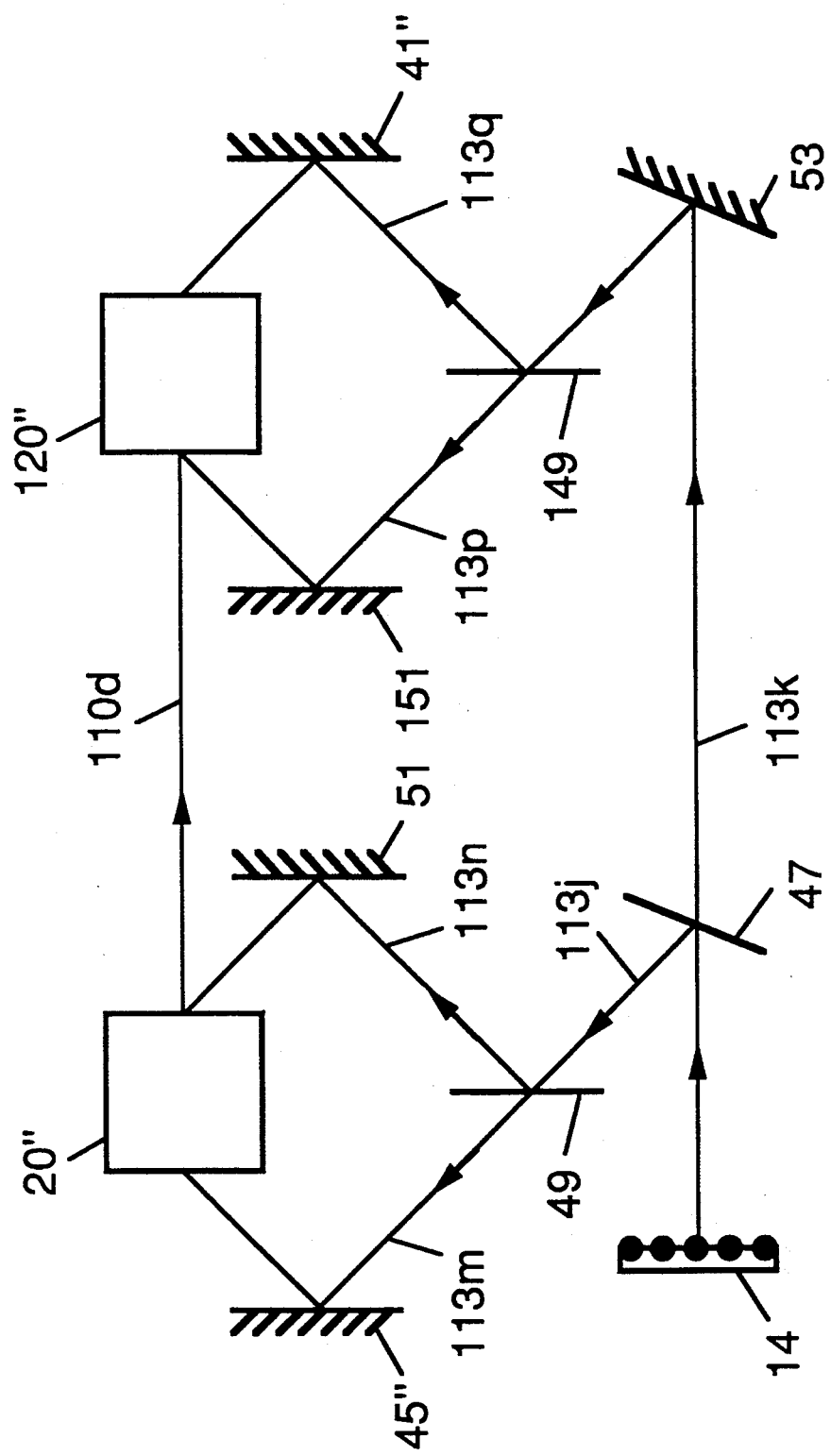

Finally, FIG. 7E shows an embodiment for transferring information from a hybrid transmission/reflection holographic element 20" to secondary holographic medium 120" to form a secondary hybrid reflection/transmission holographic element. Beamsplitter means 47, 49, and 149, and mirrors 53, 45", 51, 151, and 41" direct four sets of reference beams to the two holographic media, in order to reconstruct (from 20") and record (in 120") both reflection and transmission holograms. Beams 110d represent the output beams being reconstructed from both reflection and transmission holograms in the primary holographic element 20". In many cases a fixed mask element may be used to send a particular subset of the set of reference beams generated by source array 14 (those that correspond to transmission holograms) to holographic element 20" via beam path 113m, and a different subset of the reference beams (those that correspond to reflection holograms) to holographic element 20" via beam path 113n. Similarly, a mask element or spatial light modulator may be used in the beam paths (113k, 133p, 113q) that send reference beams to the secondary holographic medium to select beams for reflection and transmission holograms. Finally, it will be noted that the previous cases depicted by FIGS. 7A-D are included in the embodiment of FIG. 7E, as can be seen by blocking or removing appropriate beam paths in FIG. 7E.

Similarly, a variety of copying geometries are possible for either reflection or transmission holographic elements. For example, in addition to straightforward geometries, the undiffracted order from either of the holographic elements can in some cases be used as the set of reference beams for the other (instead of using a beamsplitter to generate two sets of reference beams). In this case, the reference beams can be made to be substantially identical at the copy and at the master, if desired, by using an amplitude-and-phase imaging system with passive optical elements (such as lenses), or by using phase conjugation techniques. A review of optical phase conjugation can be found in *Optical Phase Conjugation*, Robert A. Fisher, Academic Press, New York (1983).

By incorporating independent control of the sources in the source array, subsets of the original multiplexed volume holograms stored in holographic element 20 can be copied onto recording medium 120. This is useful, for example, in a manufacturing environment in which different copies are meant to have different holographic recordings, each a subset of the set of holographic recordings encoded in a master, complete multiplexed hologram. The sources in array 14 that correspond to the desired holograms to be copied are turned on, and the others are left off. Alternatively, a spatial light modulator can be employed in conjunction with a lens to modulate an image plane of the source array 14, in order to provide independent source control. Independent control of the sources can also be used to partially or completely sequence the copying process, so that during each exposure of a sequence of exposures in time, a subset of the holograms is copied.

This functionality (that of independent source control) is also useful in the cases of interconnection networks and neural networks, in which a portion of the master hologram is to be copied, to be later used to refresh that part of the original hologram. Alternatively, the copy can be used as the interconnection hologram, and the master as a library of interconnection patterns, subsets of which are loaded into the copy 120 to implement a desired interconnection.

At this point it should be clear to one skilled in the art that holograms that are not stored in the master holographic element can be additionally recorded in the copy medium during the copying procedure. This can be achieved by incorporating more than one master holographic element, or by generating additional optical beams to make "original" holograms to be included in the secondary (copy) medium along with those that are copied from the master hologram.

Similarly, it should be clear to one skilled in the art that multiple copies can be made using one apparatus, and for example even in a single exposure step, by utilizing more than one secondary holographic medium. Two techniques can be used for this. In the parallel recording case, referring to FIG. 7A for example, the set of reference beams 113 is split into more than 2 paths (a path being directed to each secondary medium), and the set of output beams 110' is split into multiple paths, one being directed to each secondary medium. In the series recording case, the output beams 110' are sent to the first secondary medium, and the undiffracted and unabsorbed component continues out the other side of the secondary medium. It is then directed (with similar imaging optics as between the primary and first secondary media) to the second secondary medium, and interferes with reference beams that were split off of 113b using a beamsplitter in place of mirror 50, for example; or alternatively, by using undiffracted reference beams transmitted by the primary or first secondary medium. The copying apparatus cascades these stages to provide copying onto additional secondary media. This series case enables more efficient utilization of the available optical power than does the parallel case.

Figure 7F:
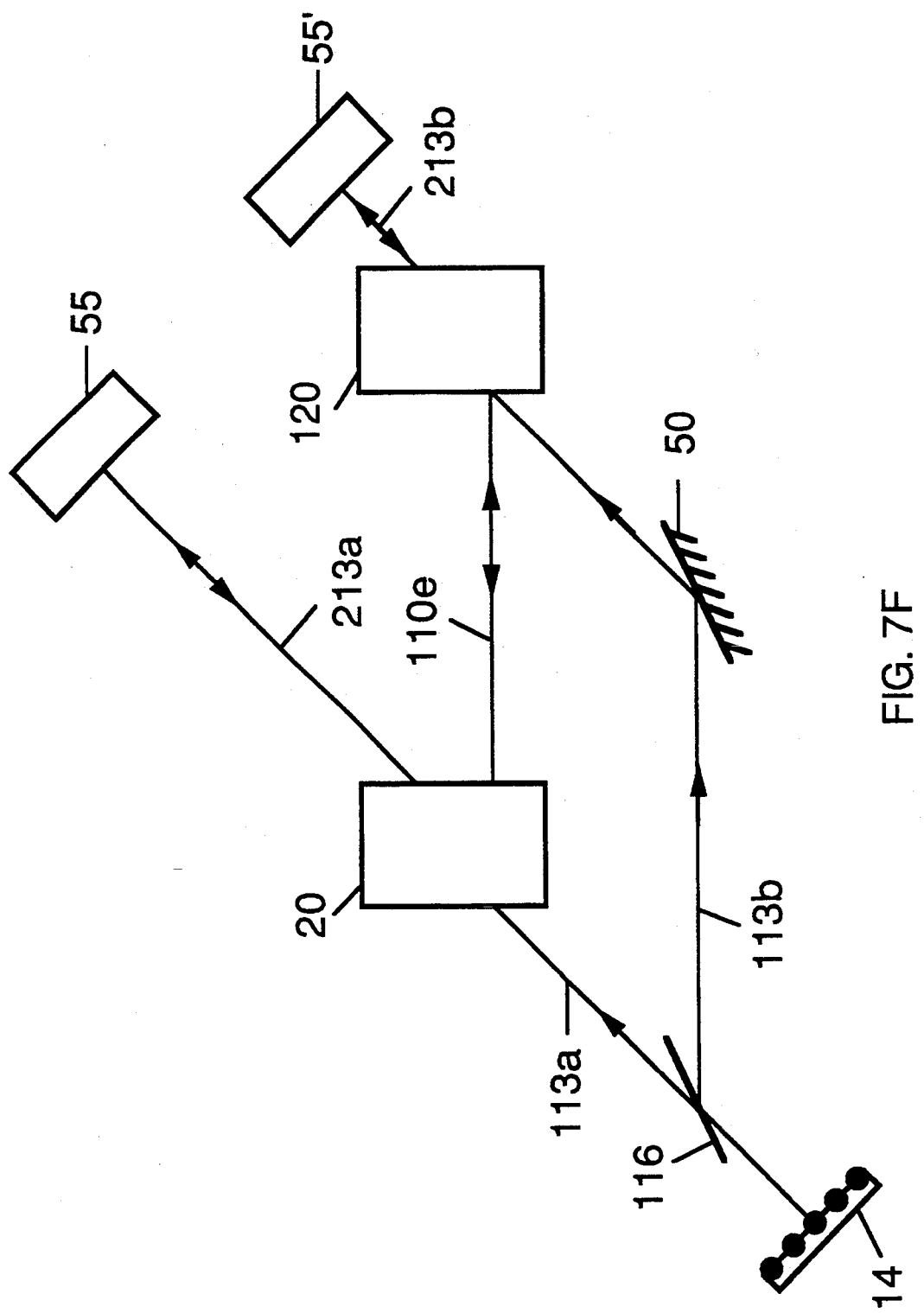

Additionally, the entire multiplexed holographic element can be refreshed using the copying apparatus (or the information transfer apparatus described below). If we copy back and forth between two holographic media, we in effect have a resonator type structure if the copying in both directions is performed simultaneously and continuously in time. This approach differs from other previous work (see, for example, D. Z. Anderson, "Coherent optical eigenstate memory", *Optics Letters*, Vol. 11, No. 1, pp. 56–58, January 1986) in that multiple holograms are being copied (refreshed) simultaneously, enabling a much higher storage capacity within the resonator apparatus. Note also that with this apparatus the two holographic elements need not be identical copies of each other at all, but could be quite different. A variety of physical arrangements can be used for this apparatus, and they are based on the same underlying mechanisms as the copying and information transfer apparati described in this section. One embodiment of such a resonator structure is shown in FIG. 7F, for the case of transmission holographic elements. Source array 14, beam-splitter means 116, reference beams 113a and 113b, mirror 50, and output reconstructed beam path 110e form a system that is substantially the same as the copying system of FIG. 7A, operates using the same principles, and transfers information from multiplexed volume holographic element 20 to holographic medium 120 along beam path 110e. A similar arrangement is used to copy the resulting holographic modulation pattern in medium 120 to the holographic element 20 (also along beam path 110e), where it is recorded and reinforces the holographic modulation pattern within the holographic element 20. Reference beams are provided for this return path transfer by phase conjugate mirrors 55 and 55', which phase conjugate the undiffracted zero orders (i.e., transmitted reference beams) of the two holographic elements. Again, path lengths are adjusted to ensure pairwise mutual coherence between each phase conjugated reference beam coming along beam path 213a, and each object beam coming along beam path 110e, at the medium of holographic element 20.

While it is clear that a real-time holographic material is foreseen for use as the copy holographic medium in some of the above-mentioned applications, the previous resonator example shows that in some cases it is also desirable to use a real-time material for the master holographic medium. Another example that utilizes this capability is described below.

The similarity between two multiplexed holographic elements can be measured by using the copying apparatus in the forward or reverse directions. For example, the output beams recalled from one multiplexed holographic element, when incident in the object beam directions on a second multiplexed holographic element, can recall a set of reference beams. The nature (e.g., intensity) of the recalled reference beams provides information on the similarity (e.g., correlation) between each pair of corresponding holograms of the two multiplexed holographic elements. Then, as new holograms are loaded into the first (master) multiplexed holographic element, they can be correlated with those in the secondary medium. Note that this process can correlate, pairwise, a large number of 2-D images simultaneously. In the particular case of the first multiplexed holographic element being a copy of the second multiplexed holographic element, this procedure can provide a measurement of the fidelity of the copy.

Finally, it will be appreciated that the apparatus and method can also be used to make non-identical copies, in which there is magnification of the spatial extent of the stored images by incorporating optical magnification into the path 110' (or magnification of angles by incorporating optical demagnification into path 110'). Alternatively, the reference beam illumination of the copy 120 can be changed relative to the original by changing the phase fronts incident on the copy. This is needed for applications in which a set of hard-to-generate stored patterns are to be transferred from a master multiplexed hologram to a copy, but the copy is to be used in an optical system that utilizes a different set of reference beams to recall the stored holographic images. In this case, the optics in path 113b are chosen to make the phase fronts incident on recording medium 120 substantially identical to the desired new reference beam phase fronts that will be used to reconstruct the copy. In these non-identical copying cases, the new optics must be chosen so that the optical path length constraint between reference beams and object beams, pairwise, is still satisfied, to assure interference between the mutually coherent beams pairs.

Another example of changing the reference beam formats for the copy holographic element is in cryptography. Each reference beam can carry a spatial code that must be used (as a key) to recall each hologram. In this case, spatial modulation is encoded onto each reference beam. A slight variant is to use the object beams as the keys, so the copy hologram is recalled by using incident object beams, thus generating one or more reference beams as output(s).

More generally, an extension of the non-identical copy concept is the "transfer of information" from one multiplexed holographic element to a secondary holographic medium. For example, the secondary medium can be in the Fresnel or Fraunhofer regime of the master. Thus, the upper path 110' of FIG. 7A is configured differently, and in some cases does not even require any lenses. Uses of this information transfer mechanism include, for example, producing a holographic optical element. The master holographic element can be exposed in one optical location, but its "copy", which is to be used in a final optical system, may be situated in a different optical location (e.g., "upstream" or "downstream" of the master holographic element's location). Another use of this information transfer mechanism is in the two-holographic-element feedback resonator arrangement described above, in which the two holograms are not disposed in a conjugate amplitude-and-phase image relationship to each other; a unique feature of such a geometry is in the effect of nonlinearities in the recording and reconstruction process. The nonlinearities of one holographic element can be used to advantage, e.g. for nonlinear information processing functionality, or for thresholding to provide noise removal and signal level regeneration. The nonlinearities of the other holographic element can at the same time be minimized, e.g. by using a lower overall diffraction efficiency.

A furtherance of the capability to make non-identical copies is that of wavelength conversion, in which the recording wavelength generated by the source array is not the same as the wavelength to be utilized in reconstruction. This feature is particularly useful in the case of currently-available photorefractive volume holographic recording materials, which can be non-destructively read out (reconstructed) only at a wavelength of relative photorefractive insensitivity. In certain cases, the Bragg condition can be satisfied by altering the scale of the source array used for copying in comparison with the scale of the source array used for subsequent reconstruction, and by reconfiguring the optics between the source array and the holographic recording medium.

4. Comparison of Architecture of the Invention with Previous Approaches—Simulation Results.

Figure 8:
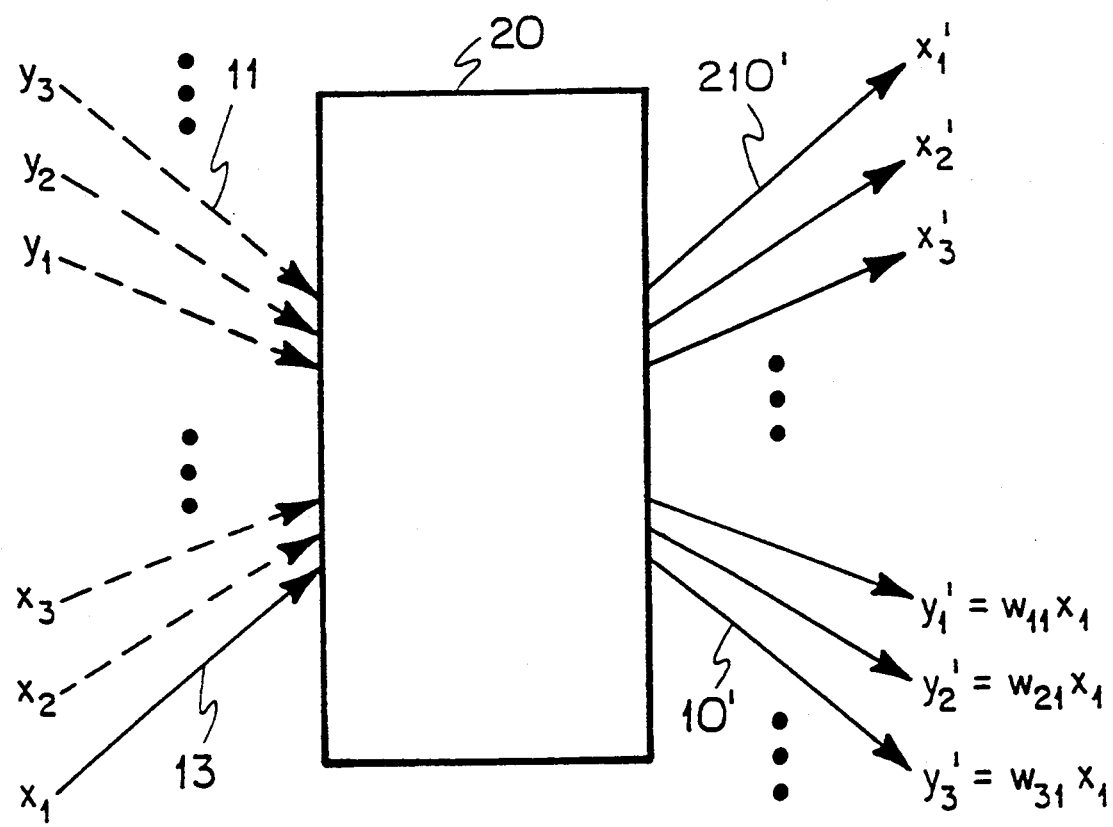
FIG. 8 is a schematic diagram of the optical interconnection paths due to a holographic interconnection architecture for the 3:3 fan-out/fan-in case, constructed such that each input and output node is only singly angularly encoded, showing the origin of crosstalk and throughput loss due to beam degeneracy.

FIG. 8 schematically illustrates what would happen in the case of using the sets of object and reference beams 11, 13, respectively, in an N:N fan-out/fan-in case, of which a 3:3 fan-out/fan-in case is shown explicitly. The beams 13 comprise the three reference beams $x_1$, $x_2$, and $x_3$ (shown explicitly), among others (indicated by the set of three dots). Object beams 11 comprise $y_1$, $y_2$, and $y_3$ (shown explicitly), among others. It is desired to record a fully connected interconnection pattern, with an independent interconnection weight established between each "input" $x_j$ and each "output" $y_i$. In FIG. 8, dashed lines indicate the presence of beams employed at some point during the recording cycle, while solid lines indicate a specific readout example in which only the beam $x_1$ is used as an input, generating the zeroth order beams $x_1'$, $x_2'$, and $x_3'$, as well as the output (reconstructed) beams $y_1'$40 , $y_2'$, and $y_3'$. As will be shown in FIGS. 9 and 10, such an arrangement, typical of the interconnection schemes investigated in the prior art, is subject to a throughput loss (optical inefficiency) of significant magnitude when each common object beam such as $y_1$, $y_2$, or $y_3$ is utilized to record either simultaneous (coherent or incoherent) or sequential (incoherent) interconnections with either a full or partial set of reference beams $x_1$, $x_2$, and $x_3$, and the readout is performed with mutually incoherent reference beams. In this case, readout with two or more reference beams creates equally many beams propagating in each output direction $y_i'$. Such output beam directions for any given output beam $y_i'$ are hence degenerate, and the throughput loss is in fact directly attributable to this beam degeneracy. Throughput losses will also be observed when the readout is performed with mutually coherent reference beams if the recording process was performed either simultaneously with mutually incoherent reference beams, or sequentially with independent reference beams. Furthermore, these interconnection schemes are subject to both a significant throughput loss and coherent recording crosstalk when the same sets of interconnections are recorded simultaneously with mutually coherent sets of reference and object beams (such as $y_1$ with $x_1$, $x_2$, and $x_3$).

In the discussion of phase volume holographic recording, a quantity of importance is the strength v of a given recorded holographic grating, which is defined as $$v = (2\pi/\lambda) \Delta n \, d$$

in which $\lambda$ is the wavelength utilized for holographic grating reconstruction, d is the effective thickness of the holographic recording medium, and $\Delta n$ is the amplitude of the modulated index of refraction associated with this given grating, such that the spatial dependence of the local index of refraction on the spatial coordinate x is given by:

$$n(x) = \Delta n \sin(2\pi x/\lambda).$$

In the case of either incoherent or coherent (sequential) recording with incoherent readout of the interconnection gratings, fan-in throughput loss is observed. In this example, the weights are in the ratio of 1:2:3 ($w_{11}$:$w_{21}$:$w_{31}$). In addition, the remaining interconnection weights have been recorded such that $w_{1j}$:$w_{2j}$:$w_{3j}$ are also in the ratio 1:2:3 for j=2,3 and $w_{11}=w_{22}=w_{33}$.

Figure 9:
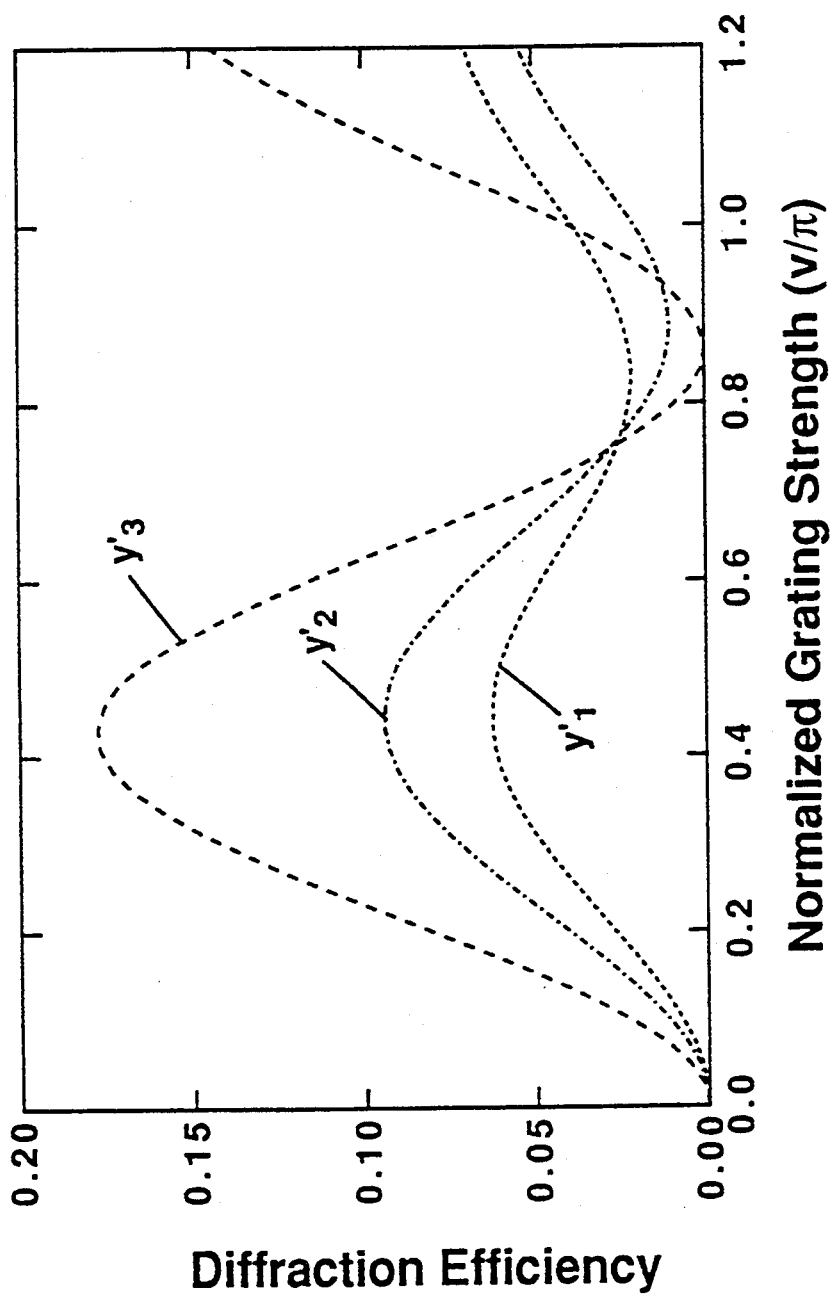
FIG. 9, on coordinates of diffraction efficiency and normalized grating strength ($v/\pi$), is a simulation result for the holographic interconnection architecture of FIG. 8 utilizing the optical beam propagation method, for the case of sequential recording of the interconnection gratings, showing the fan-out loss.

The results of simulations utilizing the optical beam propagation method are given in FIG. 9, which shows that the ratio of the fan-out (here, 1:2:3) is retained; however, the total efficiency (0.06+0.09+0.18) is considerably less than 1, due to the throughput loss from the transmitted zeroth order beams 210' (a direct result of beam degeneracy). This can be simply explained by reference to FIG. 8, from which it can be inferred that reconstruction beams 10' comprising outputs $y_1'$, $y_2'$, and $y_3'$ are automatically Bragg matched to the interconnections recorded between $x_2$ and $y_1$, $y_2$, and $y_3$ and between $x_3$ and $y_1$, $y_2$, and $y_3'$. Hence, $y_1'$, $y_2'$, and $y_3'$ reconstruct unwanted (in this example) zeroth order beams 210' comprising $x_2'$ and $x_3'$, which take considerable efficiency from the reconstruction of $y_1'$, $y_2'$, and $y_3'$.

Figure 10:
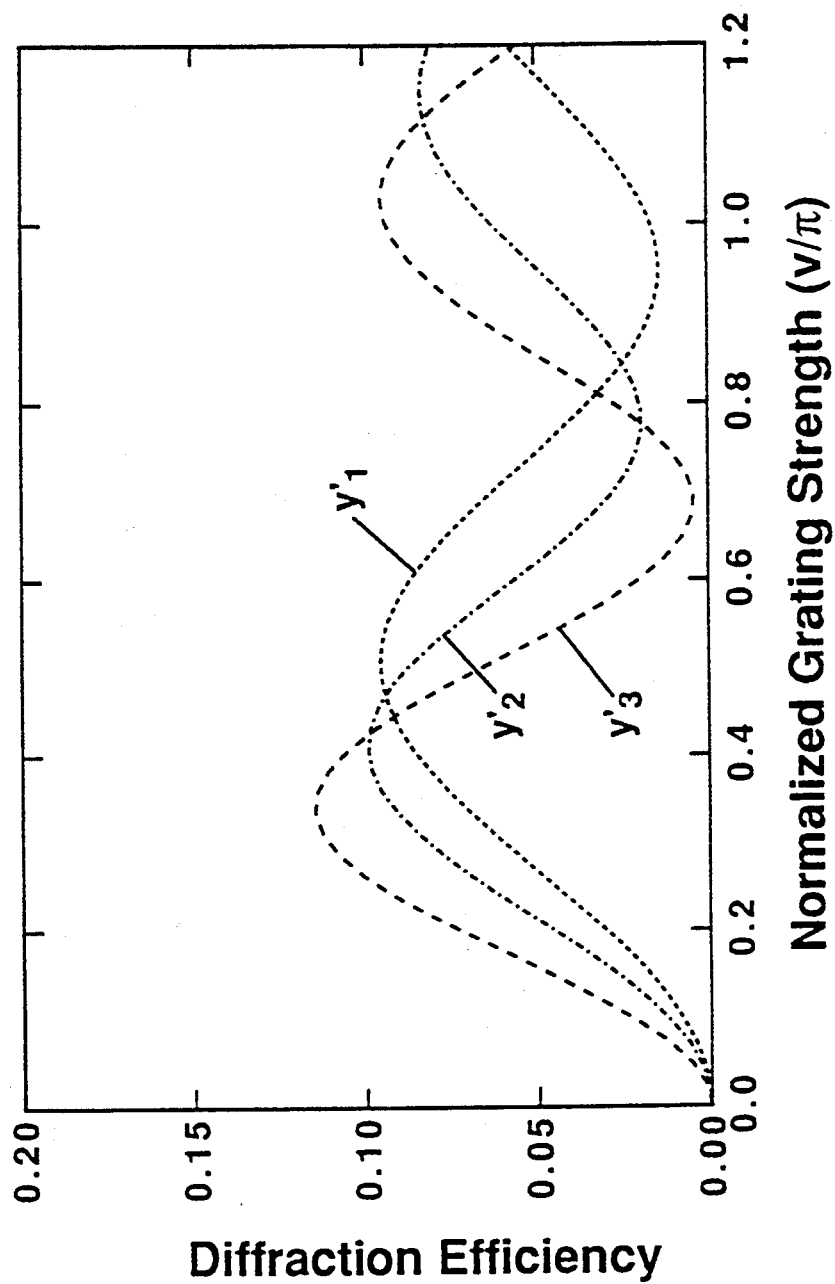
FIG. 10, on coordinates of diffraction efficiency and normalized grating strength ($v/\pi$), is a simulation result for the holographic interconnection architecture of FIG. 8 utilizing the optical beam propagation method, for the case of simultaneous fully coherent recording of the interconnection gratings, showing the fan-out throughput loss and the occurrence of recording-induced crosstalk.

In the case of coherent and simultaneous recording of the interconnection gratings, not only is fan-in throughput loss observed, but also coherent recording-induced crosstalk is seen. In FIG. 10, the total efficiency is, like in FIG. 9, considerably less than 1, due to the beam degeneracy throughput loss. Further, the correct ratio of the fan-out is lost at and near the peak diffraction efficiency, due to recording-induced crosstalk. The notion of maintaining efficient interconnections in such an arrangement is thus seen to be a myth.

Figure 11:
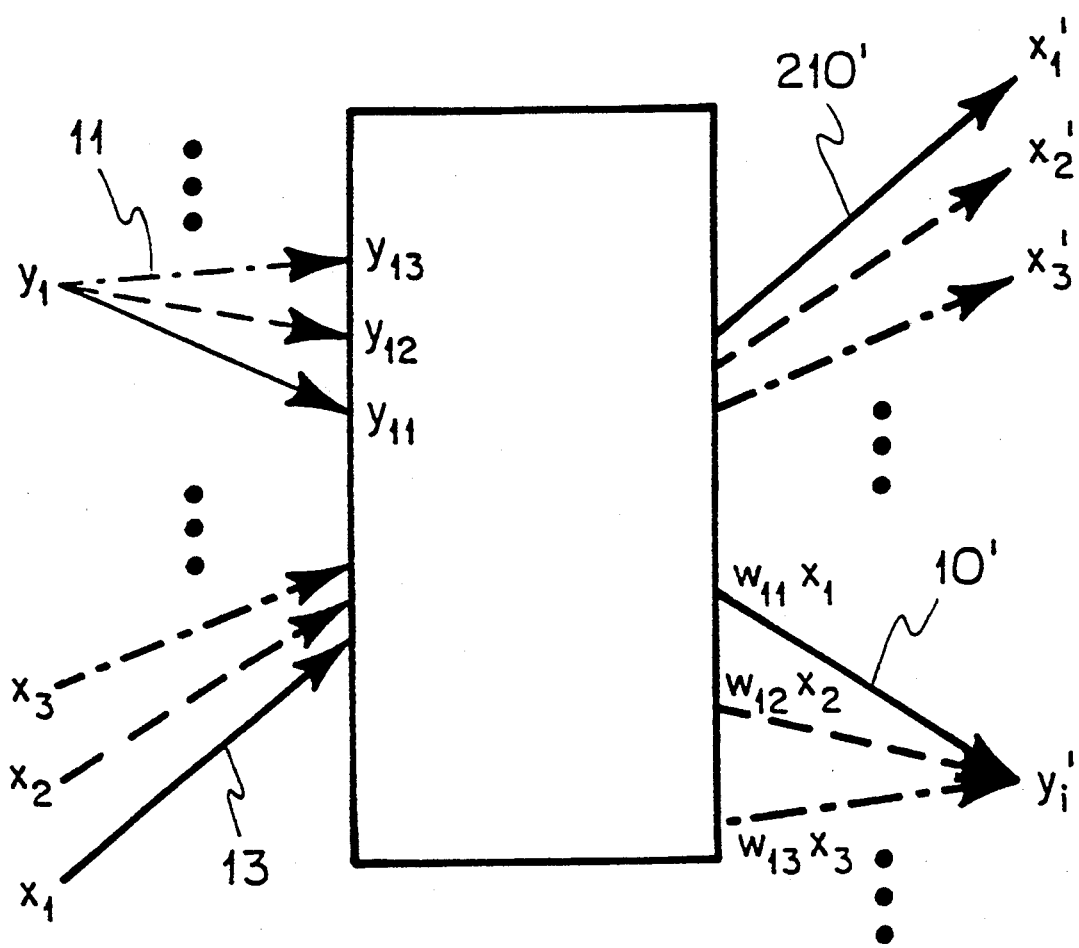
FIG. 11 is a schematic diagram of optical interconnection paths of the apparatus described in FIG. 6 for the 3:3 fan-out/fan-in case, showing the angular multiplexing of both object (source) and reference beam sets, configured to produce angular multiplexing of the reconstruction beam fan-in to a given output node.

FIG. 11 is similar to that of FIG. 8, except that it is based on employing the architecture of the invention, and shows the angular multiplexing of both the object (source) and reference beam sets 11, 13, respectively, as well as angular multiplexing of the fan-in to a given output node. In FIG. 11, coherent pairs of object beams 11 and reference beams 13 are depicted in like manner; since all of the reference beams are mutually incoherent due to the source array 14 (as shown, for example, in FIG. 6A), each reference beam $x_j$ interferes with only one given object beam passing through the point $y_1$; therefore, none of the reconstructed beams 10' and zeroth order beams 210' are Bragg-matched to additional gratings and hence no beam degeneracy throughput loss is observed.

It will be noted with reference to FIG. 11 that imaging optics (not shown) can be used to combine image-bearing beams incident at different angles and superimpose them in a plane so that they are in registry on a pixel-by-pixel basis. This superposition function is enabled by the recording geometry described in FIG. 6A, in that all individually coherent but mutually incoherent object beams pass through spatial light modulator 28, each at a separate angle.

Coherent recording-induced crosstalk is eliminated among the reference beams, since they are all mutually incoherent. Coherent recording-induced crosstalk among the object beams is limited again by the mutual incoherence of the source-derived beams to occur only among the set of object pixels illuminated by each coherent and expanded object beam. This latter source of crosstalk can be reduced either by increasing the intensity of the set of reference beams relative to the intensity of the set of object beams, or by utilizing the subhologram version of the architecture (which achieves crosstalk reduction by spatial segregation).

In FIG. 11, an incoherent fan-in due to output point $y_1'$ is shown to consist of a weighted sum of inputs of the form $w_{11}x_1 + w_{12}x_2 + w_{13}x_3 = y_1'$, or, in general for an N-input, N-output fully connected interconnection network:

$$y_i' = \sum_{j=1}^{N} w_{ij}x_j \quad (1)$$

The representation used for drawing the vector directions and scales of the input and output beams in FIG. 11 presumes an asymmetric input and output lens configuration (meaning that the input and output lenses, which are not shown, have different focal lengths). (Such an asymmetric input and output lens configuration is depicted in FIGS. 6A (lens 26) and 6B (lens 38)).

5. Spatial Light Modulators.

Figures 12, 12A:
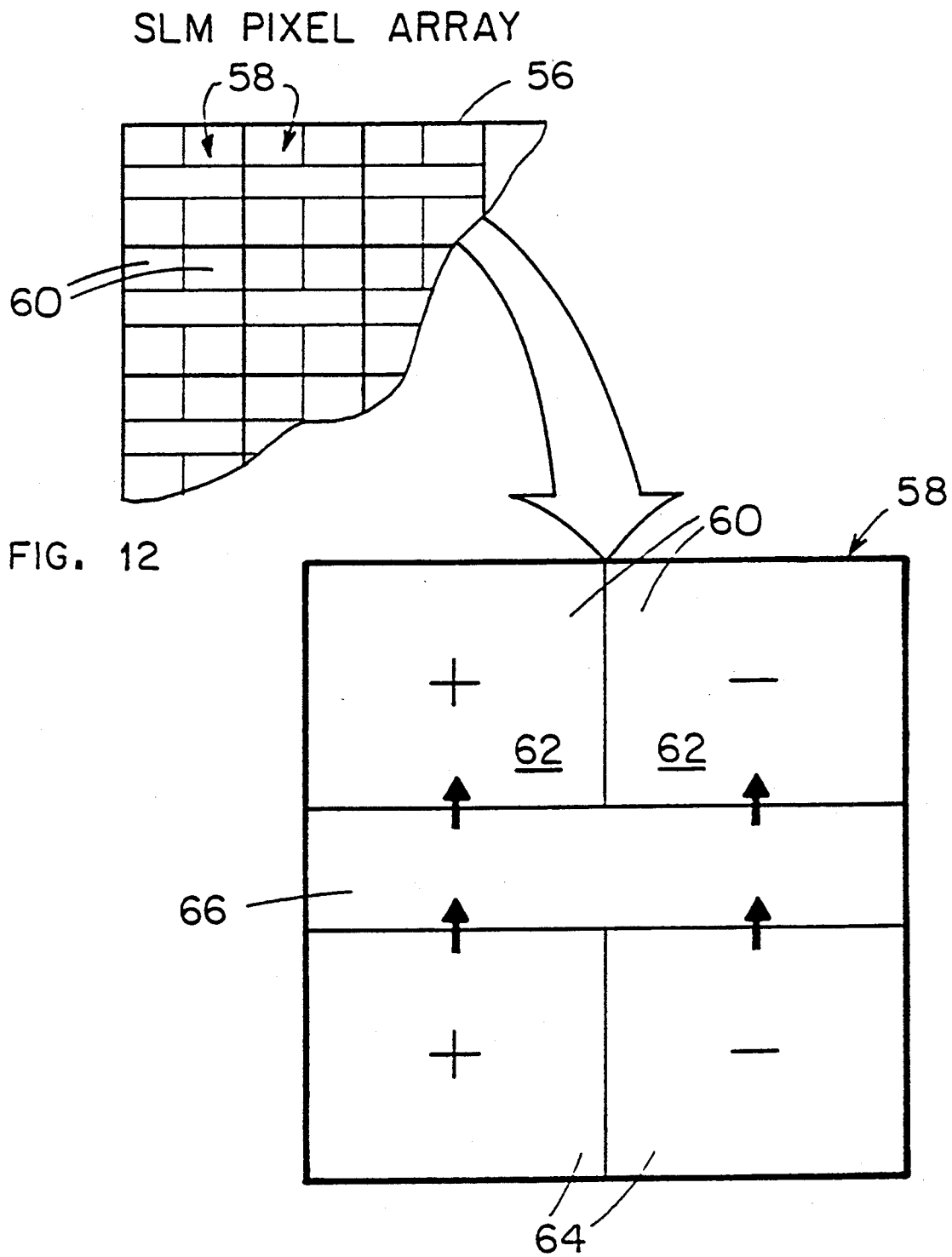
FIG. 12 is a schematic diagram of a multi-function spatial light modulator, as utilized in the interconnection architecture shown in FIG. 14, showing the incorporation of multiple photosensitive elements, control electronics, and multiple modulation elements within each pixel.

The detection, amplification, functional implementation, and modulation functions required in both the neuron unit output and input planes are envisioned to be incorporated in multifunction spatial light modulators. A dual rail differential approach may be employed as it inherently incorporates considerable functional generality, with capacity to accommodate both bipolar inputs and bipolar outputs. The simpler case of unipolar outputs and bipolar inputs, also common in neural network models, represents a subset of our fully bipolar design and requires even less chip area. The dual rail approach involves the hybrid or monolithic integration of two detectors, appropriate amplification and control circuity, and two modulators within each SLM pixel, as shown in FIG. 12. A primary approach is to develop analog circuitry that is process-compatible with both detector and modulator requirements, and at the same time utilizes minimum integrated circuit real estate. Although development of second generation chips in the compound semiconductor system may utilize either multiple single-quantum-well or multiple coupled-double-quantum-well modulation and detection elements in conjunction with electronic circuit elements such as bipolar junction transistors, MESFETs, MISFETs, HEMTs or resonant tunnel diodes (RTDs), the first generation chips have been designed within the silicon repertoire (MOSIS (Metal Oxide Semiconductor Implementation Service, Information Sciences Institute, University of Southern California) design rules) in order to establish functional integrity and preliminary estimates of non-ideality and process-induced variances. Furthermore, hybrid integration of silicon chips (with integrated detectors and control electronics) with compound-semiconductor-based or other technological implementations of the modulation function can be accomplished by bump contact bonding in conjunction with appropriate through-substrate vias. Alternatively, the vias can be eliminated by the use of transparent modulator substrates, with the modulation elements operated in the reflection mode, in conjunction with a second-bump-contact-bonded substrate hybrid-integrated with the first to provide the detection and control circuitry on the two innermost facing substrate surfaces. The current chip set contains $100 \times 100$ $\mu$m pixels, within which 2500 $\mu m^2$ is dedicated to dual rail circuitry that implements a linear transfer characteristic with both upper and lower level saturation (FIG. 13), a function of considerable utility in the neural network application, as described in more detail in a succeeding section. The design described herein incorporates only fifteen transistors per pixel within 2 $\mu$m minimum feature size design rules, and allows for $10^4$ dual rail pixels/$cm^2$.

While any of a variety of SLMs may be used in the practice of the invention, the SLM described below is preferred. The preferred SLM is optically addressed (as opposed to electrically addressed) and is depicted in FIG. 2. The SLM comprises a substrate 56 comprising a plurality of pixels 58, at least two portions of each pixel comprising regions 60 that can be controllably made transparent to incident light with varying degrees of optical density from a first source (such as source array 14). Means 62 are associated with each transparent region 60 to modulate the passage of light therethrough. Alternative means can be provided for modulation of the reflection of light from, rather than the passage of light through, each separate modulation element within each pixel.

Figure 14:
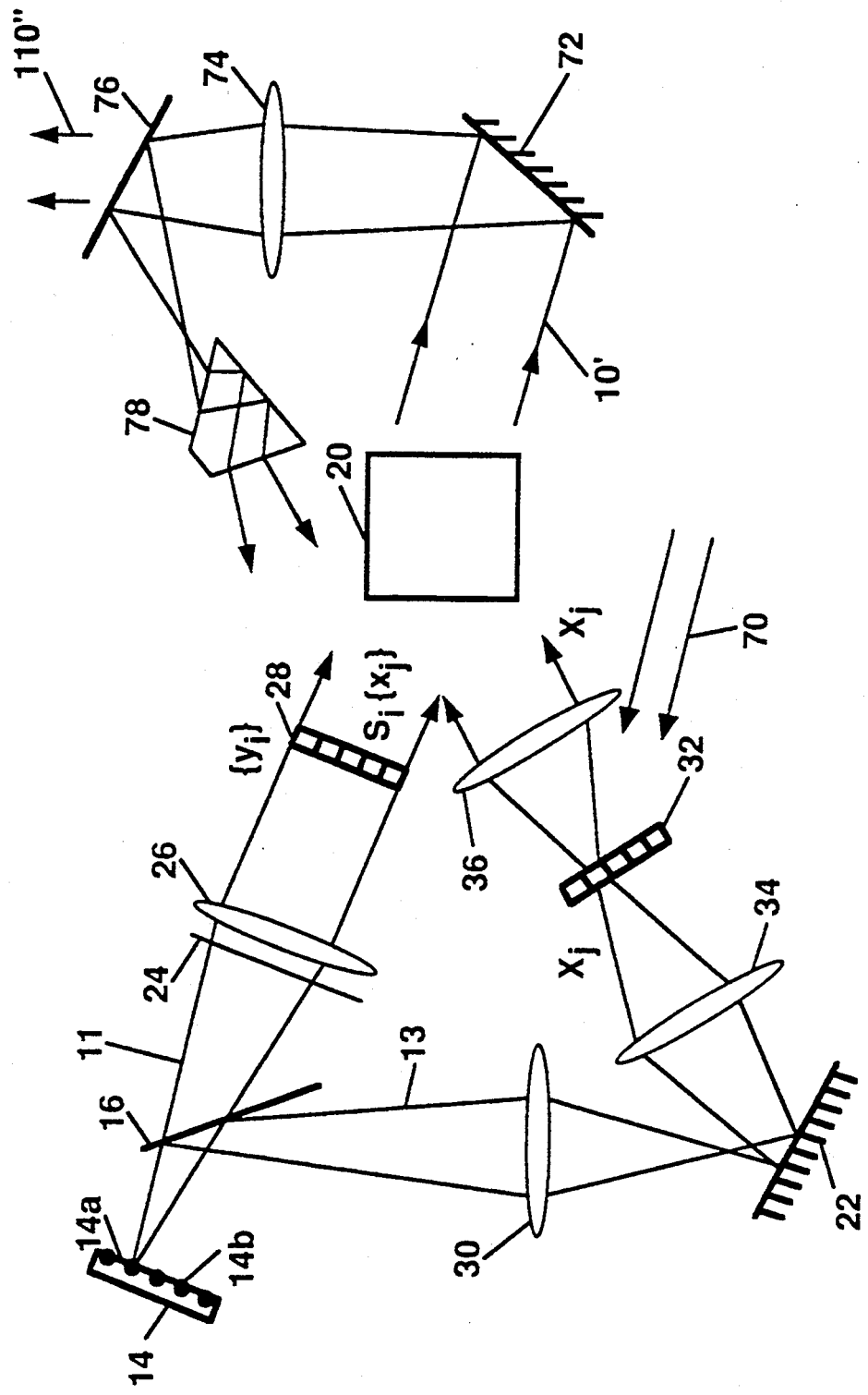
FIG. 14 is a schematic diagram of a preferred embodiment of apparatus for the implementation of neural network modules, for the case of Hebbian learning.

Detector means 64 associated with each pixel detect incident light from a second source or set of second sources, such as from the output of the multiplexed storage holographic element 20; see, e.g., FIG. 14. The detector means generates an electrical signal, which is fed to electronic means 66 associated with each pixel 58. The electronic means 66 is responsive to the electrical signal from the detector and generates a modulation signal which is sent to the modulation means 62. The electronic means 66 comprises, therefore, the several functions of electrical signal transduction (following each detector), signal amplification and level shifting, transfer function implementation (establishment of the functional relationship between the input optical intensity and the output optical amplitude or intensity following the modulator element), and impedance matching to the electrically activated means of each modulation element. As a result, light transmitted through or reflected from the SLM is modulated according to an overall transfer function relationship that implements a desired algorithmic dependence, as specified further in the several following sections.

Both $\oplus$ (positive) and $\ominus$ (negative) channels are depicted in FIG. 12. Note that both polarity channels are provided for each of the detection and modulation functions within each individual pixel. In the preferred embodiment, this allows for the incorporation of both positive valued and negative valued interconnection weights $w_{ij}$, each carried as a separate channel within each individual pixel. This arrangement may be summarized as allowing for the incorporation of both bipolar inputs and bipolar outputs within a given interconnection network.

Figure 13:
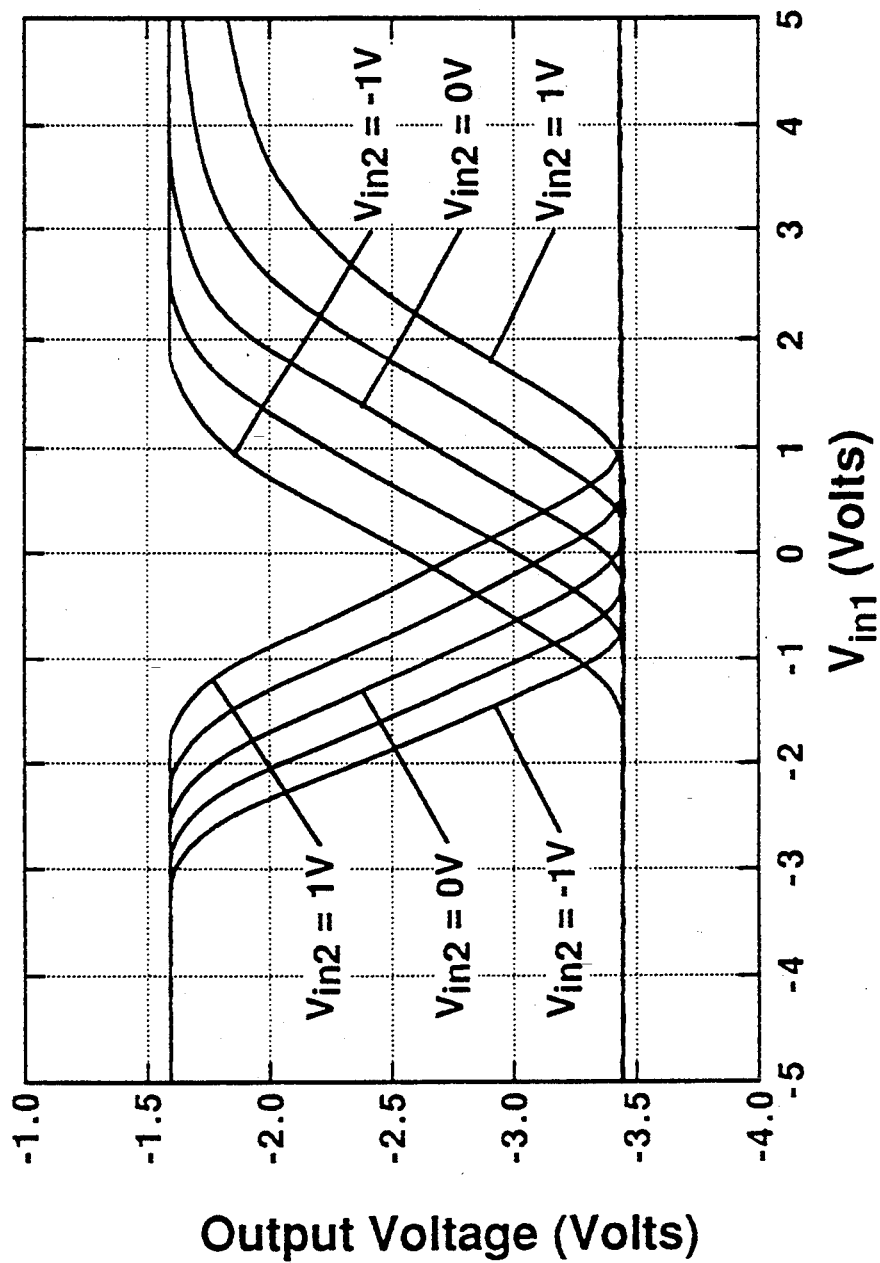
FIG. 13, on coordinates of voltage (ordinate) and voltage (abscissa), is a plot of the output transfer characteristic curves for both outputs of a dual rail CMOS differential amplifier, with 15 transistors in an area of 2500 $\mu m^2$.

In the preferred embodiment, the electronic means 66 is utilized in a modified differential amplifier configuration, which is designed such that the $\oplus$ modulator is driven to increasing transmissivity (or reflectivity) when the $\oplus$ detector output exceeds the $\ominus$ detector output; conversely, the $\ominus$ modulator is driven to increasing transmissivity (or reflectivity) when the $\ominus$ detector exceeds the $\oplus$ detector output. Additionally the $\oplus$ modulator is not driven when the detector output difference ($\oplus - \ominus$) is negative, and the $\ominus$ modulator is not driven on when the detector output difference is positive, as shown in FIG. 13.

Four additional novel spatial light modulator configurations are a part of the invention described in the parent application. In the first, the control circuitry is designed to implement either an astable multivibrator or ring oscillator, with either design-induced or process-variable-induced variance across the pixelated array in the center resonant frequency of the resultant oscillation, in such a manner that the individual pixels temporally modulate fully coherent light producing a mutually incoherent set of modulated beams. Such a spatial light modulator configuration is one preferred embodiment for the source array device described above.

In the second configuration, local interconnections among nearest neighbor or next-nearest-neighbor pixels are incorporated such that the control circuitry drives the modulation elements in a manner that depends not only on the one or more optical inputs to a given pixel, but also on either the one or more optical inputs to neighboring pixels, or on some functional derivative thereof as determined by control circuitry in each pixel.

In the third configuration, the modulation elements are designed in conjunction with a transparent substrate, or in the case of a hybrid integrated device with two transparent nonidentical substrates, such that the modulation creates a variable reflectivity and a variable transmissivity in each pixel, the one being the complement of the other in order to satisfy conservation of energy laws. In this case, both the array of reflected beams and the array of transmitted beams as so modulated constitute separate signals to be utilized in the implementation of system functionality.

In the fourth configuration, two superimposed optical modulation elements are incorporated in each pixel, one vertically above the other as referenced to the substrate plane, such that each is independently controllable by means of the incorporated control circuitry (in turn dependent on the electrical and/or optical input state(s) of each pixel), with one of these elements exhibiting principally phase modulation in response to its input variable, while the other of these elements exhibits principally amplitude modulation in response to its independent input variable. In this manner, independent control of both the amplitude and phase modulation exhibited by each pixel is achievable; in addition, compensation can be provided for undesirable modulation-dependent phase in an amplitude modulation application, and the compensation of undesirable modulation-dependent amplitude in a phase modulation application.

It should also be noted that another way of achieving both amplitude and phase modulation is by means of a hologram. A planar or volume holographic optical element can provide spatial modulation of a beam or set of beams, either static modulation by using fixed materials or dynamic modulation by using real-time materials. Of course, interconnection functionality can also be incorporated into the same holographic optical element.

6. Holographic Recording Media

A wide variety of volume holographic recording media may be employed in the practice of the invention, including static (fixed) media such as photographic film, dichromated gelatin, layered thin film media, and certain photopolymers, as well as dynamic (real time) media such as photorefractive refractory oxide single crystals (e.g., bismuth silicon oxide, bismuth germanium oxide, bismuth titanium oxide, barium titanate, potassium tantalate niobate, strontium barium niobate, potassium niobate, lithium niobate, and lithium tantalate), photorefractive compound semiconductor single crystals (e.g., chromium-doped gallium arsenide, intrinsic (undoped) gallium arsenide, cadmium telluride, and iron-doped indium phosphide), photochromic glasses, and biologically-derived photosensitive molecules dispersed in various matrices.

In each case, it is desirable for purposes of scalability in the practice of the invention that such materials be configured so as to exhibit "thick" holographic grating characteristics, as defined by the well-known holographic parameter Q defined by $$Q = 2\pi \lambda d / n \Lambda^2$$

in which both $\lambda$ and d have been previously defined, n is the average (unmodulated) index of refraction of the holographic recording medium, and $\Lambda$ is the period of a given recorded grating. Thick holographic grating performance is usually observed when the recording configurational parameters are so chosen or constructed that $Q \geq 10$. For such values of Q, the Bragg width (angular response characteristics about the Bragg angle) given by $\Theta_B = \arcsin(\lambda/2\Lambda)$ can be made narrow enough to support a large number of independent gratings capable of reconstruction without interference, overlap, or interchannel crosstalk.

Although most "thick" volume holographic media investigated to date comprise a uniform photosensitive material, an additional type of volume holographic media is applicable for use in conjunction with the teachings of the invention. In these so-called stratified volume holographic optical elements (R. V. Johnson and A. R. Tanguay, Jr., "Stratified Volume Holographic Optical Elements", *Optics Letters*, Vol. 13, No. 3, pp. 189-191, 1988), thin layers of photosensitive material are separated by buffer layers of non-photosensitive materials to form a multilayer structure. Volume holographic optical elements can be formed in these stratified media by standard optical recording techniques; in particular, the optical recording apparatus and recording methods that are part of this invention can be used. Such stratified volume holographic optical elements exhibit a range of novel diffraction properties such as periodic peaks in the angular dependence of the diffraction efficiency, wavelength notch filtering, and spatial frequency notch filtering, in addition to the emulation of many essential features of thick volume holographic media.

Computer generated holograms comprise holographic modulation patterns that are calculated to achieve specific diffraction properties. Such computer generated holograms can be fabricated by optical recording (usually with a scanning laser beam) in thin photosensitive media supported by a substrate, by electron beam photolithographic techniques in electron-beam sensitive media, or by optical photolithographic techniques in conjunction with an appropriate mask containing the computer-generated pattern.

The concept of stratified volume holographic optical elements can be further extended to include multilayer computer generated holograms, in which a multilayer stack of appropriately designed computer generated holograms is assembled (with attention to careful alignment) to form a thick volume holographic medium with volume diffraction properties. In certain cases, it may prove advantageous to form a limiting case of a computer-generated stratified volume holographic optical element in which the buffer layers are eliminated entirely to form a contiguous multilayer structure.

B. NEURAL NETWORKS

1. Technical Approach.

The basic elements and functions of common neural networks are discussed above and shown in FIGS. 1–3. A neural network typically learns by changing its interconnection weights according to a learning technique, which is typically expressed as an update rule for the weights. After the network has learned, the values of the interconnection weights may not be known (and may be difficult to probe); only the correct performance of the overall neural network is verified.

A general neural network architecture should have the following features: (1) modularity, i.e., be in the form of a cascadable "module"; (2) capability for lateral, feedforward, and feedback interconnections; (3) analog weighted interconnections; (4) bipolar signals and weights; (5) scalability to large numbers of neuron units with high connectivity; (6) capability for single-step-copying of a learned (weighted) interconnection pattern; and (7) generalizability to different network models and learning algorithms, as well as capability for extension to possible future network models.

Recently, there has been a substantial amount of research and development on optical and optoelectronic implementations of neural networks; to the best of the inventors' knowledge, none of the optical or optoelectronic systems described to date by others have simultaneously demonstrated all of the foregoing features. The apparatus described in the parent application as well as herein, as applied to neural networks in the given embodiments, provides for essentially all of the above features.

This architecture utilizes the novel incoherent/coherent hologram recording and reconstruction apparatus of the invention, and has angular multiplexing at each input node, configured to produce angular multiplexing of the fan-in to a given output node. This provides for simultaneous read/write capability with reduced crosstalk and enhanced optical throughput. The use of this apparatus with multiplexed volume holograms permits scalability of the neural network and its interconnections. It also provides simultaneous updates of all weights at each iteration of learning. Since some learning techniques (e.g., multilayer supervised learning) can require an extremely large number of iterations for large networks, fast weight updating is crucial. In addition, since the copying apparatus described in an earlier section (above) can be used directly in neural network applications, rapid copying of all recorded weighted interconnections can be readily performed. Thus, duplicates of the weighted interconnections within a neural network that has learned a given processing function can be rapidly manufactured.

Optoelectronic spatial light modulators with hybrid or monolithically integrated detectors, modulators, and eleckronics at each pixel as described in the previous section are envisioned for the 2-D neuron unit arrays. These spatial light modulators provide for flexible functions within a single technology, thus enabling generalizability to different neural network models and learning algorithms. They also permit bipolar signals and synaptic weights to be integrated into the system architecture.

The use of photonic technology provides for high fan-in/fan-out capability via optics as well as parallel input/output for incorporation into larger heterogeneous or homogeneous systems without loss of system throughput, thus providing modularity. The photonic architectures comprising preferred embodiments of the present invention and its parent readily generalize to many neural network models (including single and multilayer, feedforward and recurrent networks) and learning algorithms (supervised and unsupervised), with applications to associative memory, combinatorial optimization, and pattern recognition, including vision and speech.

2. Interconnections.

For the purposes of the present discussion, consider the connections from a single neuron unit, including fan-out and synaptic weights, to be represented by a single hologram. During learning, all holograms are updated simultaneously in a photorefractive crystal or other suitable volume holographic recording medium. This is done by using one self-coherent beam pair for each recorded hologram, in the incoherent/coherent, angularly multiplexed fan-in apparatus and method described earlier (e.g., FIG. 6A). Referring to FIG. 6A, the set of reference beam intensities $x_j$ serves as the set of input signals to the neural interconnections, and the set of signals $A_j$ serves as the set of training signals during learning. The holograms are then reconstructed by the same set of reference beams, as shown in FIG. 6B. This results in the desired incoherent sum $\Sigma_j w_{ij} x_j$ at each pixel of the output array, in which $w_{ij}$ is the stored interconnection weight from neuron unit $j$ to neuron unit $i$.

Experimental results on writing and reading angularly multiplexed volume holograms using this incoherent/coherent process in silver halide and photorefractive bismuth silicon oxide media show minimal crosstalk at the same time as high optical throughput.

The advantages of this technique are as follows:

(1) All weights can be updated simultaneously. This obviates the need for sequential exposures which are inefficient as well as time consuming, and at the same time maximizes parallelism.

(2) Both the object beams and the reference beams are angularly multiplexed, and each training signal pixel as well as each output node corresponds to a set of angularly multiplexed beams. This latter feature alone is unique to the present invention and its parent. This angular multiplexing technique circumvents the problem of incoherent fan-in loss, maximizing optical throughput, providing incoherent pixel-by-pixel summation, and minimizing beam degeneracy crosstalk. (In addition, crosstalk due to accidental grating degeneracies is eliminated by optimization of the geometry of the beams, as well as by the spatial light modulator placement and pixelation; see, e.g., D. Psaltis et al, *Proc. SPIE*, Vol. 963, pp. 70–76 (1988).)

(3) As described above, this technique permits the capability of rapidly copying the entire collection of recorded interconnections and weights to another volume holographic medium by using this same incoherent/coherent reconstructing and recording technique. In addition to that described above, another advantage of this technique is the capability to refresh the interconnection periodically, by copying it back and forth between two or more holographic media; additionally, two parallel networks can be implemented to separate the learning function from the processing function. The architecture described in the parent application is unique to the best of the inventors' knowledge in allowing for this possibility.

In order to adaptively interconnect a large number ($10^4$ to $10^6$) of input elements to an equally large number of output elements with high connectivity and negligible crosstalk, the most attractive candidate technology is currently that of photorefractive volume holographic optical elements. For many (if not all) proposed optical implementations of neural networks, including that described herein, demonstration of appropriate degrees of reconfigurable multiplexing capacity with negligible or at least tolerable interconnection crosstalk is essential to the achievement of successful integration. The architecture proposed herein is uniquely designed to accentuate the strengths of currently available photorefractive materials (such as $Bi_{12}SiO_{20}$ and GaAs), while minimizing the inherent weaknesses. For example, the incorporation of a fully parallel weight-update scheme with mutual incoherence between pairs of sources results in a significant reduction in the degree of source-generated crosstalk characteristic of fully coherent recording schemes, while simultaneously obviating the need for sequential recording that is particularly cumbersome and time consuming in photorefractive media.

3. Learning Techniques

A broad class of learning techniques, both supervised and unsupervised, can be represented by the single weight update equation:

$$\Delta w_{ij} = \alpha \delta_i x_j - \beta w_{ij} \qquad (1)$$

in which $\Delta w_{ij} = w_{ij}(k+1) - w_{ij}(k)$ is the weight update, $x_j$ is the signal level of the $j^{th}$ input (e.g., $j^{th}$ neuron unit of the previous layer in a multilayer network), and $\delta_i$ is dependent on the particular learning technique. In Eqn. (1) above, $\alpha > 0$ is required and $\beta \geq 0$ is dictated by the physical constraints of the material (assuming no refreshing with gain greater than or equal to unity). The architectures described herein implement learning of the form of Eqn. (1). Specific examples include:

$\delta_i = y_i$ (Hebbian)

$\delta_i = t_i - p_i$ (Widrow-Hoff)

$\delta_{i,l-1} = f'(p_{i,l-1}) \Sigma_k \delta_{k,l} w_{ki}$ (Back propagation, all layers except output layer)

$\delta_{i,L} = (t_{i,L} - y_{i,L}) f'(p_{i,L})$ (Back propagation, output layer; least mean square (LMS), single layer)

in which $y_i$ denotes the output of neuron unit i in the current layer, $t_i$ is the target or desired value for the output of neuron unit i for supervised learning, $\delta_{i,l}$ is the error term of neuron unit i in the $l^{th}$ layer, and $f(p_{i,l})$ represents the neuron threshold function of the neuron potential $p_{i,l}$ of the $i^{th}$ neuron in the $l^{th}$ layer. The index L represents the output layer, and $\alpha$ and $\beta$ are constants. In particular, $\alpha$ is the learning gain constant and $\beta$ is the decay constant. The last term in Eqn. (1) is an optional decay term that is included primarily to model intentional or unintentional decay of gratings in a photorefractive crystal. Other important physical effects include nonlinearities in the response of the medium. For example, with appropriate encoding of data, the photorefractive material can yield a net response of $\Delta w_{ij} \propto sgn(\delta_i x_j)(|\delta_i x_j|)^{\frac{1}{2}}$, in which sgn(u) is equal to $+1$ if $u > 0$, $-1$ if $u < 0$, and 0 if $u = 0$. Simulations indicate that such a nonlinearity can actually improve the performance of the apparatus during learning. (Most other physical effects such as saturation and non-uniformities in the medium are considered primarily unintentional and can be treated or accounted for separately.) Thus, the implementation problem reduces to (1) implementing the weight updates given in the generic learning technique of Eqn. (1), and (2) generating the terms $\delta$ for the appropriate learning technique. The former is the more difficult task, and once it is accomplished, many learning techniques, the above comprising only a few examples, can be implemented.

4. Neuron Units and Weight Update Calculation

Two-dimensional optoelectronic spatial light modulator (SLM) arrays, with integrated detectors, modulators and electronics, as shown in FIG. 12, are envisioned for conventional inner product neuron units, as well as for generation of the $\delta_i$ terms. This technology provides: (1) incorporation of bipolar signals via two-channel inputs and outputs; (2) slight variants of the same basic SLM structure for all SLMs in the architecture (for neuron units and $\delta_i$ generation); (3) incorporation of different neuron unit functions, including linear, soft threshold, and hardclipping, as well as variable gain; and (4) potential extendability to future neural network models.

5. Architecture

The architecture for the case of Hebbian learning, $\delta_i = y_i$, where $y_i$ is the output of neuron unit i, is shown in FIG. 14. (Generalization to other learning techniques is given below.) Only feedforward connections are shown.

The two sets of recording beams 11 and 13 and the components therein are the same as described in FIG. 6A. Spatial light modulator means 32 ($x_j$) provides the inputs to the interconnections; the write input 70 of spatial light modulator means 32 ($x_j$) is the input to the neural network; alternatively, this input can be derived from the previous layer or module. The output (reconstructed) beams 10' reflect off mirror 72, and are imaged via lens 74 onto the write side of spatial light modulator 28, after reflecting from beamsplitter 76. Lens 74 in effect images the output of SLM 28 (virtual image), through the recording medium of volume holographic optical element 20, and onto the input of SLM 28. The combination of detector(s), control electronics, and modulator(s) that comprise SLM 28 is used to form the array of neuron outputs $y_i$, which are functionally dependent (e.g., by means of a threshold or sigmoid response) on the incoherent weighted sums of the form $\Sigma w_{ij} x_j$ summed over j.

Dove prism 78 serves to flip the beam so that the image orientation at SLM 28 is consistent. Then, the readout beam passing through SLM 28 has pointwise intensity proportional to $y_i$, the output of the neuron units as determined by the weighted interconnections in the layer or module depicted in FIG. 14. Output beams 110" are directed to a subsequent module or layer, or can be used to generate outputs of the neural network. Lateral and feedback interconnections are implemented by adding an optical path similar to that of the output beams 10', in this case by incorporating a beamsplitter behind holographic element 20, and reflecting a portion of the set of output beams 10' around the bottom of FIG. 14, to be imaged onto the input side of SLM 32. This provides lateral and feedback connections within holographic element 20. If fixed connections are desired (as is often the case for lateral connections), while maintaining adaptive feedforward connections, then instead a path is inserted from behind lens 36 (via a beamsplitter), through a separate hologram, and is imaged onto the input side of SLM 32. The same optical arrangement is also used when adaptive lateral and/or feedback connections that update by a different training technique than the feedforward connections are desired.

During the computation phase, the shutter 24 is closed to prevent learning. The array of sources is imaged onto SLM 32 as a set of read beams. Each beam is modulated by SLM 32 to provide the inputs. Then each (reference) beam $x_j$ passes through the holographic element 20 to provide the interconnections, i.e., the weighted fan-out from each input $x_j$. The hologram output is sent to the write side of SLM 28 via the lens 74, at which point the pointwise incoherent sums are detected, functionally transformed, and used as inputs to the modulator(s) within each individual pixel.

Figure 17:
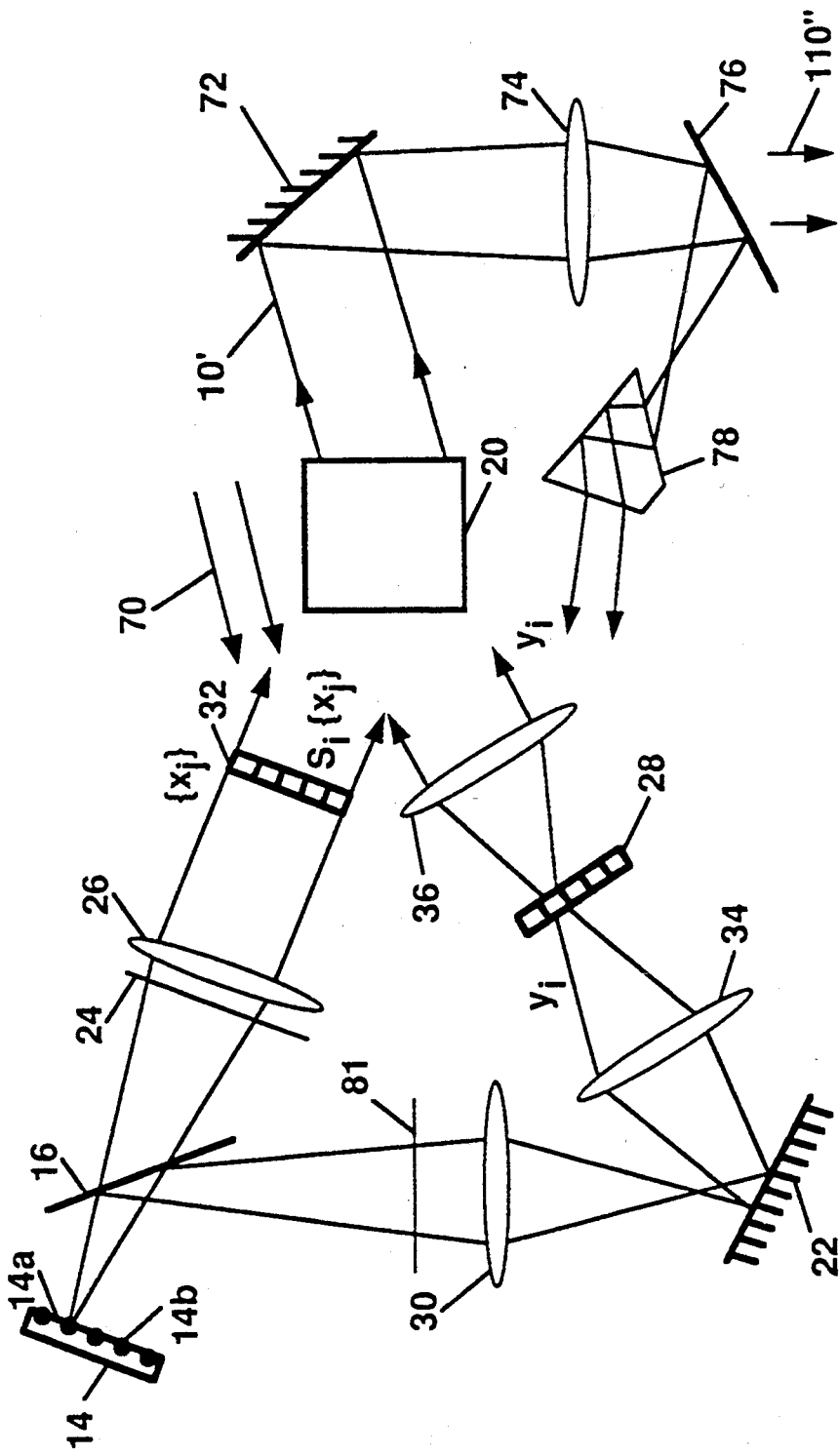
FIG. 17 is a schematic diagram of an alternative embodiment of apparatus for the implementation of neural network modules.

In a number of neural network applications that do not require real time adaptation, the holographic element may be fixed, obviating the need for recording capability. In such cases, an important variant of the apparatus shown in FIG. 14 can be configured by: eliminating beamsplitter 16, shutter 24, lens 26, spatial light modulator 28, lens 30, mirror 22, mirror 72, beamsplitter 76, and Dove prism 78; placing the source array 14 in the approximate location of mirror 22 and readjusting the position of lens 34 to image the source array onto spatial light modulator 32; and placing lens 74 in the output beams 10', adjusted to provide coincident 2-D arrays in the desired output plane (not shown). Such a readout only apparatus is functionally equivalent to the apparatus shown in FIG. 14 when the shutter 24 is closed, as described above, but has the advantages of simplicity and reduction in the number of required components. Additionally, for iterative (recurrent) neural networks, the output beams (10') are sent, reflecting off of a beamsplitter behind holographic element 20, around the bottom of FIG. 14 to be imaged onto the input side of SLM 32, as described above. Another example of such a feedback arrangement is shown in FIG. 17, described below.

Again with respect to FIG. 14, in the learning phase, the shutter 24 is open. The weight update term is computed optically (by the spatial modulation of the set of beams 11 by SLM 28 and by the pairwise interference of the object and reference beams) and recorded into the photorefractive material comprising holographic element 20. Light from each source is approximately collimated and used as a read beam for SLM 28. Thus, for an N by N array of sources, there are $N^2$ beams reading out SLM 28 simultaneously, each at a different angle; all $y_i$ terms are encoded onto each of these beams. Each of these beams interferes only with its corresponding reference beam, $x_j$, from the same source, in the photorefractive material of holographic element 20. This writes the set of desired weight update terms $\alpha x_j y_i$.

Figure 15:
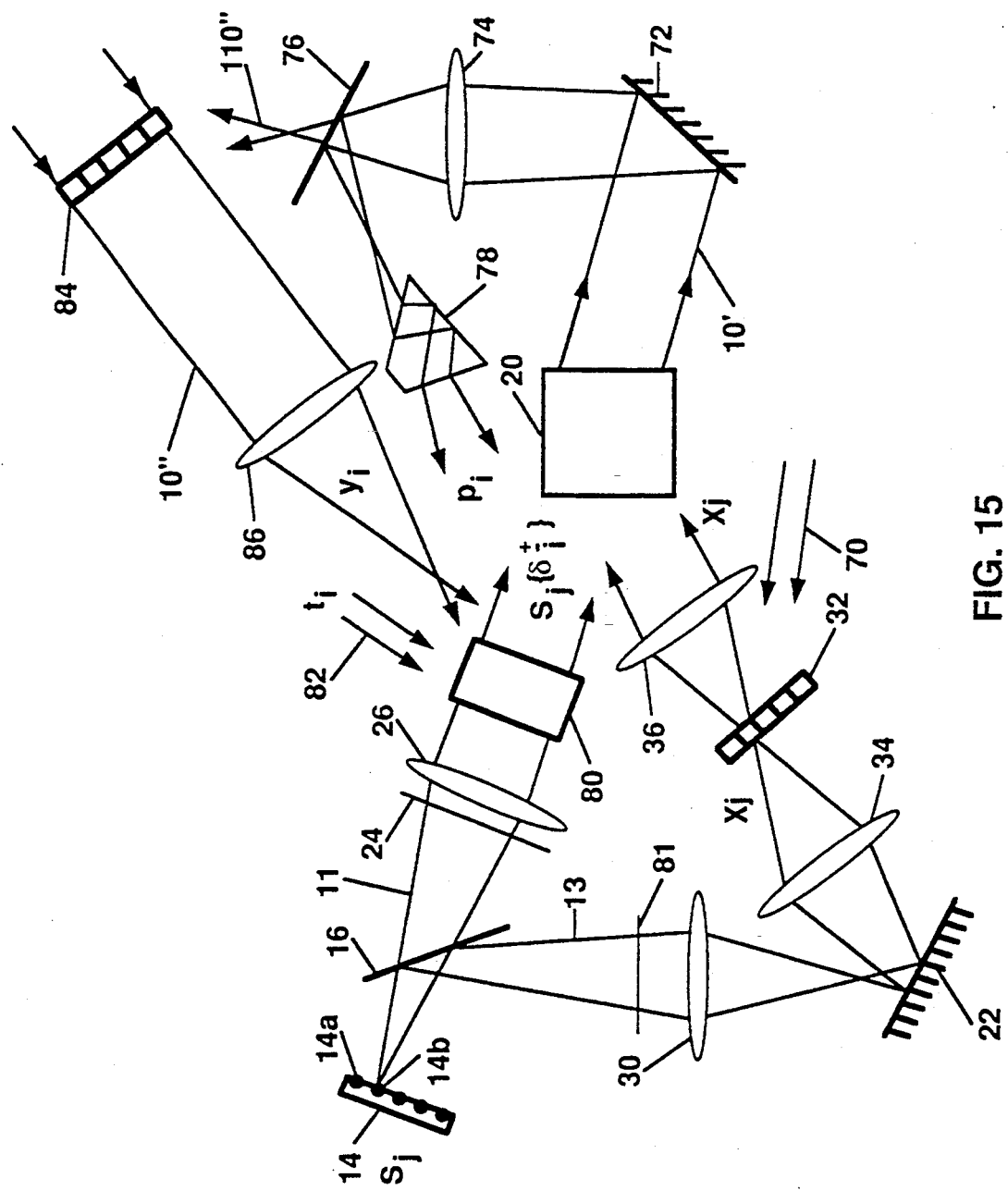
FIG. 15 is a schematic diagram of a preferred embodiment of apparatus for the implementation of neural network modules, for learning algorithms of the form $\Delta w_{ij} = \alpha x_i \delta_j$.

A generalized architecture for the implementation of neural networks is shown in FIG. 15. The paths and components for recording the holograms are the same as above, except for the training term generator 80 and an additional shutter 81 (needed for the implementation of certain neural network algorithms). The purpose of generator 80 is to optically generate the $\delta_i$ terms according to the learning technique being implemented. In general, there are as many as three different input signals to generator 80 (usually at most two of them are needed for a given learning technique). The input $t_i$ on beam 82 is a target or desired output signal for supervised learning, $y_i$ are outputs (and $p_i$ are the corresponding potentials) of neuron units at the output of the current module. Beams 110" write onto spatial light modulator 84 (in an image plane of the exit plane of generator 80); the SLM is then read out by beams 10" through lens 86 which images SLM 84 onto the appropriate SLM in the generator.

Means for implementing sample learning techniques (for generator 80) are shown in FIG. 16. These implement the well-known (A) Widrow-Hoff, (B) Perceptron, and (C) least mean square (LMS) learning techniques. All spatial light modulators have differential (positive and negative channel) inputs and dual channel outputs (both positive and negative). They all have nearly the same circuitry. Spatial light modulator 88 provides a linear difference of the inputs; spatial light modulator 90 has a higher gain with saturation to provide a binary response; spatial light modulator 92 provides a non-monotonic function (e.g., Gaussian) for the $f'(p_i)$ term. Spatial light modulator 32 in other Figures is the same as SLM 88, except for a soft thresholding characteristic provided by the control circuitry and output drivers in SLM 32. For the case of back propagation (LMS) in a hidden layer, the pair of signals $y_i$ and $t_i$ input to each pixel in (C) is replaced by the error term $\Sigma_k \delta_{k,l} w_{ki}$ from the previous layer. Each layer generates such error terms in the following manner. Beams 11 pass through the holographic element 20 and reconstruct additional output beams. These additional output beams contain the information $\Sigma_k \delta_{k,l-1} w_{ki}$ and are sent to modulator 88 of the previous layer. It should also be noted that an alternative arrangement can implement multilayer neural networks in a single module of FIG. 15, by directing the output signals 110" to the input of SLM 32, using optical feedback to enable multiple passes through different neuron units and through the same holographic element 20.

A variant of this architecture can be obtained by exchanging the spatial light modulators 28 and 32, as shown schematically in FIG. 17. (SLM 28 is again replaced by SLM 80 for the general case.) In this case, the upper SLM 32 in FIG. 17 represents the layer inputs $x_j$, while the lower SLM 28 represents $y_i$. The optical feedback is imaged onto the lower SLM 28. This provides for coherent fan-in at each neuron unit input. With intensity coding of data, this coherent sum deviates from neural models, but in some cases may provide an increase in diffraction efficiency to each neuron unit.

In the preferred embodiment, the object SLM 28 performs spatial (parallel) modulation of the object beams, while SLM 32 performs independent modulation of each reference beam. In the variant described above, SLM 32 performs spatial (parallel) modulation of each reference beam, while SLM 28 performs independent modulation of each object beam. In two additional configurations, both SLMs may perform spatial modulation, or both SLMs may perform independent modulation. Specific applications will dictate the particular choice of modulation.

An additional variant of this architecture can be obtained by utilizing the subhologram version described elsewhere above, in which a lens (not shown) following spatial light modulator 28 is adjusted to focus the two-dimensional Fourier transform of each of the beams transmitted through spatial light modulator 28 onto spatially separated regions at the entrance plane of holographic element 20. In addition, lens 36 following spatial light modulator 32 is adjusted to image the output side of spatial light modulator 32 onto the entrance plane of holographic element 20 in such a manner as to assure registry of the image so generated with the array of Fourier transforms just described. In this manner, each individual pixel $x_j$ is interconnected to the full set of pixels comprising spatial light modulator 28. As described previously, this configuration can yield high throughput with reduced coherent recording crosstalk in comparison with the full aperture version described above.

C. TELECOMMUNICATIONS

Photonic switching networks may be divided into two categories: (1) telecommunications switching and (2) interconnection networks for digital computing. The primary differences between these two categories are in the distance scale and the data bandwidth per channel required by the application; as a result, telecommunications data channels are typically carried on optical fibers and have many multiplexed data channels on each fiber, with wavelength division multiplexing being a common multiplexing technique. Interconnection networks for digital computing (1) may have data channels on optical fibers or on free-space optical beams, (2) can be much higher bandwidth per channel, and (3) usually do not multiplex more than a few channels on one optical signal line. Local area networks are in between these two realms, and are not discussed here, as once the two more extreme cases are illustrated, the middle ground is a straightforward extension.

In this section, embodiments of the invention are described for the application of telecommunication switching networks. It is assumed that the input and output optical signals are wavelength division multiplexed, although the embodiments are applicable to a broad range of channel multiplexing schemes. The embodiments described are directly applicable to circuit switching networks. In this case, it is important to distinguish between the control signals that are used to set the routes and state of the switch, and the (high bandwidth) data signals that are routed through the switch from an input or source node to an output or destination node. In addition, one physical input data transmission line (i.e., one optical fiber) is referred to herein as a data line, and each individual information channel as a data channel. Thus, many data channels, each at a different optical wavelength, are multiplexed onto one data line. An array of data lines is input to and output from the optical switch.

Photonic switching networks should have the following properties: (1) high bandwidth for the data signals, (2) compatible physical interface(s) to the optical input and output lines, (3) compatibility with multiplexing schemes utilized for the input and output lines (usually by demultiplexing the input signals and re-multiplexing the output signals), (4) capability for implementing a large number of input and output lines in a relatively compact package, (5) packet and/or circuit switched control, (6) reconfigurability at a low-to-moderate rate (for circuit switched networks) or at a high rate (for packet switched networks), and (7) ability to re-route some data signals while other data channels are being used. In addition, it is desirable to have the capability for broadcast (fan-out) of a data channel in some applications, as well as fan-out and fan-in of a physical data line.

Figure 18:
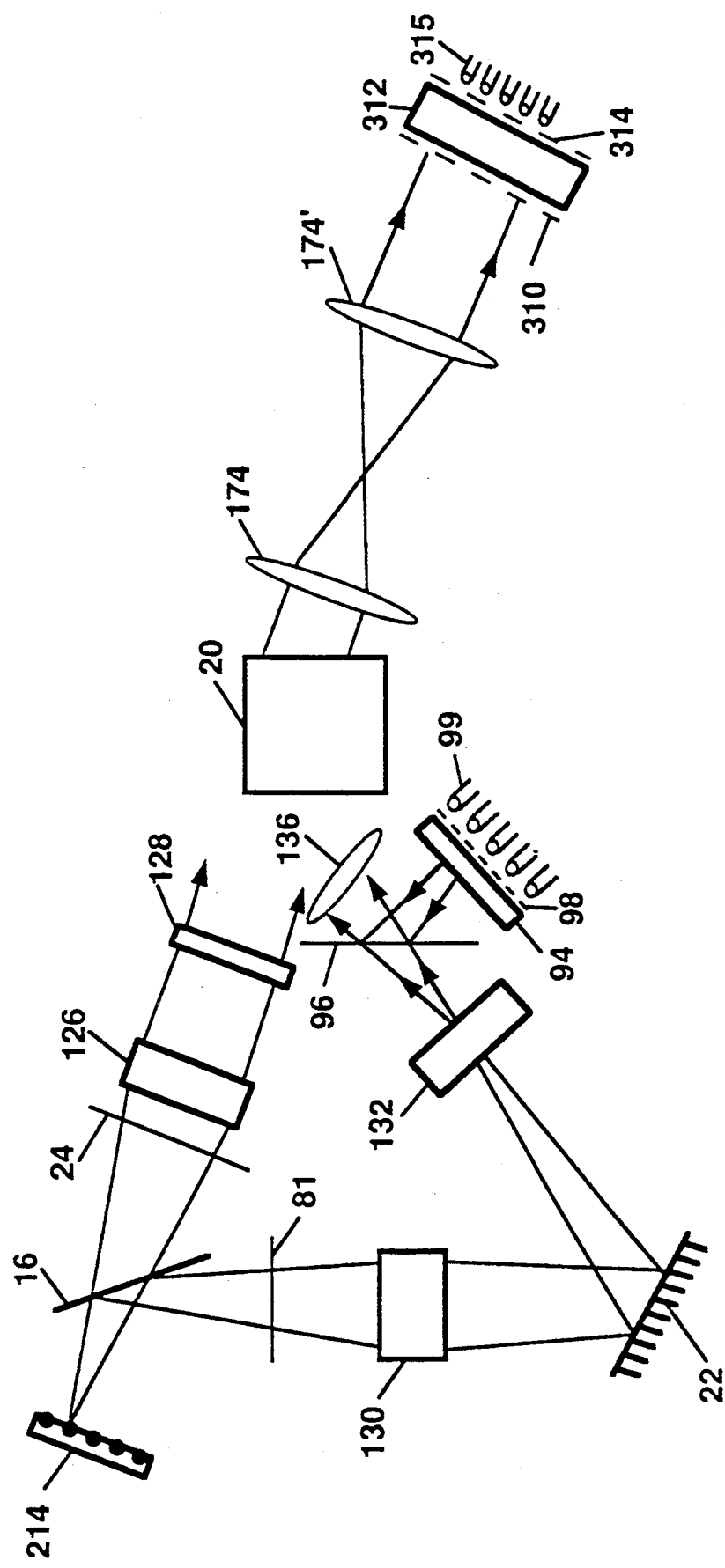
FIG. 18 is a schematic diagram of apparatus for switching from a set of wavelength division multiplexed optical input lines to a set of wavelength division multiplexed optical output lines, wherein the source array and two spatial light modulators are used to control the routing of the switch.

The first described embodiment will accommodate a 1-D array of wavelength division multiplexed (WDM) inputs and a 1-D array of WDM outputs. The apparatus is shown in FIG. 18. A source array means is provided at 214; this consists of a two-dimensional array of sources, each at a different center optical frequency $v_j$ along one dimension (e.g., row), with each individual source along the other dimension (e.g., column), all at essentially the same center frequency, but arranged so as to be mutually incoherent, as in previously discussed embodiments. Each center frequency $v_j$ corresponds to the center frequency of one optical data channel. Two means for providing this array are described below. This source array provides illumination for the control signals. The set of optical beams from 214 are split by beamsplitter 16. The reference beams are reflected from beamsplitter 16, pass though shutter 81, through optical means 130 and are additionally reflected from reflecting means 22. The optics 130 are anamorphic and serve to condense the dimension of different center frequencies $v_j$ to a single pixel at source control means 132, while imaging the dimension of mutually incoherent sources centered at $v_j$ from 214 to source control means 132. At source control 132, means are provided for modulating each pixel independently, and for making the phase fronts leaving 132 substantially identical to the phase fronts leaving wavelength demultiplexer 94. If the modulator in the source control means 132 has a high enough contrast ratio and turns off sufficiently well, then shutter 81 is not needed. The beams leaving source control 132 are made to pass through beamsplitter 96 and optical means 136 that very approximately collimates the beams. In the case of focal lengths and distances being appropriately chosen, optical means 136 can be omitted. The beams are then incident on volume holographic element 20. The source array as modified and passed through source control 132 provides the set of reference beam illumination signals for the holographic recording process. The other set of beams from source array 214 passes through beamsplitter 16, shutter 24, optical means 126, and destination control 128 which consists of a spatial light modulator that serves to input the routing function. The beams are then incident on the recording medium of holographic element 20. Optical means 126 are anamorphic and serve to image the beam in the dimension of the different optical center frequencies $v_j$ from the source array 214 to the modulator 128. In the dimension of mutually incoherent sources centered at $v_j$, optical means 126 serves to direct the beam from each source through all corresponding pixels of modulator 128 in the corresponding 1-D dimension (e.g., column). This completes the control signal portion of the apparatus.

A set of switch states can be loaded into the holographic optical element by any of three techniques: (1) sequencing through the one-dimensional array of pixels in source control 132 one at a time, interfering each with appropriate destination control signals from modulator 128 (thus recording control signals for all wavelengths of a given input line in one step); (2) sequencing through a set of updates given by the interference of many pixels in source control 132 with pixels in modulator 128, similar to the neural network case described above; or (3) a compromise between these two extreme cases. A potential advantage of (2) is a decrease in the number of sequences required in certain cases.

The data signals input to the switch and arranged in plane 98 (e.g., from optical fibers), are sent through an optical wavelength demultiplexer 94 (e.g., a grating), reflect off beamsplitter 96 and follow a substantially identical path from beamsplitter 96 to holographic element 20. The exit plane of demultiplexer 94 is in a conjugate (image) plane of the exit plane of source control 132. When the two sets of control beams from source array 214 are blocked (via shutters or modulator means in source control 132 and modulator 128), only the data signals pass through the holographic element. After diffracting from the recorded interference patterns within holographic element 20, the output data signal beam passes through optical means 174 and 174' to plane 310, which is an image plane of the modulator 128. Then, fiber interface unit 312, which consists of optics and an optical wavelength multiplexer, multiplexes all wavelengths along the optical center frequency $\nu_j$ dimension, in order to yield the one-dimensional wavelength division multiplexed output at data output plane 314. An optical fiber array, for example, can be arranged following output plane 314 to receive the re-routed and remultiplexed data signals from the data inputs arranged at plane 98; these routing and multiplexing functions can include channel broadcast, line broadcast, and line fan-in functions.

Once established, the routes through the switch can be changed all at once by erasing the holographic recording material and then recording the new interconnection pattern. Individual routes can selectively be changed by either of two techniques: (1) not refreshing the old routes to be changed, which will then decay in time, and refreshing the new routes; or (2) erasing specific gratings using binary phase modulation in 128 and 132; such phase modulation to selectively erase gratings has been previously demonstrated; see, e.g., A. Marrakchi, *Optics Letters*, Vol. 14, No. 6, pp. 326–328 (15 Mar. 1989).

Two alternative means for providing the source array 214 are described herein. In FIG. 19A, a two-dimensional array of sources 316 is shown, in which the center optical frequency is varied along dimension 318, and the mutual incoherence of the sources with essentially the same center frequency is provided along dimension 320. This can be accomplished, for example, by providing an array that is designed to implement the wavelength variation in one dimension of the array, with typical processing-induced stochastic variation providing the required mutual incoherence in the second dimension. This array can then be used directly in source array distribution plane 214.

Figure 19B:
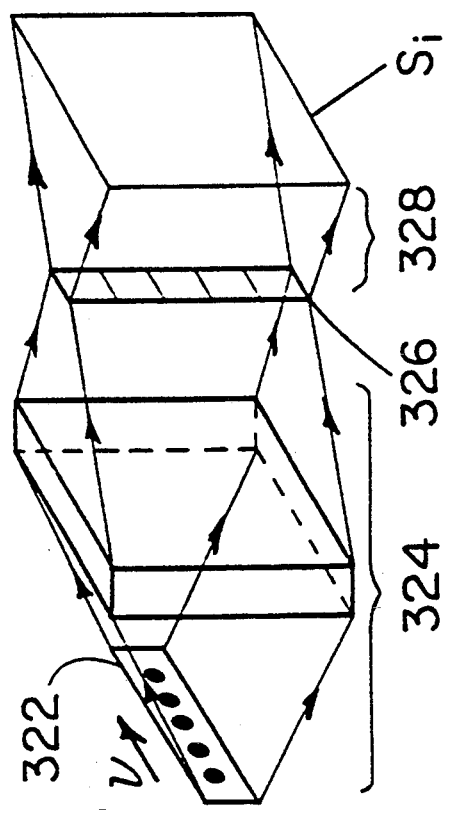
FIG. 19B is a schematic diagram of an alternative embodiment utilizing a one-dimensional source array, with center frequency of each element being different, and a one-dimensional phase modulator array providing mutual incoherence.
Figure 19A:
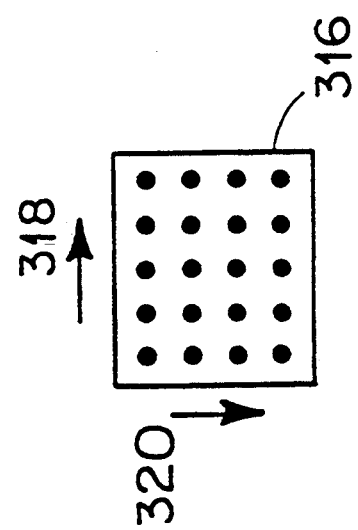

Another means for providing the source array distribution 214 is shown in FIG. 19B. In this case, two one-dimensional arrays are used. Element 322 is a one dimensional array of sources, e.g. laser diodes, each with a different optical center frequency $\nu_j$, and can be fabricated as a one-dimensional version of source array 316. Optics 324 expands the beams in the dimension perpendicular to 322, and condenses in the dimension of source array 322 before passing through one-dimensional phase modulator 326. Each pixel of modulator 326 provides phase modulation at a different frequency, and can be fabricated as a one-dimensional version of the pixelated piezoelectric mirror or pure phase modulator array described previously in Section A2. Optical means 328 then expands the result in the orthogonal dimension, thereby producing a two-dimensional array, which can then be used as the input source array 214. The optical means 324 and 328 in FIG. 19B are essentially the same as those of an analog optical outer product matrix processor (R. A. Athale, *Proceedings of the Tenth International Optical Computing Conference*, IEEE Catalog No. 83CH1880-4 pp. 24–31, April 1983). It will be noted that in this case, the beamsplitter 16 can be inserted before the plane $S_i$ (but after phase modulator 326); this will make the overall system more compact.

Referring now to the case of two-dimensional WDM data input lines and two-dimensional WDM data output lines, the apparatus is again shown in FIG. 18, but the following components have different functions than those described for the case of one-dimensional data signals. The source array 214 is a two-dimensional array, each element of which has a different frequency modulation imposed on it in order to produce mutual incoherence among all the source elements; each element of the source array 214 contains beams of all center frequencies $\nu_j$, which correspond to the center frequencies of each data signal channel. Means for providing this are described below. In the case of applications that do not require data channels to fan in and do not require output data channels to be angularly multiplexed, the mutual incoherence is not required; only means for amplitude modulating individual elements are required. Optical means 130 now image from source array 214 to the modulator plane in source control 132. The source control 132 consists of both an optical wavelength demultiplexer and a two-dimensional modulator. Optical means 136 again very approximately collimates the beams. Optical means 126 directs the light from each pixel of source array 214 through every pixel of the modulator in destination control 128. The destination control 128 now includes an optical demultiplexer (e.g., grating). The data inputs at plane 98 are now arranged in a two-dimensional array, as are the data outputs at plane 314. Optical means 312 is now simpler than that required for the previously discussed embodiment, as all of the reconstructed pixels are imaged by holographic element 20 and optical means 174, 174' onto the correct locations for output at plane 310.

In a number of telecommunication switching applications that do not require real time reconfiguration capability, the holographic element may be fixed, obviating the need for recording capability. In such cases, an important variant of the apparatus shown in FIG. 18 can be configured to eliminate beamsplitter 16, shutters 24 and 81, optical means 126, destination control 128, and mirror 22 by placing the source array 14 in the approximate location of mirror 22, and placing optical means 130 between the source array and spatial light modulator 132 in such a way as to image the source array onto spatial light modulator 132. Such a readout only apparatus is functionally equivalent to the apparatus shown in FIG. 18 when shutter 24 is closed and shutter 81 is open, as described above, but has the advantages of simplicity and reduction in the number of required components.

Figure 20:
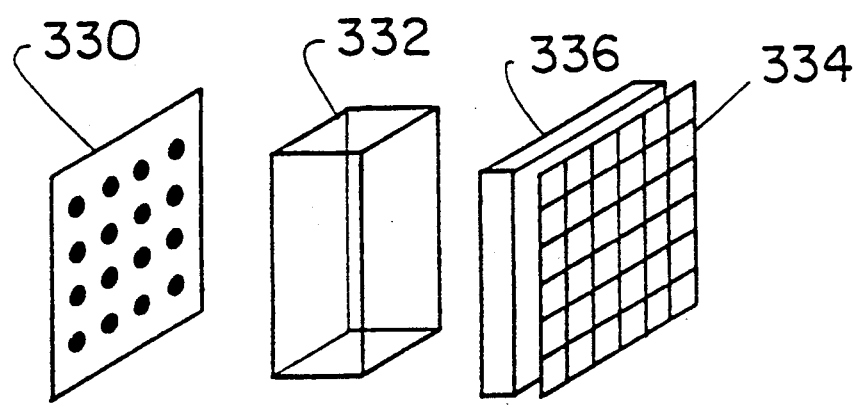
FIG. 20 is a schematic diagram of means for providing the source array of FIG. 18 in the case of a 2-D WDM input line array and a 2-D WDM output line array, showing a 2-D laser diode array each element of which has a different center frequency, and a modulator array.

Means for providing the source array signals are shown in FIG. 20. A two-dimensional source array (e.g., surface emitting laser diodes) 330 provides an array of sources, each at a different center frequency $\nu_j$. Optical means 332 directs the light from each source element to all pixels of the two-dimensional modulator array 334. Each pixel of modulator array 334 provides phase modulation at a different frequency, and can be fabricated as the pixelated piezoelectric mirror or pure phase modulator array described in Section A2. Modulator array 334 then provides the optical signals of plane 214 as depicted in FIG. 18. As discussed above, in the common case of applications that do not require data channels to fan in and do not require output data channels to be angularly multiplexed, the mutual incoherence is not required. In this case, modulator array 334 provides the requisite amplitude modulation. Furthermore, in most such applications, binary amplitude modulation is sufficient. If optical means 332 is provided by simple (non-multiplexed) elements, such as a simple beam expander (e.g., lens), then an optical wavelength multiplexer 336 (e.g., set of gratings) is incorporated as shown. Its function is to fan in the beams of different center frequencies to be collinear at each pixel.

Finally, it should be noted that by more precisely collimating the beams at the holographic element 20 and by choosing center frequencies $v_j$ appropriately, the apparatus described above can be extended to a two-color system in which the data signals read out the stored holographic interconnections non-destructively. In this case, the geometry and scaling of the optical data paths are changed relative to those of the optical control signal paths.

D. DIGITAL COMPUTING

For the application of digital computing interconnections, it is assumed that the inputs and outputs are not wavelength division multiplexed, such WDM cases having previously been discussed above. Further, they can be input to, and output from, the interconnection network in the form of optical fibers or as free space beams that are imaged from one plane to another.

In the case of optical fibers, a photonic system for a crossbar interconnection network can be explained using FIG. 18, in which the following components are interpreted differently than in the telecommunications application previously described. The data inputs and outputs are arranged in 2-D arrays. The source array 214 is a 2-D array of individually coherent but mutually incoherent sources, as described above. Here they all have the same center wavelength. The remaining components in FIG. 18 are the same as in the telecommunications switching apparatus, for the case of 2-D data input and output arrays, with the exceptions detailed herein. Since the input and output data are not wavelength multiplexed, the wavelength multiplexers and demultiplexers in wavelength demultiplexer 94, destination control 128, and output fiber interface unit 312 are not needed. The output fiber interface unit 312 comprises only the optical element(s) needed to couple the light into each fiber.

The control procedure for recording the interconnections is the same as in the telecommunications embodiment above, except that there is no wavelength dimension. Control can again be accomplished by making a recording for each single pixel of SLM 132, interfering with light from all destination control pixels of SLM 128. Alternatively, all pixels of both SLMs can be used during each recording cycle, in effect summing over a set of matrices of rank one to build up an interconnection pattern, similar to the neural case.

In a number of digital computing applications that do not require real time reconfiguration capability, the holographic element may be fixed, obviating the need for recording capability. In such cases, an important variant of the apparatus shown in FIG. 18 can be configured to eliminate a number of components, as described above for the case of telecommunications switching. Such a readout only apparatus is functionally equivalent to the apparatus shown in FIG. 18 when shutter 24 is closed and shutter 81 is open, but has the advantages of simplicity and reduction in the number of required components.

An extension of this apparatus utilizing the copying technique described herein enables faster computing. Two volume holographic recording media are employed. The primary holographic medium is used for the actual computation, and a secondary holographic medium is used to record the set of interconnection patterns from the control inputs. When the recording of a set of new interconnection patterns into the secondary medium is completed, it is copied into the primary medium in a single step. In this way, computation is being performed while the next set of interconnections is being configured. While recording of a new interconnection configuration can take some time, the copying can take place in one step. This minimizes the net reconfiguration time of the switch.

The same apparatus can be used for free space data inputs and outputs, by removing interface unit 312. Note that this is in effect a generalized crossbar, in that it not only allows arbitrary 1-to-1 interconnection, but also enables fan-out and fan-in. In addition, a two-wavelength system can be employed, as in the two-color telecommunication application, by changing the scaling and geometry of the optical data paths relative to the optical control signal paths. This enables non-destructive readout.

E. HOLOGRAPHIC OPTICAL ELEMENTS

As described throughout the present application, volume holographic optical elements can be employed in a large number of interconnection and memory applications. Of particular concern to the present application are those volume holographic optical elements that are either recorded by (or can be recorded by) the incoherent/coherent double angularly multiplexed techniques described in this application and its parent application, or incorporate computer generated holograms that emulate the functionality of such elements in that they can be used directly in at least one of the architectures described herein.

This specific class of novel volume holographic optical elements is characterized by a number of distinctive features, as might be anticipated from the novel incoherent/coherent double angularly multiplexed recording technique itself. In particular, the holographic modulation pattern that is recorded (or in certain cases, computer generated) within the volume holographic optical element comprises a multiplexed set of individual modulation pattern components.

For the specific case of an optically recorded holographic modulation pattern, each individual modulation pattern component comprises the holographic interference pattern generated by a single source element within the individually coherent, mutually incoherent source array (e.g., source array 14 in FIGS. 4, 5, 6A, 6B, 7, 14, 15, 17, 21, and 22; source array 214 in FIG. 18, source array 316 in FIG. 19A, source array 322 in FIG. 19B, and source array 330 in FIG. 20).

We further distinguish between two recording scenarios within this case of an optically recorded holographic modulation pattern. For the scenario of simultaneous (single-exposure) recording of a multiplexed holographic element using a set of sources, the resulting multiplexed holographic modulation pattern comprises a holographic record of the set of mutually incoherent optical interference patterns, one such interference pattern deriving from each source. For the scenario of sequential (multiple-exposure) recording of a multiplexed holographic element using only one source at a time, each component of the resulting multiplexed holographic modulation pattern comprises a holographic record of the interference pattern resulting from each source. In an ideal holographic material, the resulting multiplexed holographic elements in the two cases would be identical. In physically realizable holographic materials, the resulting holographic elements will differ due to effects such as history-dependent material sensitivity, partial erasure, and nonlinearities in the material response and in the recording and reconstruction processes.

For the specific case of computer generated holograms, each individual modulation pattern component (whose modulation pattern is calculated by computer) is configured to function within at least one of the architectures described in this application or in the parent application in such a manner as to emulate the performance characteristics of the optically recorded modulation patterns described above. In some cases, it may prove advantageous to further optimize the aggregate computer generated hologram comprising the multiplexed set of individual modulation pattern components against one or more specific performance metrics (such as throughput or crosstalk minimization).

These individual modulation pattern components, insofar as they are derived from and function within the incoherent/coherent double angularly multiplexed nature of the architectures described in the present and parent applications, exhibit specific characteristics that are unique to the best of the inventors' knowledge when taken in the aggregate. When illuminated by the associated reference beams (derived from the set of individual sources described above within the source array for the case of the recording and readout configurations, and from the corresponding set of sources within the source array for the case of the readout only configurations), diffraction from the multiplexed set (or any subset thereof) of individual modulation pattern components generates a set of reconstructed beams such that:

(i) the reconstructed beams emanate from the holographic medium in such a manner as to be at least partially angularly multiplexed;

(ii) each individual reconstructed beam is encoded with a spatial array of pixels that comprise a real or virtual image at some plane in space; and (iii) the set of images encoded on the set of reconstructed beams can be made to be substantially coincident in a common plane in space with appropriate optical means.

It should be noted that information can be physically represented in each such spatial array of pixels as field amplitude, phase, or a combination of both. In the case of both amplitude and phase representation, each individual modulation pattern component can be a holographic record of the interference pattern of a 3-D object.

As described above, in reference to FIGS. 4, 5, 6A, and 6B, and in reference to the master holographic element in the copying apparatus, the simultaneous spatial modulation of angularly multiplexed mutually incoherent beams (as depicted in FIGS. 6A, 6B, 14, 15, 17, 18, and 21) enables an imaging system to superimpose the beams emanating from the resulting holographic element at some plane in space. This in turn enables a pixel-by-pixel incoherent summation to be performed in such a plane by means of an appropriate two-dimensional detector array. More conventional volume holographic element multiplexing techniques do not provide for angular multiplexing of the object beams simultaneously with this coincident-array imaging capability.

A wide variety of additional types of holographic optical elements (HOEs) are used in optical systems and may include such elements as multi-focal length lenses, specific combinations of wavelength dispersive and wavefront-modifying optical elements, and for purposes here, also holographic elements for display. Examples include, but are not limited to, head-up displays (HUDs), dichroic beamsplitters, aberration-corrected lenses, multi-function beamsplitters, multiple focal length lenses, and space-variant optical elements.

Advantages of HOEs over conventional optical elements include reduced size, weight, and cost; additionally, in some cases, there are no practical alternatives to certain HOEs. Furthermore, if the HOE can be rapidly copied, then a large savings in production cost can be achieved.

A volume holographic optical element can store a large amount of information; the process of recording all of the needed information into the volume can be a significant bottleneck in both initial development and production. In the present application, three realms are discussed: (1) that of recording complex fringe patterns in the holographic recording medium that correspond to combinations of optical elements, so that the phase fronts can be generated relatively easily and recorded relatively quickly; (2) a computer aided approach in which a series of exposures is cycled through in order to build up the requisite interference fringe pattern in the holographic recording medium; and (3) a computer generated hologram approach in which the functional performance characteristics of the holographic optical element are used to calculate corresponding individual modulation pattern components that can be incorporated into planar, contiguous multilayer or stratified multilayer volume holographic media by photolithographic, electron beam lithographic, or other similar techniques.

In the second case, the input patterns used for each exposure are generally calculated by computer or neural network. However, if the input patterns are known a priori, and a suitable input device is available, no computations of the fringe pattern need be made. An example of this is a multiplexed holographic display in which each hologram to be displayed consists of a page of information.

Figure 21:
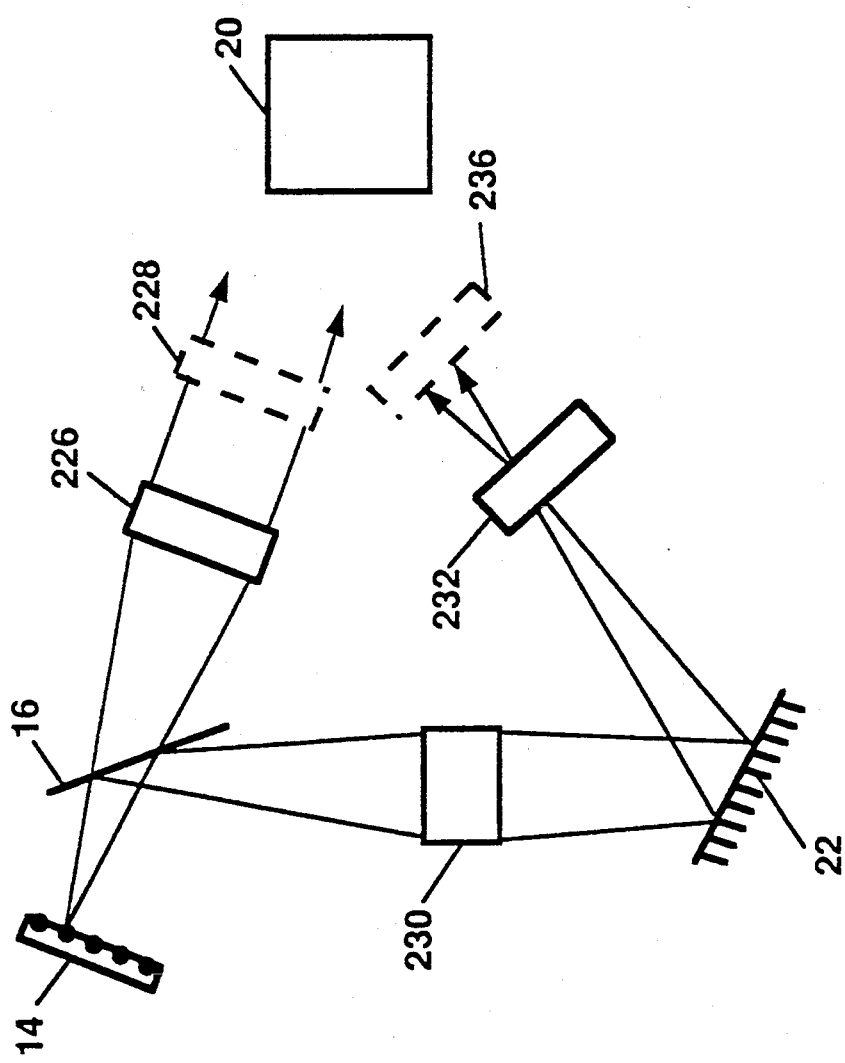
FIG. 21 is a schematic diagram of method and apparatus for recording of multiplexed volume holographic optical elements, with one set of beams modulated independently and the other set of beams modulated spatially but identically.

An example of the first case is depicted in FIG. 21. Two types of HOEs are discussed herein that can be generated from this apparatus. First, consider a HOE that functions as a space-variant lens, focusing incident plane waves at different distances z, the distance depending on the incident angle of the plane wave. The array of sources 14 generates a set of coherent but mutually incoherent beams, which are split into two paths. The upper path carries the reference beams in this case; they are transmitted by beamsplitter 16 and pass through optical means 226 to holographic element 20. The spatial light modulator 228 is not needed for the exposure of this particular HOE. Optical means 226 essentially collimates each beam. For response to other than collimated beams, optical means 226 can be changed to provide the appropriate focal power. The lower path functions to carry the set of object beams.

After reflecting from beamsplitter 16, optical means 230 approximately images the source array 14 onto each pixel of modulator 232. In this case, modulator 232 is a static or dynamic planar microlens array. This array provides a different and programmable focal power for each source beam. Optical means 236 is used to convert the spherically expanding waves to spherically contracting waves, and to provide relay optics when needed.

Upon reconstruction, plane waves incident on the holographic element at the angles of the upper beam paths utilized during recording are converted to spherically contracting waves of different focal lengths, thus providing a highly multiplexed lens with space-variant focal length.

Figure 22:
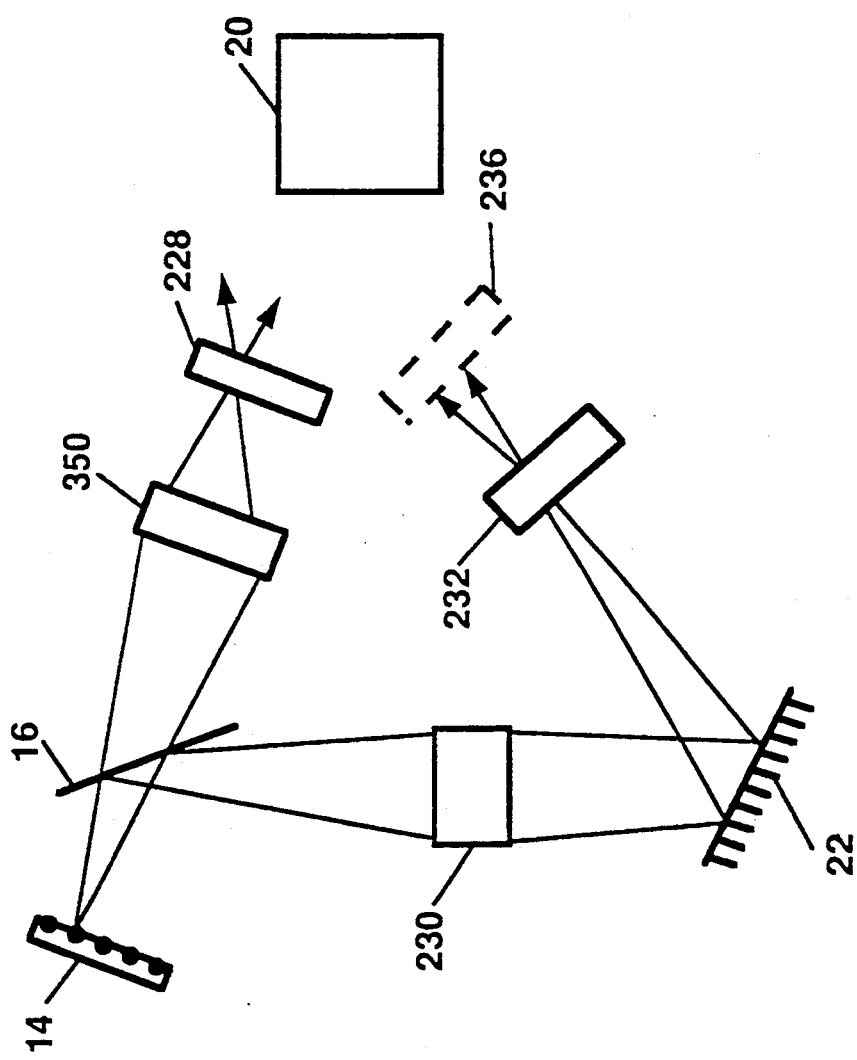
FIG. 22 is a schematic diagram of method and apparatus for recording of multiplexed volume holographic optical elements, with both sets of beams (reference and object) modulated independently.

In order to generate a space-variant lens capable of converting spherically expanding waves to spherically contracting waves, the apparatus of FIG. 22 can be used. It is the same as the apparatus of FIG. 21, except that in this case, the upper path passes through optical means 350, which approximately images the source array onto the modulator 228. Means are provided by modulator 228 to modulate each imaged element of the source array in focal power (e.g., by means of a dynamic microlens array) to produce the desired space variant focal length HOE. Certain other applications require modulator 228 to modulate phase, or amplitude and phase, instead of focal power.

Another mode of recording permits a larger fraction of the aperture of holographic element 20 to be utilized for each point-spread function response of a space-variant HOE; it uses the apparatus of FIG. 21. This mode can be utilized to record essentially arbitrary phase fronts that have values at each pixel between 0 and $2\pi$. An example of such an optical element is a multiplexed HOE that stores Fresnel lenses of several different focal lengths; note that this can include spherical Fresnel lenses as well as anamorphic Fresnel-type lenses, and other even less symmetric phase fronts. In this mode, the upper path carries the object beams and the lower path carries the reference beams.

The modulator 228 is a spatial light modulator that modulates phase at each pixel; modulator 232 is an amplitude spatial light modulator and is used to set the diffraction efficiencies of each recorded hologram. Optical means 236 is configured to produce a set of multiplexed reference beams that are substantially identical to the anticipated collection of reference beams to be utilized during reconstruction. During exposure, in one embodiment the individual sources in source array 14 are turned on one at a time, and the desired object pattern is written onto modulator 228 for each source. If the same pattern at modulator 228 is to be used for multiple sources (i.e., to record multiple holograms), then those sources pertaining to a common object pattern can be turned on simultaneously, reducing the requisite number of recording steps. Depending on the application, this can result in considerable or even dramatic savings in recording time. In the fully sequential case, the described apparatus utilizing the two-dimensional source array still has the advantage of permitting recording of the entire multiplexed HOE without any moving parts.

For reconstruction, the HOE is illuminated with reference beams substantially identical to those used during exposure, except that they may be independently and arbitrarily amplitude modulated. The output beams then give the desired phase front patterns according to the object patterns that were recorded. This provides a space-variant HOE in which the point-spread function response can be chosen essentially independently for each pixel of an input array. For applications requiring space-invariance over small local regions of the input plane, the same object pattern can be recorded for reference beams corresponding to neighboring pixels in the input array, or alternatively, the hologram thickness is chosen appropriately and fewer recording beams are used, yielding space-invariance within the Bragg angle of a particular hologram.

According to the teachings of the invention, it will be appreciated that several additional methods of multiplexing can be utilized to advantage during the recording of holographic optical elements, including angular, spatial, and/or wavelength multiplexing of both the object and reference beams.

It will also be noted that for certain appropriate applications, the upper path of the apparatus may be interpreted as carrying the reference beams, and the lower path may be interpreted as carrying the object beams. Then, during reconstruction, when beams of appropriate phase fronts are incident on the holographic medium, the output beams reconstruct spots in an image plane of optical means 232. Each reconstructed spot then has a value proportional to the similarity of the incident wavefront to one of a set of stored basis function wavefronts. (These basis function wavefronts are dependent both on the input patterns and on the angle of each such reference beam during recording.) Appropriate applications include, but are not limited to, associative memory, optical correlation, optical pattern recognition, and optical feature extraction.

Finally, consider the case of a sequence of exposures, in which the desired object patterns are not input directly, but rather are designed such that the resultant recorded holographic fringe pattern, at the termination of the exposure sequence, produces upon reconstruction the desired output functions. In this case, it is in general desirable to modulate both the phase and amplitude of the incident beams, which can be implemented with a spatial light modulator characterized by independent control over both amplitude and phase in each individual pixel, as described above; however, it should be noted that a large class of patterns can be recorded with either phase modulation only, or with amplitude modulation only. In this operational mode, the designed set of object patterns can be produced either by computer aided design techniques (for cases in which the desired holographic recording pattern is either known or can be computed with reasonable resources), or by a neural-like learning rule in which a sequence of weight updates are produced in response to a set of training patterns. In the latter case, supervised learning algorithms are exploited when desired output patterns can be represented, and unsupervised learning algorithms are exploited otherwise. The neural technique permits the HOE to converge to an approximate version of the desired HOE, without knowledge of the stored fringe pattern within the holographic medium.

F. OPTICAL INFORMATION PROCESSING

A wide variety of applications to optical information processing can be envisioned that are based on the novel features of the incoherent/coherent double angularly multiplexed architectures described in the present and parent applications, as well as on the novel features of the volume holographic optical elements derived therefrom. These applications include, but are not limited to, multidimensional correlations (see, for example, E. G. Paek et al, "Compact and Robust Incoherent Holographic Correlator Using a Surface-Emitting Laser-Diode Array", *Optics Letters*, Vol. 16, No. 12, pp. 937-939, 1991) and convolutions (including both time-integrating and space-integrating configurations), pattern recognition, feature extraction, image processing, synthetic aperture radar image formation, implementation of nonlinear transformations, cryptography, optically controlled phased array radar, holographic nondestructive testing, and medical diagnostic applications such as computer-aided tomography and image segmentation.

Common to many of these applications is the need for implementation of an arbitrary space-variant point spread function across a two-dimensional input or output image field. A key advantage of the incorporation of the teachings of this invention in such optical image processing applications is the capability for incorporating just such an arbitrary space-variant point spread function in a volume holographic optical element with overall high optical efficiency and low interchannel crosstalk among the various arbitrary space-variant point spread function components. The basic principle involved is a straightforward extension of the incoherent/coherent double angularly multiplexed architecture shown schematically in FIGS. 6A and 6B, in which each pixel in spatial light modulator 32 can be interconnected with an arbitrary distribution of pixels in spatial light modulator 28 by, for example, sequential recording. At each step of the sequence, the distribution of pixel transmittances in spatial light modulator 28 establish the point spread function with the corresponding individual pixel in spatial light modulator 32. Other methods of generating the desired point spread functions can include neural network training sequences, in which the optimal point spread functions are not known a priori and are instead derived from the aggregate of the training experience.

In addition to the capability for implementation of arbitrary space-variant point spread functions in conjunction with high throughput efficiency and low interchannel crosstalk, several other key advantages accrue to the utilization of the teachings of the invention in optical information processing applications. These advantages include the superposition of multiple images in the output plane, which in turn allows for efficient use to be made of the space-bandwidth product of a two-dimensional detector array (with a fixed number of pixels); the utilization of incoherent summation of output images, which eliminates the deleterious effects of coherent noise and allows for summation rules that are linear in intensity; the capability for single step copying of complex application-specific volume holographic optical elements, which in turn allows for efficient manufacturing of such devices; and the large number of degrees of freedom inherent in the high storage capacity of volume holographic optical elements recorded in accordance with the teachings of the invention.

G. OPTICAL MEMORY

Further in accordance with the teachings of the invention, the incoherent/coherent double angular multiplexing technique specified in the present and parent applications and embodied in the various architectures described therein can be utilized to advantage in a number of distinct optical memory applications. Such applications include, but are not limited to, associative memories (see, for example, E. G. Paek and A. Von Lehman, "Holographic Associative Memory for Word-Break Recognition", *Optics Letters*, Vol. 14, pp. 205-207, 1989), content-addressable memories, location-addressable memories, page-addressed memories, shared memories and memory systems, and multi-port memories.

Common to many such optical memory applications are the need for information storage (provided by the volume holographic optical element); for location-addressable, page addressable, or content-addressable information access; for a high signal-to-noise ratio (or equivalently a low bit error rate); and for read/write capability. All of these characteristics are provided by the incoherent/coherent double angularly multiplexed architecture and its variants as described in the present application and its parent.

The implementation of an optical memory system (see, for example, E. G. Paek et al, "Compact and Ultrafast Holographic Memory Using a Surface-Emitting Microlaser Diode Array", *Optics Letters*, Vol. 15, No. 6, pp. 341-343, 1990, and E. G. Paek, "Holographic Memory Read By a Laser Array", U.S. Pat. No. 4,988,153, Jan. 29, 1991) that is based on the unique features provided by the incoherent/coherent double angularly multiplexed architecture and its variants is straightforward, based on the teachings of this invention, as can be easily appreciated by one skilled in the art. The information storage function can be implemented in accordance with the teachings of the invention by utilizing the architecture described in FIGS. 6A and 6B. Enabling of a single pixel in spatial light modulator 32 in conjunction with a set of pixels in spatial light modulator 28 gives rise to a straightforward implementation of a page- (or sub-page-) addressable memory. Enabling of multiple pixels with either binary or analog transmittances in spatial light modulator 32 in conjunction with a set of pixels in spatial light modulator 28 gives rise to a straightforward implementation of an associative memory. Both shared and multi-port memories can be implemented by utilizing more than one spatial light modulator 32 in conjunction with one or more spatial light modulators 28 that access a common volume holographic optical element. Shared and multi-port memory systems can be configured by further incorporating more than one volume holographic optical element in the system.

Common to the optical memory configurations described above are at least two possible configurations for information access (readout). In the first such configuration, spatial light modulator 32 receives as its inputs the output of an appropriate interconnection (routing or controlling) network, that in turn determines the key to both information storage and retrieval. In the second such configuration, spatial light modulator 32 is either not incorporated or is set to the uniform transmittance state, and source array 14 is configured in such a manner as to be individually addressable, such that it receives as its inputs the output of an appropriate interconnection (routing or controlling) network, that in turn determines the key to both information storage and retrieval. Additionally, spatial light modulator 28 can be used at the output of an interconnection network, while an individually-controllable source array 14 (or spatial light modulator 32) is operated by a separate set of control inputs to access different blocks within the memory.

In an important variant of the basic single holographic element configuration, the optical memory can be configured as a resonator structure in which information is copied from a first volume holographic optical element to a second, and then from the second volume holographic optical element to the first, as described in section A3 on copying apparatus and techniques.

A number of distinct advantages accrue to the use of the volume holographic optical elements and associated incoherent/coherent double angularly multiplexed architectures described in the present and parent applications, as applied specifically to optical memory applications. These advantages include high density information storage with high throughput efficiency and low interchannel crosstalk; the superposition of multiple images in the output plane, which in turn allows for efficient use to be made of the space-bandwidth product of a two-dimensional detector array (with a fixed number of pixels); the utilization of incoherent summation of output images that are in registry in a common plane, which allows for the incorporation of threshold or other logic at each detector location in the output plane, eliminates the deleterious effects of coherent noise, and allows for summation rules that are linear in intensity; information access at high data transfer rates due to the inherent incorporation of parallel access; low latency information retrieval, as determined either by the spatial light modulator rise time, or the rise time of one or more elements of the individually addressable source array; the provision for analog as well as digital information storage; the capability for single step copying of complex application-specific volume holographic optical memory elements, which in turn allows for efficient manufacturing of such devices; and the large number of degrees of freedom inherent in the high storage capacity of volume holographic optical elements recorded in accordance with the teachings of the invention.

INDUSTRIAL APPLICABILITY

The present invention is expected to find use in neural networks, telecommunications, digital computers, optical signal processors, optical information processors and computers, optical memories, and holographic optical elements.

What is claimed is:

1. A multiplexed volume holographic optical element readout apparatus, comprising:
    (a) a multiplexed volume holographic optical element comprising a volume holographic medium and a stored holographic modulation pattern, said stored holographic modulation pattern comprising a multiplexed set of modulation pattern components, each of which, when illuminated by an associated reference beam, leads to a reconstructed beam such that:
        (i) the set of said reconstructed beams that emanate from said holographic medium is at least partially angularly multiplexed;
        (ii) a spatial array of pixels is encoded onto each said reconstructed beam, as an image at some plane in space; and
        (iii) said images of said spatial arrays of pixels from said reconstructed beams can be made to be substantially coincident in space; and
    (b) means for readout of at least a portion of said multiplexed set of modulation pattern components, comprising:
        (i) means for providing an array of coherent light sources that are mutually incoherent;
        (ii) means for forming a reference beam from each coherent light source, thereby forming a set of multiplexed reference beams;
        (iii) means for modulating each said reference beam, thereby forming a multiplexed set of modulated reference beams; and
        (iv) means for directing at least a portion of said multiplexed set of modulated reference beams onto said volume holographic medium, thereby generating a set of output beams reconstructed from said portion of said multiplexed set of modulation pattern components.

2. The apparatus of claim 1 further including means for directing said set of output beams such that they are incoherently superimposed in space.

3. The apparatus of claim 2 further including means for detecting said set of output beams in a common output plane.

4. The apparatus of claim 1 wherein said array of coherent light sources comprises a two-dimensional array of said sources.

5. The apparatus of claim 1 wherein said array of coherent light sources comprises an array of semiconductor laser diodes, each laser itself coherent, and each laser operating incoherently with respect to the other lasers.

6. The apparatus of claim 1 wherein said set of multiplexed reference beams is multiplexed in at least one of angle, space, and wavelength.

7. The apparatus of claim 6 wherein each said reference beam is at a separate given angle.

8. The apparatus of claim 7 wherein said set of output beams is angularly multiplexed and detected in such a manner as to produce an incoherent summation on a pixel-by-pixel basis of said set of generated output beams.

9. The apparatus of claim 1 wherein each said reference beam is independently modulated.

10. The apparatus of claim 1 wherein each said reference beam is spatially modulated so that all reference beams are identically modulated.

11. The apparatus of claim 1 wherein said means for modulating each said reference beam comprises a spatial light modulator.

12. The apparatus of claim 11 wherein said spatial light modulator comprises an array of integrated optical detectors, optical modulators, and associated electronics, said detectors capable of detecting at least one control beam incident thereon to generate a detected signal, said modulators capable of modulating said set of reference beams, and said electronics capable of processing said detected signal and controlling the amount of modulation of said modulators.

13. The apparatus of claim 1 wherein said means for modulating each said reference beam comprises a planar holographic optical element.

14. The apparatus of claim 1 wherein said means for modulating each said reference beam comprises a volume holographic optical element.

15. The apparatus of claim 1 wherein said means for modulating each said reference beam comprises independent control of each individual source in said array of individually coherent but mutually incoherent sources.

16. The apparatus of claim 1 further including means for selecting at least a portion of said multiplexed set of modulated reference beams.

17. The apparatus of claim 16 wherein said selecting means is provided by independent control of said coherent sources of said array.

18. The apparatus of claim 1 wherein said means for providing said array of coherent light sources that are mutually incoherent comprises:
   (a) provision for inputting a coherent beam;
   (b) a first acousto-optic deflector, storing a set of moving gratings, each grating having a different spatial frequency; and
   (c) means for directing said coherent beam onto said first acousto-optic deflector, thereby generating a set of output beams.

19. The apparatus of claim 18 further comprising means for optically transforming said set of output beams, such that an array of self-coherent but mutually incoherent source beams is generated, each at a different angle.

20. The apparatus of claim 18 further comprising:
   (a) a second acousto-optic deflector, oriented orthogonally to said first acousto-optic deflector; and
   (b) means for directing said output beams onto said second acousto-optic deflector, thereby generating a set of beams emanating from said second acousto-optic deflector that are angularly multiplexed in two dimensions.

21. The apparatus of claim 1 wherein said volume holographic medium comprises a plurality of modulation layers, optionally separated by buffer layers, with said stored holographic modulation pattern being physically located within said modulation layers.

* * * * *